(12) United States Patent
Shigihara

(10) Patent No.: US 12,731,963 B2
(45) Date of Patent: Sep. 8, 2026

(54) SEMICONDUCTOR LASER DEVICE

(71) Applicant: Mitsubishi Electric Corporation, Tokyo (JP)

(72) Inventor: Kimio Shigihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 852 days.

(21) Appl. No.: 18/044,959

(22) PCT Filed: Jan. 8, 2021

(86) PCT No.: PCT/JP2021/000430

§ 371 (c)(1),
(2) Date: Mar. 10, 2023

(87) PCT Pub. No.: WO2022/064728

PCT Pub. Date: Mar. 31, 2022

(65) Prior Publication Data

US 2023/0361535 A1 Nov. 9, 2023

(30) Foreign Application Priority Data

Sep. 25, 2020 (WO) .................. PCT/JP2020/036181

(51) Int. Cl.

| | |
|---|---|
| ***H01S 5/20*** | (2006.01) |
| ***H01S 5/22*** | (2006.01) |
| ***H01S 5/343*** | (2006.01) |

(52) U.S. Cl.

CPC ............ *H01S 5/2036* (2013.01); *H01S 5/222* (2013.01); *H01S 5/34313* (2013.01)

(58) Field of Classification Search

CPC . H01S 5/20; H01S 5/2036; H01S 5/22; H01S 5/227; H01S 5/2275; H01S 5/0651–0655
See application file for complete search history.

(56) References Cited

U.S. PATENT DOCUMENTS

2020/0335946 A1* 10/2020 Shigihara ................ H01S 5/222
2024/0088626 A1* 3/2024 Shigihara ............. H01S 5/2036

FOREIGN PATENT DOCUMENTS

JP H03-196689 A 8/1991
JP 2006-294745 A 10/2006

(Continued)

OTHER PUBLICATIONS

An Office Action; mailed by the China National Intellectual Property Administration of the People's Republic of China on Sep. 8, 2025, which corresponds to Chinese Patent Application No. 202180062640.3 and is related to U.S. Appl. No. 18/044,959.

(Continued)

*Primary Examiner* — Tod T Van Roy
*Assistant Examiner* — Delma R Forde
(74) *Attorney, Agent, or Firm* — Studebaker Brackett PLLC

(57) ABSTRACT

A semiconductor laser device of the present disclosure includes: a first-conductivity-type cladding layer, a first-conductivity-type-side optical guide layer, an active layer, a second-conductivity-type-side optical guide layer, a second-conductivity-type cladding layer, and a second-conductivity-type contact layer laminated above a semiconductor substrate; a resonator having a front end surface and a rear end surface; and a ridge region for guiding a laser beam between the front and rear end surfaces. The ridge region is composed of a ridge inner region in which an effective refractive index is $n_a^i$, and ridge outer regions which are provided on both sides of the ridge inner region and in which an effective refractive index is $n_a^o$, the ridge outer regions having current non-injection structures. A ridge outer region width $W_o$ is greater than a distance from a lower end of each current non-injection structure to the active layer.

13 Claims, 33 Drawing Sheets

(56) References Cited

FOREIGN PATENT DOCUMENTS

| | | | |
|---|---|---|---|
| JP | 2008-219051 | A | 9/2008 |
| WO | 2019/053854 | A1 | 3/2019 |
| WO | 2021/161438 | A1 | 8/2021 |

OTHER PUBLICATIONS

International Search Report issued in PCT/JP2021/000430; mailed Feb. 22, 2021.
Yonezu, Hiroo et al., A GaAs- AlxGa1-xAs Double Heterostructure Planar Stripe Laser, Japanese Journal of Applied Physics, vol. 12, No. 10, pp. 1585-1592, Oct. 1973.
Hocker, G.B. et al., Mode dispersion in diffused channel waveguides by the effective index method, Applied Optics, vol. 16, No. 1., pp. 113-118, Jan. 1977.
Gloge, D., Weakly Guiding Fibers, Applied Optics vol. 10, No. 10, pp. 2252-2258, Oct. 1971.

* cited by examiner y
2W
1
106
105
104
103
102
101
$h_2$
x
$II_c$ $I_a$ $II_c$

FLOW OF CURRENT $n_a$ ($= n_a^i$)
$n_c$
x

REFRACTIVE INDEX DISTRIBUTION

REFRACTIVE INDEX DISTRIBUTION

SEMICONDUCTOR LASER DEVICE

TECHNICAL FIELD

The present disclosure relates to a semiconductor laser device.

BACKGROUND ART

A broad-area semiconductor laser device has advantages such as enabling high output.

Patent Document 1 discloses that a ridge-type broad-area semiconductor laser device having a real refractive index distribution in the horizontal direction has an optical guide layer that is so thick as to allow a high-order mode of a first order or higher in the lamination direction of a crystal, and terrace regions having a refractive index lower than the effective refractive index in a ridge region and higher than the refractive index in cladding regions are provided on both sides of the ridge structure with grooves interposed therebetween, thereby decreasing the number of modes allowed in the horizontal direction and narrowing a horizontal-direction beam divergence angle. Here, the real refractive index distribution refers to a refractive index distribution in which refractive indices are described by real numbers, a waveguide mechanism is a refractive index waveguide, and an electric field distribution, a magnetic field distribution, a propagation constant, and the like obtained by solving a wave equation are real numbers.

Patent Document 2 discloses that, in a ridge-type broad-area semiconductor laser device in which a ridge structure is buried with semiconductor layers on both sides thereof so that a refractive index difference arises in the horizontal direction, a current non-injection structure is formed on the ridge side of the boundary between the ridge structure and each semiconductor layer, thereby reducing peaks of near field patterns (NFP) appearing near both ends of the ridge, and the current non-injection width is preferably 10 μm or less in order to suppress increase in loss, for example.

Patent Document 3 discloses a ridge-type broad-area semiconductor laser device in which protons are implanted over a depth of 1.6 μm from a ridge surface to a ridge bottom except a ridge width of 15 μm at a center part in a ridge structure having a ridge width of 30 μm in which a high-order mode is allowed, so that the proton implanted region has a high resistance and current flows in the region having the ridge width of 15 μm at the center part in the ridge structure, thereby increasing the gain in a fundamental mode and selectively causing oscillation in the fundamental mode.

CITATION LIST

Patent Document

Patent Document 1: WO2019/053854

Patent Document 2: Japanese Laid-Open Patent Publication No. 2006-294745

Patent Document 3: Japanese Laid-Open Patent Publication No. 03-196689

Non-Patent Document

Non-Patent Document 1: N. Yonezu, I. Sakuma, K. Kobayashi, T. Kamejima, M. Ueno, and Y. Nannichi, "A GaAs—$Al_xGa_{1-x}As$ Double Heterostructure Planar Stripe Laser", Jpn. J. Appl. Phys., vol. 12, no. 10, pp. 1585-1592, 1973

Non-Patent Document 2: Kawakami, "Optical waveguides", pp. 18-31, Asakura Publishing (1992)

Non-Patent Document 3: Iga (ed), "Semiconductor laser", pp. 35-38, Oct. 25, 1994 (Ohmsha)

Non-Patent Document 4: G. B. Hocker and W. K. Burns, "Mode dispersion in diffused channel waveguides by the effective index method", Appl. Opt., Vol. 16, No. 1, pp. 113-118, 1977

SUMMARY OF THE INVENTION

Problems to be Solved by the Invention

In the conventional ridge-type broad-area semiconductor laser device having a real refractive index distribution, the number of allowed modes in the horizontal direction is decreased, whereby the horizontal beam divergence angle can be narrowed on average as compared to a case where the number of allowed modes is large. However, there is a problem that the horizontal beam divergence angle varies depending on the mode in which oscillation occurs among the allowed modes. This is because the gain differences among the allowed modes are small.

In addition, in the conventional ridge-type broad-area semiconductor laser device having a real refractive index distribution, unlike the broad-area semiconductor laser device buried with semiconductor layers, no peaks appear in the NFPs near both ends of the ridge structure, and when current is locally decreased, the NFP at that part does not weaken.

In the case of the ridge-type broad-area semiconductor laser device having a real refractive index distribution, NFPs are determined by linear combination of the allowed modes. This is because locally decreasing current influences all the modes.

It is considered that such a peculiar phenomenon that appears in the broad-area semiconductor laser device buried with semiconductor layers occurs because a gain waveguide or a loss waveguide is formed by burying with the semiconductor layers. Therefore, such a structure buried with semiconductor layers has not so far been applied to the ridge-type broad-area semiconductor laser device having a real refractive index distribution.

Further, proton implantation for high resistance in the conventional ridge-type broad-area semiconductor laser device is performed to a depth that reaches the bottom of the ridge structure, and therefore light emitted at an active layer spreads to the proton implanted region. Since the proton implanted region destroys the crystalline state of a crystal layer forming the ridge-type broad-area semiconductor laser device, the beam spreading to the proton implanted region undergoes scattering due to a crystal defect, resulting in great loss. Thus, slope efficiency is significantly reduced and therefore power conversion efficiency is significantly reduced. Further, since the proton implanted region including many crystal defects is near the active layer, there is a problem that reliability of the ridge-type broad-area semiconductor laser device is significantly reduced due to the crystal defects in the proton implanted region.

The present disclosure has been made to solve the above problems, and an object of the present disclosure is to obtain a ridge-type broad-area semiconductor laser device configured such that, in a structure in which the number of modes allowed in the horizontal direction is decreased, the gain in a low-order mode is made higher than the gain in a high-order mode, whereby oscillation is performed in the low-order mode to narrow the horizontal-direction beam divergence angle, such a real refractive index distribution that coupling efficiency with optical components is enhanced, and efficiency and reliability are high.

Solution to the Problems

A semiconductor laser device according to the present disclosure includes: a first-conductivity-type semiconductor substrate; a first-conductivity-type cladding layer, a first-conductivity-type-side optical guide layer, an active layer, a second-conductivity-type-side optical guide layer, a second-conductivity-type cladding layer, and a second-conductivity-type contact layer, which are laminated above the first-conductivity-type semiconductor substrate; a resonator formed of a front end surface and a rear end surface and allowing a round trip of a laser beam therebetween; and a ridge region in which the laser beam is guided between the front end surface and the rear end surface, the ridge region having a width of 2 W.

An oscillation wavelength is λ and a high-order mode of a first order or higher is allowed in a lamination direction of the layers. The ridge region is composed of a ridge inner region of which a width is 2 $W_i$ and an effective refractive index is $n_a^i$, and ridge outer regions which are provided on both sides of the ridge inner region and of which a width is $W_o$ and an effective refractive index is $n_a^o$, the ridge outer regions having current non-injection structures. Cladding regions in which at least the second-conductivity-type contact layer and the second-conductivity-type cladding layer are removed and an effective refractive index is $n_c$, are provided on both sides of the ridge outer regions. An average refractive index $n_a^e$ in the ridge inner region and the ridge outer regions is represented by the following expression:

[Mathematical 1]

$$(n_a^i \cdot W_i + n_a^o \cdot W_o)/(W_i + W_o).$$

The Following Relationship is Satisfied:

[Mathematical 2]

$$\frac{2\pi}{\lambda}\sqrt{n_a^{e2} - n_c^2}\,(W_i + W_o) > \frac{\pi}{2}.$$

The width $W_o$ of each ridge outer region is greater than a distance from a lower end of each current non-injection structure to the active layer and is smaller than W which is ½ of the width of the ridge region.

Effect of the Invention

In the semiconductor laser device according to the present disclosure, the ridge region is composed of the ridge inner region and the ridge outer regions, and the current non-injection structures are provided in the ridge outer regions, so that current injected in the semiconductor laser device mainly flows in the ridge inner region, thus providing an effect of obtaining a semiconductor laser device in which the gain in a low-order mode is made higher than the gain in a high-order mode and laser oscillation in a low-order mode can be performed, whereby the horizontal beam divergence angle can be narrowed, and since the current non-injection structures are provided in regions where light emitted at the active layer is substantially not present, increase in loss can be suppressed and efficiency and reliability are high.

DESCRIPTION OF EMBODIMENTS

Embodiment 1

First, difference between the present disclosure and a comparative example will be described with reference to FIG. 1 and FIG. 2.

Figures 1, 2:
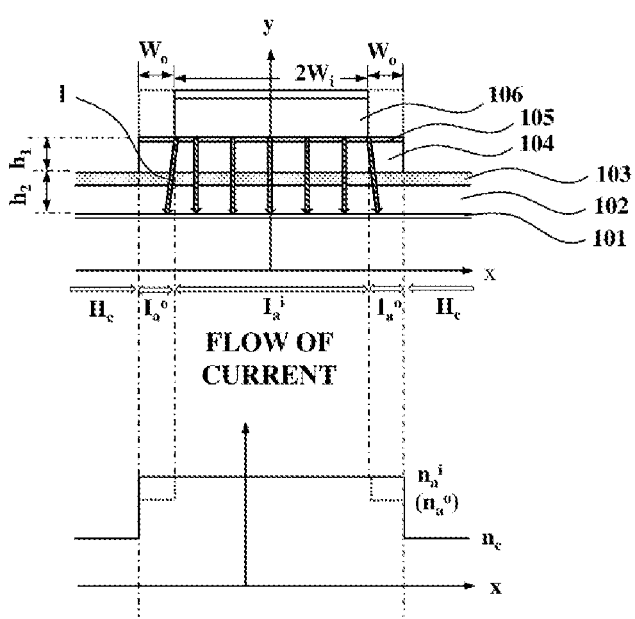
FIG. 1 is a schematic diagram showing a flow of current and a refractive index distribution in a cross-section of a ridge-type broad-area semiconductor laser device having a real refractive index distribution in a comparative example.
FIG. 2 is a schematic diagram showing a flow of current and a refractive index distribution in a cross-section of a ridge-type broad-area semiconductor laser device having a real refractive index distribution according to the present disclosure.

FIG. 1 is a schematic diagram showing a flow of current I and a refractive index distribution in a cross-section perpendicular to the optical wave-guiding direction of a ridge-type broad-area semiconductor laser device having a real refractive index distribution in the comparative example.

In FIG. 1, from a semiconductor substrate (not shown) side on the lower side, an active layer 101, an optical guide layer 102, a first etching stop layer 103 (first ESL layer (etching stop layer: ESL)), a p-type first cladding layer 104, a second etching stop layer 105 (second ESL layer), and a p-type second cladding layer 106 are formed.

The distance from the upper end of the active layer 101 to the upper end of the first ESL layer 103 is denoted by $h_2$. Current I flowing in a ridge region $I_a$ flows while spreading also in the horizontal direction, i.e., an x direction in FIG. 1, from the upper end of the first ESL layer 103. A current distribution J(x) at the upper end of the active layer 101 can be calculated using Non-Patent Document 1. The x direction may be referred to as ridge width direction.

The ridge region $I_a$ having a ridge width 2 W has a structure sandwiched between cladding regions $II_c$ on both sides in the horizontal direction, i.e., the x direction. The effective refractive indices in the ridge region $I_a$ and the cladding regions $II_c$ are respectively denoted by $n_a$ and $n_c$. According to Non-Patent Document 2, a normalized frequency v can be defined as shown by the following equation (1).

[Mathematical 3]

$$v = \frac{2\pi}{\lambda}\sqrt{n_a^2 - n_c^2}\,W \tag{1}$$

Here, λ is the oscillation wavelength of the semiconductor laser device. A value INT[v/(π/2)]+1 which is obtained by dividing the normalized frequency v by π/2, making the resultant value into an integer, and then adding 1 thereto, is the number of modes allowed in the horizontal direction, i.e., the x direction in FIG. 1.

FIG. 2 is a schematic diagram showing a flow of current and a refractive index distribution in a cross-section perpendicular to the optical wave-guiding direction of a ridge-type broad-area semiconductor laser device having a real refractive index distribution according to the present disclosure. In this structure, parts in ridge outer regions $I_a^o$ having a width $W_o$ (hereinafter, referred to as ridge outer region width) are removed by etching in such a range where the effective refractive index thereof is substantially the same as that in a ridge inner region $I_a^i$ having a width 2 $W_i$ (hereinafter, referred to as ridge inner region width).

The ridge outer regions $I_a^o$ are provided on both sides in the ridge width direction of the ridge inner region $I_a^i$ in the ridge region $I_a$, and cladding regions $II_c$ are provided on both sides in the ridge width direction of the ridge outer regions $I_a^o$.

Here, a state in which the effective refractive indices are substantially the same means that, where the effective refractive index in the ridge inner region $I_a^i$ is denoted by $n_a^i$ and the effective refractive index in the ridge outer regions $I_a^o$ is denoted by $n_a^o$, the number of allowed modes calculated by substituting an average refractive index $n_a^e$ calculated from equation (2) into $n_a$ in equation (1) is the same as the number of allowed modes in a case where there are no ridge outer regions $I_a^o$, i.e., a case where the ridge outer region width $W_o$ is zero.

[Mathematical 4]

$$n_a^e = \left(n_a^i \cdot W_i + n_a^o \cdot W_o\right)/(W_i + W_o) \tag{2}$$

An upper part in each ridge outer region $I_a^o$ is removed by etching until reaching the upper side of the first ESL layer 103 and then is coated with an insulation film (not shown), so that the current I mainly flows in the ridge inner region $I_a^i$. The distance from the upper end of the first ESL layer 103 to the upper end of the second ESL layer 105 is denoted by $h_1$. The current I begins to spread also in the horizontal direction from the upper end of the second ESL layer 105, thus reaching the active layer 101 through a distance $h_1+h_2$.

An ith-order mode allowed in the horizontal direction is denoted by $\varphi_i(x)$, which is normalized as shown by the following equation (3). The allowed mode $\varphi_i(x)$ can be calculated from Non-Patent Document 2 or the like.

[Mathematical 5]

$$\int_{-\infty}^{\infty} \phi_i(x)^2 dx = 1 \tag{3}$$

Meanwhile, regarding current, with the assumption that current flows at 1 ampere (A) in the ridge inner region $I_a^i$ having a ridge inner region width of 2 $W_i$ and a resonator length of L, the current distribution J(x) at the upper end of the active layer 101 is normalized as shown by the following equation (4).

[Mathematical 6]

$$L\int_{-\infty}^{\infty} J(x)dx = 1 \tag{4}$$

A gain $G_i$ arises through an interaction between light and current, and therefore is defined as shown by the following equation (5). Since the optical distribution (mode) and the current distribution are both normalized, the difference between the gains in the respective modes can be found from the magnitude relationship of the gain $G_i$.

[Mathematical 7]

$$G_i = \int_{-\infty}^{\infty} \phi_i(x)^2 J(x)dx \tag{5}$$

Figure 3:
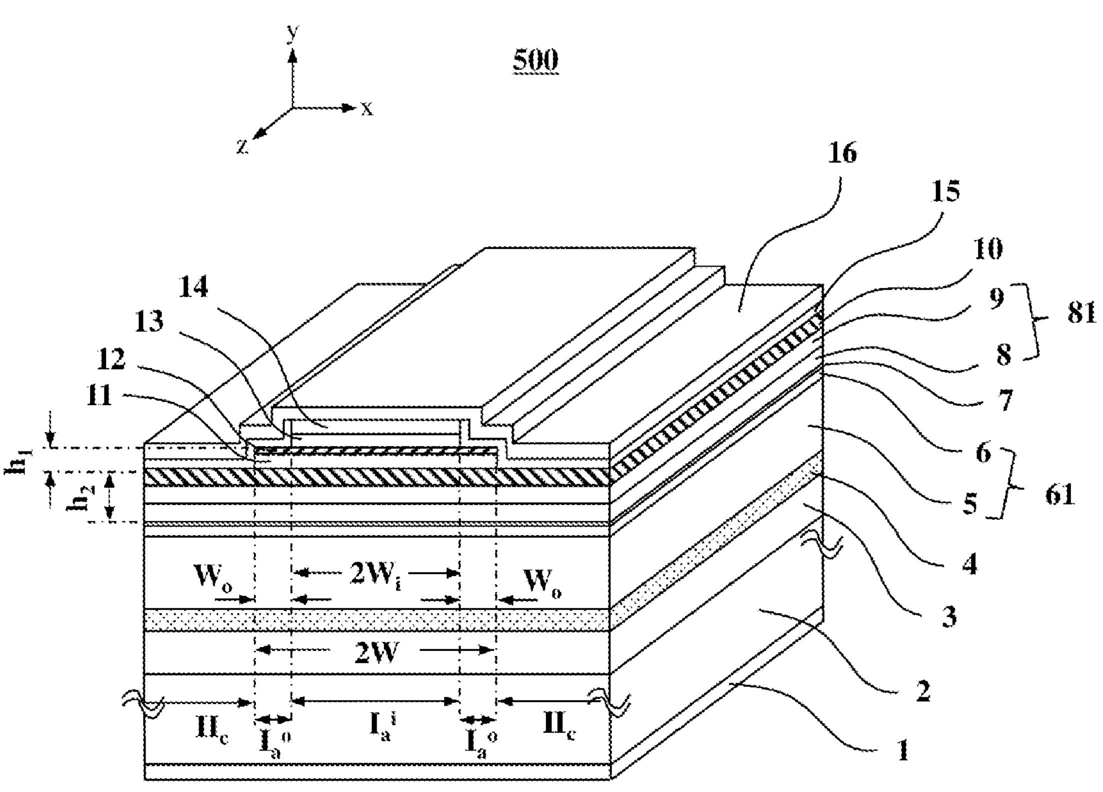
FIG. 3 is a perspective view showing a ridge-type broad-area semiconductor laser device in 975 nm band having a real refractive index distribution according to embodiment 1.

FIG. 3 is a perspective view showing a ridge-type broad-area semiconductor laser device 500 in 975 nm band having a real refractive index distribution according to embodiment 1.

In FIG. 3, an xyz orthogonal coordinate system is defined, for convenience of description. A z axis is the direction in which a laser beam of the ridge-type broad-area semiconductor laser device 500 is emitted, and is also a length direction axis of a resonator that the ridge-type broad-area semiconductor laser device 500 has. The z direction may be referred to as “cavity length direction”. A y axis is parallel to a normal to the upper surface of an n-type GaAs substrate 2. The y-axis direction coincides with the crystal growth direction of semiconductor layers formed above the n-type GaAs substrate 2. The y-axis direction may be referred to as “lamination direction”. An x axis is an axis perpendicular to a yz plane and coincides with the axis in the width direction of the ridge-type broad-area semiconductor laser device 500. The x-axis direction may be referred to as “ridge width direction”. Along the x axis, a horizontal transverse mode occurs in the ridge-type broad-area semiconductor laser device 500. The above-described definition about the orthogonal coordinate system is applied in the same manner also to perspective views of other ridge-type broad-area semiconductor laser devices described later.

As shown in FIG. 3, the ridge-type broad-area semiconductor laser device 500 is composed of, from the lower surface side (may be referred to as back surface side), an n-type electrode 1 (first-conductivity-type electrode), the n-type GaAs substrate 2 (first-conductivity-type semiconductor substrate), an n-type AlGaAs cladding layer 3 (first-conductivity-type cladding layer, refractive index $n_{cn}$) having an Al composition ratio of 0.20 and a layer thickness of 1.5 μm, an n-type AlGaAs low-refractive-index layer 4 (first-conductivity-type low-refractive-index layer, refractive index $n_n$) having an Al composition ratio of 0.25 and a layer thickness of 200 nm, an n-side AlGaAs second optical guide layer 5 having an Al composition ratio of 0.16 and a layer thickness of 1100 nm, an n-side AlGaAs first optical guide layer 6 having an Al composition ratio of 0.14 and a layer thickness of 100 nm, an InGaAs quantum well active layer 7 having an In composition ratio of 0.119 and a layer thickness of 8 nm, a p-side AlGaAs first optical guide layer 8 having an Al composition ratio of 0.14 and a layer thickness of 300 nm, a p-side AlGaAs second optical guide layer 9 having an Al composition ratio of 0.16 and a layer thickness of 300 nm, a p-type AlGaAs first ESL layer 10 (may be referred to as p-type AlGaAs low-refractive-index layer or second-conductivity-type low-refractive-index layer; refractive index $n_p$) having an Al composition ratio of 0.55 and a layer thickness of 140 nm, a p-type AlGaAs first cladding layer 11 (second-conductivity-type first cladding layer, refractive index $n_{cp}$) having an Al composition ratio of 0.20 and a layer thickness of 0.55 μm, a p-type AlGaAs second ESL layer 12 having an Al composition ratio of 0.55 and a layer thickness of 40 nm, a p-type AlGaAs second cladding layer 13 (second-conductivity-type second cladding layer, refractive index $n_{cp}$) having an Al composition ratio of 0.20 and a layer thickness of 0.95 μm, a p-type GaAs contact layer 14 (second-conductivity-type contact layer) having a layer thickness of 0.2 μm, SiN films 15 having a film thickness of 0.2 μm, and a p-type electrode 16 (second-conductivity-type electrode) on the upper surface side.

The n-side AlGaAs second optical guide layer 5 and the n-side AlGaAs first optical guide layer 6 are collectively referred to as n-side optical guide layer 61 or a first-conductivity-type-side optical guide layer 61, and the p-side AlGaAs first optical guide layer 8 and the p-side AlGaAs second optical guide layer 9 are collectively referred to as p-side optical guide layer 81 or second-conductivity-type-side optical guide layer 81. Each optical guide layer is normally a layer that is not doped, and therefore on which side of the InGaAs quantum well active layer 7 each optical guide layer is present is distinguished by indicating "side". That is, the n side or the first conductivity type side refers to the side where each n-type or first-conductivity-type layer is present with respect to the InGaAs quantum well active layer 7. Similarly, the p side or the second conductivity type side refers to the side where each p-type or second-conductivity-type layer is present with respect to the InGaAs quantum well active layer 7.

The second-conductivity-type first cladding layer (p-type AlGaAs first cladding layer 11) and the second-conductivity-type second cladding layer (p-type AlGaAs second cladding layer 13) are collectively referred to as second-conductivity-type cladding layer.

Such setting that the In composition ratio of the InGaAs quantum well active layer 7 is 0.119 and the layer thickness thereof is 8 nm is for making the oscillation wavelength be substantially 975 nm.

A front end surface and a rear end surface forming a cavity that allows round trip of a laser beam are provided at both ends of the ridge-type broad-area semiconductor laser device 500 by cleavage or the like, for example.

The ridge-type broad-area semiconductor laser device 500 may have a structure in which the conductivity types of the n type and the p type are reversed. That is, the first conductivity type may be the n type and the second conductivity type may be the p type, or the first conductivity type may be the p type and the second conductivity type may be the n type. Hereinafter, these types may be referred to as first conductivity type and second conductivity type.

A manufacturing method for the ridge-type broad-area semiconductor laser device 500 will be described below.

Above the n-type GaAs substrate 2, the semiconductor layers from the n-type AlGaAs cladding layer 3 to the p-type GaAs contact layer 14 are sequentially crystal-grown by a crystal growth method such as metal organic chemical vapor deposition (MOCVD).

Next, with the ridge inner region $I_a^i$ coated with a resist, dry etching is performed until reaching the second ESL layer 12, and the resist is removed.

Subsequently, with the ridge inner region $I_a^i$ and the ridge outer regions $I_a^o$ coated with a resist, dry etching is performed until reaching the first ESL layer 10, and the resist is removed.

With the ridge inner region $I_a^i$ coated with a resist, the SiN films 15 are formed, lift-off is performed, and the resist is removed.

Finally, the p-type electrode 16 and the n-type electrode 1 are formed on the upper surface side and the lower surface side, respectively.

In the ridge-type broad-area semiconductor laser device 500 according to embodiment 1, at least the p-type GaAs contact layer 14 and the p-type AlGaAs second cladding layer 13 in the ridge outer regions $I_a^o$ are removed by etching, and the exposed surfaces on which removal has been performed by etching are covered with the SiN films 15 which are insulation films, thereby forming current non-injection structures. Thus, current injected in the ridge-type broad-area semiconductor laser device 500 mainly flows in the ridge inner region $I_a^i$.

For example, using a refractive index and a calculation method therefor described in Iga (ed), "Semiconductor laser", pp. 35-38 (Non-Patent Document 3), the refractive indices of the AlGaAs layers having the Al composition ratios of 0.14, 0.16, 0.20, 0.25, and 0.55 at a wavelength of 975 nm are 3.432173, 3.419578, 3.394762, 3.364330, and 3.191285, respectively.

In addition, experientially, the refractive indices of InGaAs forming the InGaAs quantum well active layer 7 with the In composition ratio of 0.119 and SiN forming the SiN films 15 are 3.542393 and 2.00, respectively.

In the ridge-type broad-area semiconductor laser device 500 according to embodiment 1, a total optical guide layer thickness which is the sum of the thicknesses of the A-side optical guide layer 81 and the n-side optical guide layer 61 is as thick as 1.8 μm, and a mode of a first order or higher is allowed in the lamination direction. Therefore, if a low-refractive-index layer is interposed between the cladding layer and the optical guide layer, the NFP is narrowed and a far field pattern (FFP) is widened.

In addition, since the InGaAs quantum well active layer 7 is displaced toward the side of the p-type AlGaAs first cladding layer 11 and the p-type AlGaAs second cladding layer 13 with respect to the center of the n-side optical guide layer 61 and the p-side optical guide layer 81, carriers staying in the optical guide layers during laser operation can be decreased, whereby high slope efficiency can be achieved.

The magnitude relationship in a case where a low-refractive-index layer having a refractive index $n_i$ and a layer thickness $d_i$ is interposed between an optical guide layer and a cladding layer having a refractive index $n_{ci}$ is represented using $u_i$ in the following equation (6), instead of equation (1).

[Mathematical 8]

$$u_i = \frac{2\pi}{\lambda}\sqrt{n_{ci}^2 - n_i^2}\,\frac{d_i}{2} \tag{6}$$

$$i = p \text{ or } n$$

In the ridge-type broad-area semiconductor laser device 500 according to embodiment 1, $u_n$ is 0.292273 and $u_p$ is 0.522208, thus satisfying $u_p>u_n$. Therefore, the optical intensity distribution in the y direction, i.e., the lamination direction, is displaced toward the n-type GaAs substrate 2 side, whereby the number of allowed modes in the x direction, i.e., the ridge width direction, can be decreased.

First, a case where the ridge outer region width $W_o$ is zero, i.e., the ridge structure in the comparative example will be considered. In this case, the effective refractive indices in the ridge region $I_a$ and the cladding regions $II_c$ can be calculated by an equivalent refractive index method described in Non-Patent Document 4, for example, and thus are 3.41697 and 3.41672, respectively. In a case where the ridge width 2 W is 100 μm, v in equation (1) is 13.31 and thus nine modes from a zeroth order (fundamental mode) to an eighth order are allowed.

As in the ridge-type broad-area semiconductor laser device 500 according to embodiment 1, in the case where removal has been performed by etching in each ridge outer region $I_a^o$ until reaching the second ESL layer 12, the effective refractive index at this part is 3.41697, and thus the refractive index in the ridge region $I_a$ (ridge inner region $I_a^i$ and ridge outer regions $I_a^o$) is the same irrespective of removal by etching. Therefore, the number of allowed modes is the same.

Meanwhile, current begins to spread also in the x direction, i.e., the ridge width direction, from the upper end of the second ESL layer 12. That is, current spreads in the x direction through a distance $h_2$ (0.74 μm) from the upper end of the InGaAs quantum well active layer 7 to the upper end of the first ESL layer 10 and a distance $h_1$ (0.59 μm) from the upper end of the second ESL layer 12 to the upper end of the first ESL layer 10, thus reaching the InGaAs quantum well active layer 7. Hereinafter, for simplification, a resistivity p in a range from the part where the current begins to spread in the x direction to the InGaAs quantum well active layer 7 is assumed to be 0.35 Ωcm. It has already been confirmed that the tendency of the gain $G_i$ is the same even if the value of the resistivity p is changed.

Figure 4:
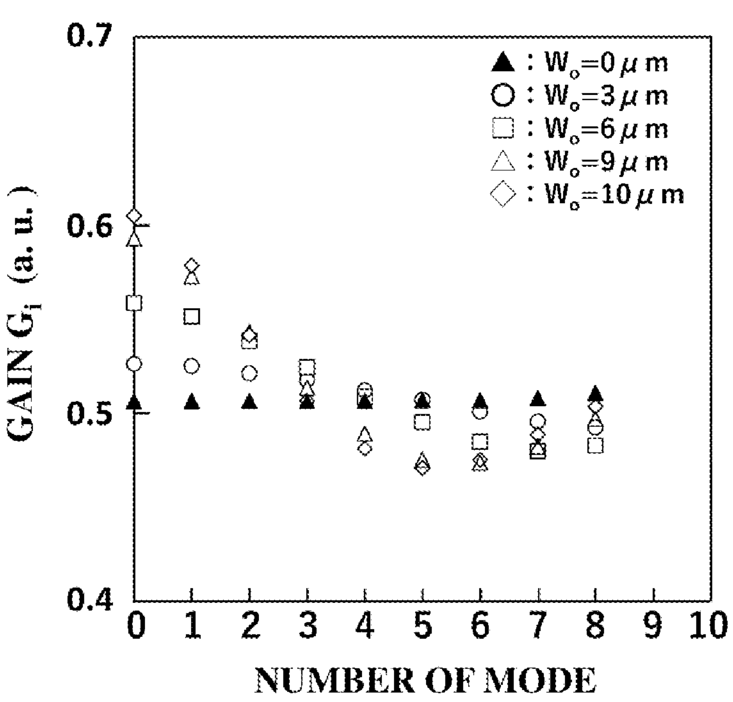
FIG. 4 shows the gain in each mode of the ridge-type broad-area semiconductor laser device according to embodiment 1.
Figure 5:
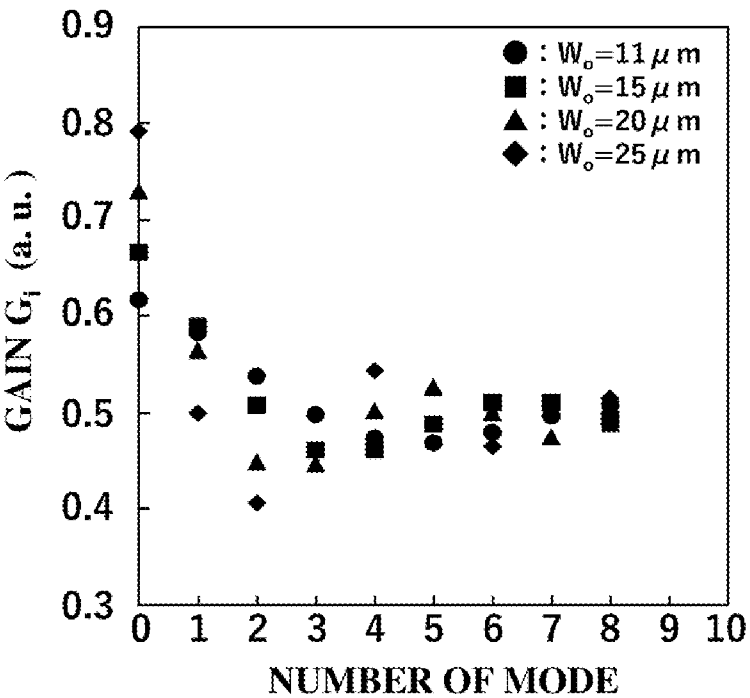
FIG. 5 shows the gain in each mode of the ridge-type broad-area semiconductor laser device according to embodiment 1.

FIG. 4 and FIG. 5 show the gain $G_i$ in each mode in cases where the ridge outer region width $W_o$ is 3, 6, 9, 10, 11, 15, 20, and 25 μm. A case where the ridge outer region width $W_o$ is 0 μm (comparative example) is also shown together. In the case of the comparative example, there are almost no gain differences among the modes, and if any, the gain difference is less than 1%, and therefore laser oscillation can occur in any mode. Thus, the horizontal beam divergence angle varies depending on the mode in which laser oscillation occurs.

When current mainly flows in the ridge inner region $I_a^i$ with the ridge outer regions $I_a^o$ provided, gain differences arise among the modes, so that the gain in a low-order mode becomes higher than the gain in a high-order mode. Thus, laser oscillation in a low-order mode can be performed and a narrow horizontal beam divergence angle can be achieved.

The gains in low-order modes in the present disclosure, e.g., modes of zeroth to third orders in a case where the ridge outer region width $W_o$ is not greater than 10 μm, are higher than the gains in low-order modes in the comparative example. Therefore, laser oscillation is reached with a low gain, and a ridge-type broad-area semiconductor laser device in which laser oscillation occurs with lower threshold current than in the comparative example can be obtained.

Even if the ridge outer region width $W_o$ is greater than 10 μm, the gain in a low-order mode is higher than in the comparative example and loss does not increase. In a case where the ridge outer region width $W_o$ is not less than μm, there is a gain difference higher than 11% between the fundamental mode and all the other modes, and thus it becomes possible to substantially perform oscillation in the fundamental mode. In a case where the ridge outer region width $W_o$ is not less than 20 μm, such tendency becomes further outstanding.

In order that a high-order mode of a first order or higher is allowed in the horizontal direction, i.e., the x direction (ridge width direction), the following condition needs to be satisfied.

That is, $W_i$ which is ½ of the ridge inner region width, the ridge outer region width $W_o$, the average refractive index $n_a^e$ represented by equation (4), and the effective refractive index $n_c$ in the cladding regions $II_c$ need to satisfy the following equation (7).

[Mathematical 9]

$$\frac{2\pi}{\lambda}\sqrt{n_a^{e2} - n_c^2}\,(W_i + W_o) > \frac{\pi}{2} \tag{7}$$

In addition, in order that a high-order mode of a first order or higher is allowed in the lamination direction of the layers, the following condition needs to be satisfied.

That is, where the refractive index of the n-type AlGaAs cladding layer 3 is denoted by $n_{cn}$, the refractive index of the p-type AlGaAs first cladding layer 11 is denoted by $n_{cp}$, the layer thickness of the n-type AlGaAs low-refractive-index layer 4 is denoted by $d_n$, the refractive index thereof is denoted by $n_n$ which is lower than the refractive index $n_{cn}$ of the n-type AlGaAs cladding layer 3, the layer thickness of the p-type AlGaAs low-refractive-index layer 10 provided between the p-side optical guide layer 81 and the p-type AlGaAs first cladding layer 11 is denoted by $d_p$, and the refractive index thereof is denoted by $n_p$ which is lower than the refractive index of the p-type AlGaAs first cladding layer 11, the following equation (8) needs to be satisfied.

[Mathematical 10]

$$\frac{2\pi}{\lambda}\sqrt{n_{cp}^2 - n_p^2}\,\frac{d_p}{2} > \frac{2\pi}{\lambda}\sqrt{n_{cn}^2 - n_n^2}\,\frac{d_n}{2} \tag{8}$$

In the ridge-type broad-area semiconductor laser device 500 according to embodiment 1, the n-type AlGaAs low-refractive-index layer 4 and the p-type AlGaAs low-refractive-index layer 10 are each provided between the cladding layer and the optical guide layer. However, the same effects are provided even in a case where one or both of the low-refractive-index layers are provided in the cladding layers.

Since current isotropically spreads in the semiconductor layers, it suffices that the ridge outer region width $W_o$ is greater than the distance $h_1+h_2$ (1.33 μm) and smaller than W (50 μm).

As described above, the ridge-type broad-area semiconductor laser device 500 according to embodiment 1 is provided with current non-injection structures by covering, with the SiN films 15, the exposed surfaces on which the p-type GaAs contact layer 14 and the p-type AlGaAs second cladding layer 13 have been removed by etching in the ridge outer regions $I_a^o$, so that current injected in the ridge-type broad-area semiconductor laser device 500 mainly flows in the ridge inner region $I_a^i$. Accordingly, the gain in a low-order mode becomes higher than the gain in a high-order mode, and laser oscillation in a low-order mode can be performed, thus providing an effect of narrowing the horizontal beam divergence angle.

Modification 1 of Embodiment 1

Figure 6:
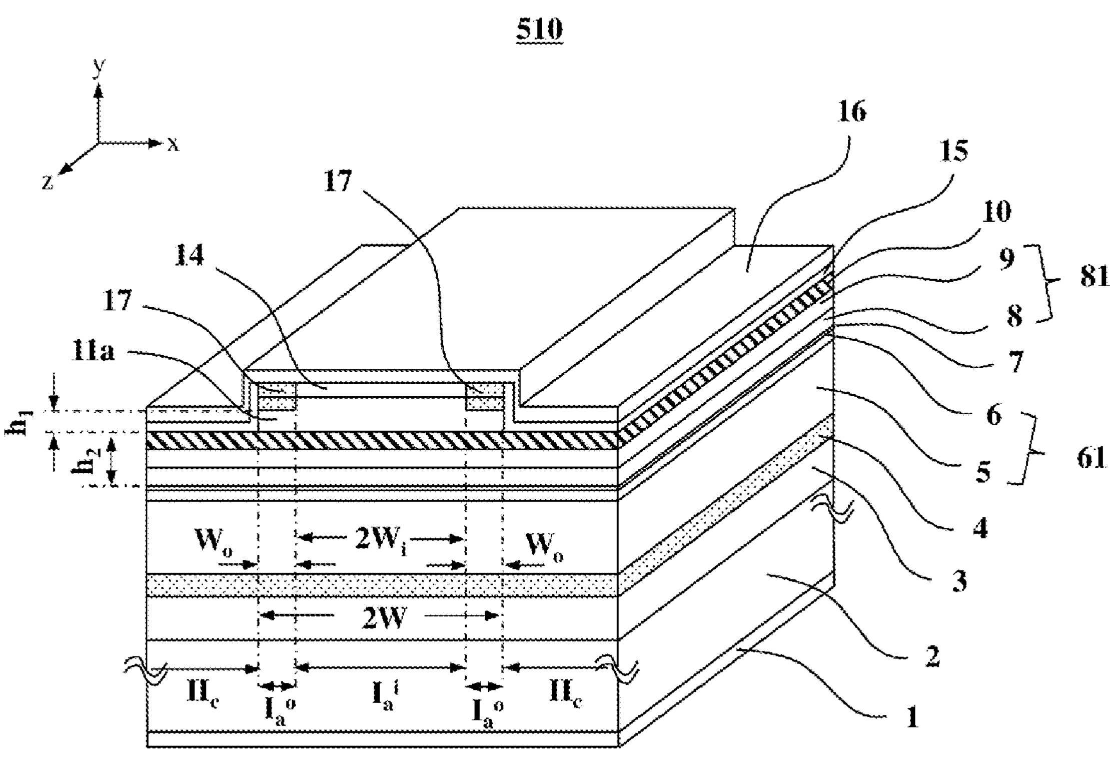
FIG. 6 is a perspective view showing a ridge-type broad-area semiconductor laser device in 975 nm band having a real refractive index distribution according to modification 1 of embodiment 1.

FIG. 6 is a perspective view showing a ridge-type broad-area semiconductor laser device 510 in 975 nm band having a real refractive index distribution according to modification 1 of embodiment 1.

The difference between the ridge-type broad-area semiconductor laser device 510 according to modification 1 of embodiment 1 and the ridge-type broad-area semiconductor laser device 500 according to embodiment 1 is that the second ESL layer 12 is not provided in the ridge-type broad-area semiconductor laser device 510 according to modification 1 of embodiment 1, a p-type AlGaAs first cladding layer 11*a* (second-conductivity-type cladding layer) having an Al composition ratio of 0.20 and a layer thickness of 1.5 μm is provided instead of the p-type AlGaAs first cladding layer 11 (second-conductivity-type first cladding layer) having an Al composition ratio of 0.20 and a layer thickness of 0.55 μm in the ridge-type broad-area semiconductor laser device 500 according to embodiment 1, and proton implanted regions 17 are provided as current non-injection structures in the ridge-type broad-area semiconductor laser device 510 according to modification 1 of embodiment 1. The other layer configurations are the same as those of the ridge-type broad-area semiconductor laser device 500 according to embodiment 1.

A manufacturing method for the ridge-type broad-area semiconductor laser device 510 according to modification 1 of embodiment 1 will be described below.

Above the n-type GaAs substrate 2, the semiconductor layers from the n-type AlGaAs cladding layer 3 to the p-type GaAs contact layer 14 are sequentially crystal-grown by a crystal growth method such as metal organic chemical vapor deposition (MOCVD).

Next, with the ridge inner region $I_a^i$ coated with a resist, ion implantation with protons is performed to form the proton implanted regions 17, and the resist is removed.

Subsequently, with the ridge inner region $I_a^i$ and the ridge outer regions $I_a^o$ coated with a resist, dry etching is performed until reaching the first ESL layer 10, and the resist is removed. At this time, the proton implanted regions in the cladding regions $II_c$ are also etched and removed.

With the ridge inner region $I_a^i$ and the ridge outer regions $I_a^o$ coated with a resist, the SiN films 15 are formed, lift-off is performed, and the resist is removed.

Finally, the p-type electrode 16 and the n-type electrode 1 are formed on the upper surface side and the lower surface side, respectively.

The main difference from the ridge-type broad-area semiconductor laser device 500 according to embodiment 1 shown in FIG. 3 is that the second ESL layer 12 is absent and in the ridge outer regions $I_a^o$, the proton implanted regions 17 are formed by imparting the semiconductor layers with insulation property through proton implantation, instead of removal by etching. In the proton implanted regions 17, the semiconductor layers have a high resistance, thus serving as current non-injection structures.

In the ridge-type broad-area semiconductor laser device 510 according to modification 1 of embodiment 1, the proton implanted regions 17 are formed in the p-type GaAs contact layer 14 and a part of the p-type AlGaAs first cladding layer 11*a* in the ridge outer regions $I_a^o$, thereby forming current non-injection structures. Thus, current injected in the ridge-type broad-area semiconductor laser device 510 mainly flows in the ridge inner region $I_a^i$.

Since the second ESL layer 12 is absent, the effective refractive index in the ridge inner region $I_a^i$ in the ridge-type broad-area semiconductor laser device 510 becomes 3.41698. Meanwhile, the effective refractive index in the cladding regions $II_c$ is the same 3.41672, and in a case where the ridge width 2 W is 100 μm (ridge outer region width $W_o$ is 0 μm), v in equation (1) is 13.58 and thus nine modes from a zeroth order (fundamental mode) to an eighth order are allowed.

The effective refractive index in the ridge outer region $I_a^o$ where the proton implanted region 17 serving as a current non-injection structure is provided through implantation with protons is 3.41698 which is the same as that in the ridge inner region $I_a^i$. As an example, in a case where protons are implanted to a depth of 0.7 μm from the surface of the p-type GaAs contact layer 14, the distance $h_1$ from the upper end of the first ESL layer 10 to the lower end of the proton implanted region 17 is 1.0 μm.

If the distance $h_1$ from the upper end of the first ESL layer 10 to the current non-injection structure, i.e., the lower end of the proton implanted region 17, is not less than 0.59 μm, the effective refractive index in the ridge outer regions $I_a^o$ is substantially the same as the effective refractive index in the ridge inner region $I_a^i$. That is, there is almost no light in a region above 0.59 μm of the distance $h_1$, there is no influence from scattering due to crystal breakage caused by proton implantation and loss due to the scattering, and there is no reduction in reliability due to crystal defect.

Figure 7:
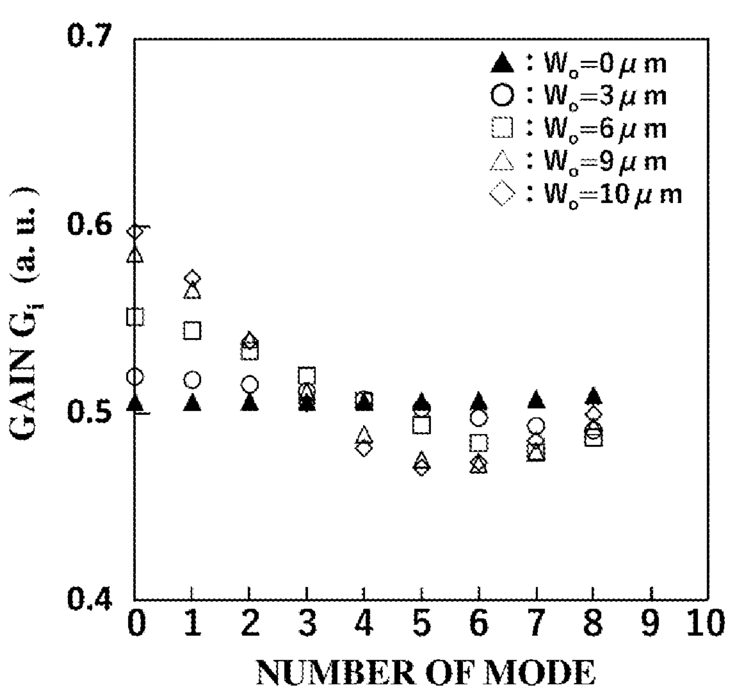
FIG. 7 shows the gain in each mode of the ridge-type broad-area semiconductor laser device according to modification 1 of embodiment 1.
Figure 8:
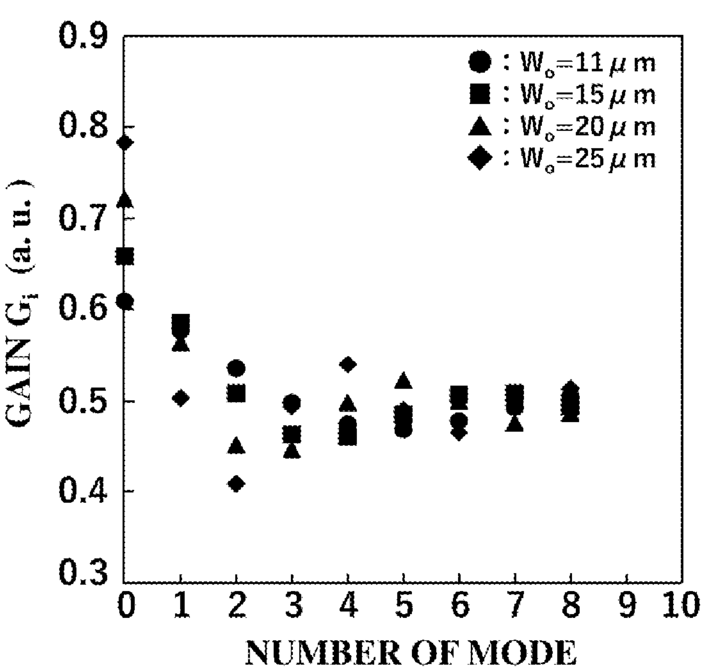
FIG. 8 shows the gain in each mode of the ridge-type broad-area semiconductor laser device according to modification 1 of embodiment 1.

FIG. 7 and FIG. 8 show the gain $G_i$ in each mode in cases where the ridge outer region width $W_o$ of each ridge outer region $I_a^o$ is 3, 6, 9, 10, 11, 15, 20, and 25 μm. A case where the ridge outer region width $W_o$ is 0 μm (comparative example) is also shown together. In the case of the comparative example, there are almost no gain differences among the modes, and if any, the gain difference is less than 1%, and therefore laser oscillation can occur in any mode. Thus, in the comparative example, the horizontal beam divergence angle varies depending on the mode in which laser oscillation occurs.

On the other hand, the ridge-type broad-area semiconductor laser device 510 according to modification 1 of embodiment 1 is provided with the ridge outer regions $I_a^o$ where the proton implanted regions 17 serving as current non-injection structures are formed, so that current mainly flows in the ridge inner region $I_a^i$. Accordingly, gain differences arise among the modes, so that the gain in a low-order mode becomes higher than the gain in a high-order mode. Thus, laser oscillation in a low-order mode can be performed and a narrow horizontal beam divergence angle can be achieved.

The gains in low-order modes in the present disclosure, e.g., modes of zeroth to third orders in a case where the ridge outer region width $W_o$ is not greater than 10 μm, are higher than the gains in low-order modes in the comparative example. Therefore, laser oscillation is reached with a low gain, and a ridge-type broad-area semiconductor laser device in which laser oscillation occurs with lower threshold current than in the comparative example can be obtained.

In the ridge-type broad-area semiconductor laser device 510 according to modification 1 of embodiment 1, even if the ridge outer region width $W_o$ is greater than 10 μm, the gain in a low-order mode is higher than in the comparative example and loss does not increase. In a case where the ridge outer region width $W_o$ is not less than 15 μm, there is a gain difference greater than 11% between the fundamental mode and all the other modes, and thus it becomes possible to substantially perform oscillation in the fundamental mode. In a case where the ridge outer region width $W_o$ is not less than 20 μm, such tendency becomes further outstanding.

In the ridge-type broad-area semiconductor laser device 510 according to modification 1 of embodiment 1, the n-type AlGaAs low-refractive-index layer 4 and the p-type AlGaAs low-refractive-index layer 10 are each provided between the cladding layer and the optical guide layer. However, the same effects are provided even in a case where one or both of the low-refractive-index layers are provided in the cladding layers.

It suffices that the ridge outer region width $W_o$ is greater than the distance $h_1+h_2$ (1.74 μm) and smaller than W (50 μm). It suffices that the distance $h_1$ from the upper end of the first ESL layer 10 to the lower end of the proton implanted region 17 is not less than 0.59 μm. However, in the ridge-type broad-area semiconductor laser device 510 according to modification 1 of embodiment 1, the distance $h_1$ is set to 1.0 μm and this setting is made in order that a damaged part of the semiconductor layer due to proton implantation is located farther from the optical intensity distribution, thereby achieving higher reliability.

In the manufacturing method for the ridge-type broad-area semiconductor laser device 510 according to modification 1 of embodiment 1, the structure formed through ion implantation with protons has been shown as an example. However, without limitation thereto, any means that can increase the electric resistance of the semiconductor layer is applicable.

In the case of using proton implantation as means for imparting the semiconductor layers with insulation property, an etching process is not needed, thus providing an effect of decreasing the number of manufacturing steps and also facilitating the manufacturing of the ridge-type broad-area semiconductor laser device.

As described above, the ridge-type broad-area semiconductor laser device 510 according to modification 1 of embodiment 1 is provided with the ridge outer regions $I_a^o$ where the proton implanted regions 17 serving as current non-injection structures are formed, so that current injected in the ridge-type broad-area semiconductor laser device 510 mainly flows in the ridge inner region $I_a^i$. Accordingly, the gain in a low-order mode becomes higher than the gain in a high-order mode, and laser oscillation in a low-order mode can be performed, thus providing an effect of narrowing the horizontal beam divergence angle.

Modification 2 of Embodiment 1

Figure 9:
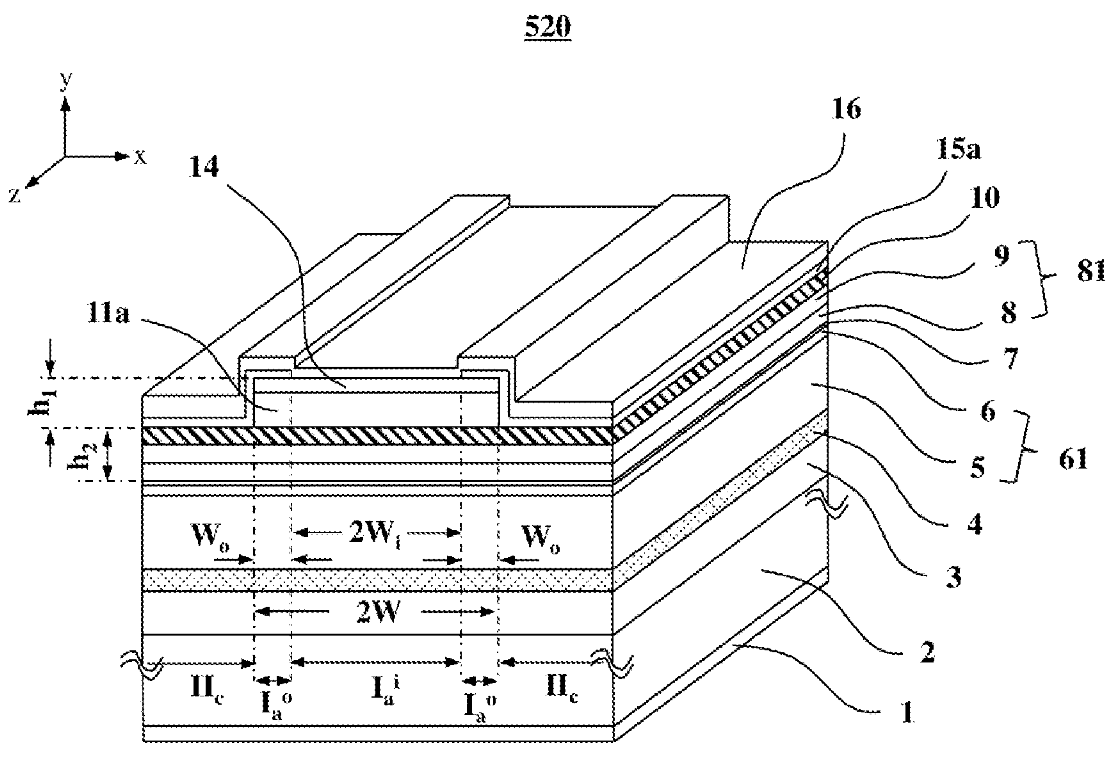
FIG. 9 is a perspective view showing a ridge-type broad-area semiconductor laser device in 975 nm modification 2 of embodiment 1.

FIG. 9 is a perspective view showing a ridge-type broad-area semiconductor laser device 520 in 975 nm band having a real refractive index distribution according to modification 2 of embodiment 1. As shown in FIG. 9, the ridge-type broad-area semiconductor laser device 520 has SiN films 15*a* having a film thickness of 0.2 μm.

A manufacturing method for the ridge-type broad-area semiconductor laser device 520 according to modification 2 of embodiment 1 will be described below.

Above the n-type GaAs substrate 2, the semiconductor layers from the n-type AlGaAs cladding layer 3 to the p-type GaAs contact layer 14 are sequentially crystal-grown by a crystal growth method such as metal organic chemical vapor deposition (MOCVD).

Next, with the ridge inner region Isi and the ridge outer regions $I_a^o$ coated with a resist, dry etching is performed until reaching the first ESL layer 10, and the resist is removed.

Subsequently, with the ridge inner region Tai coated with a resist, the SiN films 15*a* are formed, lift-off is performed, and the resist is removed.

Finally, the p-type electrode 16 and the n-type electrode 1 are formed on the upper surface side and the lower surface side, respectively.

The difference from the ridge-type broad-area semiconductor laser device 500 according to embodiment 1 shown in FIG. 3 is that the second ESL layer 12 is absent and in the ridge outer regions $I_a^o$, the SiN films 15*a* are respectively provided on parts of the surface at both ends in the ridge width direction of the p-type GaAs contact layer 14, instead of removal by etching.

In the ridge-type broad-area semiconductor laser device 520 according to modification 2 of embodiment 1, parts of the surface at both ends in the ridge width direction of the p-type GaAs contact layer 14 in the ridge outer regions $I_a^o$ are respectively covered with the SiN films 15*a*, thereby forming current non-injection structures. Thus, current injected in the ridge-type broad-area semiconductor laser device 520 mainly flows in the ridge inner region $Ia^i$.

The effective refractive indices in the ridge inner region $I_a^i$, the ridge outer regions $I_a^o$, and the cladding regions $II_c$ are 3.41698, 3.41698, and 3.41672, respectively, and in a case where the ridge width 2 W is 100 μm, nine modes from a zeroth order (fundamental mode) to an eighth order are allowed. Since current spreads from an upper part of the p-type GaAs contact layer 14, the distance $h_1$ is 1.7 μm.

Figure 10:
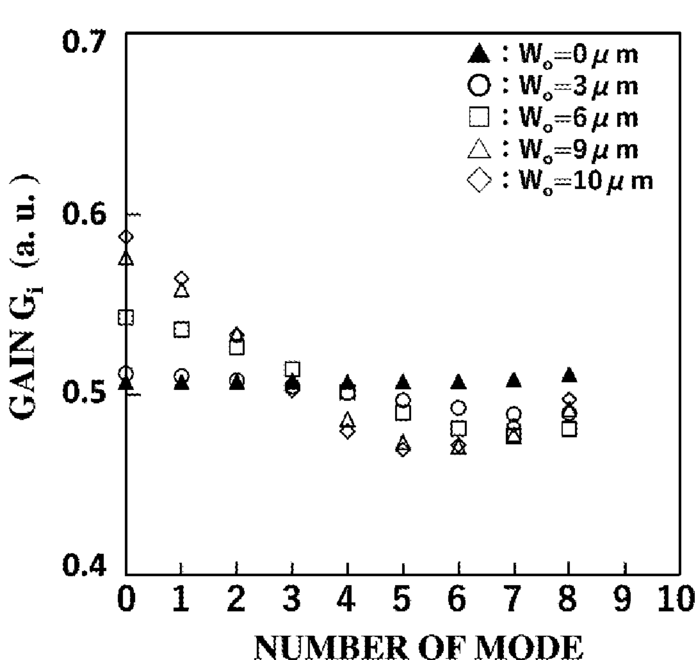
FIG. 10 shows the gain in each mode of the ridge-type broad-area semiconductor laser device according to modification 2 of embodiment 1.
Figure 11:
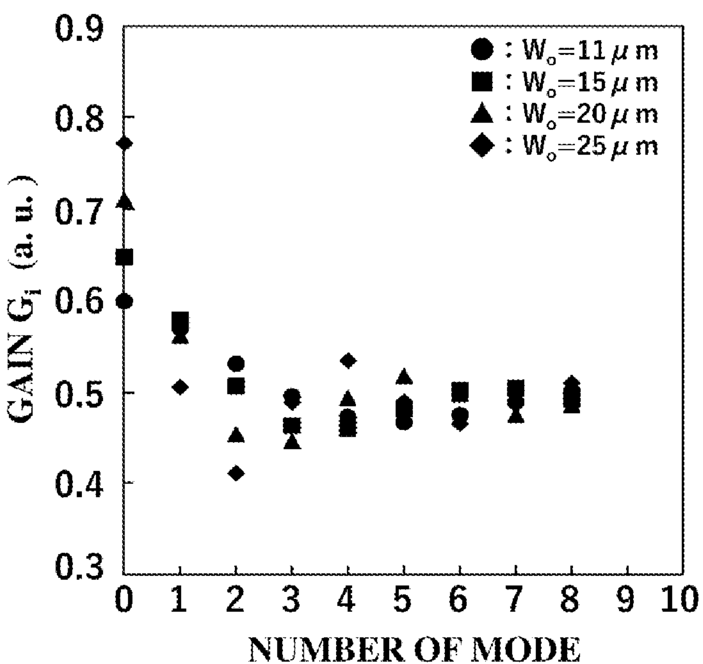
FIG. 11 shows the gain in each mode of the ridge-type broad-area semiconductor laser device according to modification 2 of embodiment 1.

FIG. 10 and FIG. 11 show the gain $G_i$ in each mode in cases where the ridge outer region width $W_o$ is 3, 6, 9, 10, 11, 15, 20, and 25 μm. A case where the ridge outer region width $W_o$ is 0 μm (comparative example) is also shown together. In the case of the comparative example, there are almost no gain differences among the modes, and if any, the gain difference is less than 1%, and therefore laser oscillation can occur in any mode. Thus, the horizontal beam divergence angle varies depending on the mode in which laser oscillation occurs.

On the other hand, the ridge-type broad-area semiconductor laser device 520 according to modification 2 of embodiment 1 is provided with the ridge outer regions $I_a^o$ having current non-injection structures in which parts of the surface at both ends in the ridge width direction of the p-type GaAs contact layer 14 are respectively covered with the SiN films 15*a*, so that current mainly flows in the ridge inner region $I_a^i$. Accordingly, gain differences arise among the modes, so that the gain in a low-order mode becomes higher than the gain in a high-order mode. Thus, laser oscillation in a low-order mode can be performed and a narrow horizontal beam divergence angle can be achieved.

The gains in low-order modes in the present disclosure, e.g., modes of zeroth to third orders in a case where the ridge outer region width $W_o$ is not greater than 10 μm, are higher than the gains in low-order modes in the comparative example. Therefore, laser oscillation is reached with a low gain, and a ridge-type broad-area semiconductor laser device in which laser oscillation occurs with lower threshold current than in the comparative example can be obtained.

In the ridge-type broad-area semiconductor laser device 520 according to modification 2 of embodiment 1, even if the ridge outer region width $W_o$ is greater than 10 μm, the gain in a low-order mode is higher than in the comparative example and loss does not increase. In a case where the ridge outer region width $W_o$ is not less than 15 μm, there is a gain difference greater than 10% between the fundamental mode and all the other modes, and thus it becomes possible to substantially perform oscillation in the fundamental mode. In a case where the ridge outer region width $W_o$ is not less than 20 μm, such tendency becomes further outstanding.

It suffices that the ridge outer region width $W_o$ is greater than the distance $h_1+h_2$ (2.44 μm) and smaller than W (50 μm). In the present embodiment, since the current non-injection structures in the ridge outer regions $I_a^o$ are formed by the SiN films 15*a* which are insulation films, the distance from the p-type GaAs contact layer 14 to the InGaAs quantum well active layer 7 through which current begins to spread in the x direction, i.e., the ridge width direction, increases to be 2.44 μm, and therefore gain differences are hardly obtained in a case where the ridge outer region width $W_o$ is small. However, since the effect increases if the ridge outer region width $W_o$ is increased, no particular problems arise. Although SiN is used as the insulation film, another material such as $SiO_2$ may be used.

In the manufacturing method for the ridge-type broad-area semiconductor laser device 520 according to modification 2 of embodiment 1, processes such as etching or proton implantation are not performed, thus providing an effect of significantly facilitating manufacturing of the ridge-type broad-area semiconductor laser device.

As described above, the ridge-type broad-area semiconductor laser device 520 according to modification 2 of embodiment 1 is provided with current non-injection structures in which parts of the surface at both ends in the ridge width direction of the p-type GaAs contact layer 14 in the ridge outer regions $I_a^o$ are respectively covered with the SiN films 15*a*, so that current injected in the ridge-type broad-area semiconductor laser device 520 mainly flows in the ridge inner region $I_a^i$. Accordingly, the gain in a low-order mode becomes higher than the gain in a high-order mode, and laser oscillation in a low-order mode can be performed, thus providing an effect of narrowing the horizontal beam divergence angle.

Embodiment 2

Figure 12:
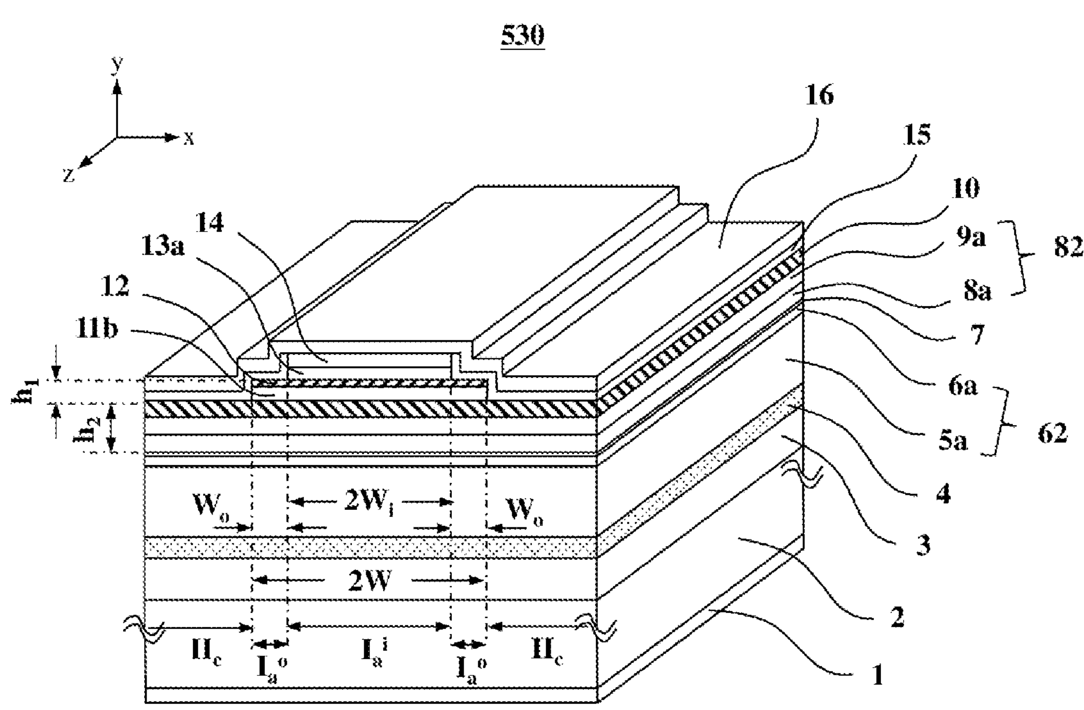
FIG. 12 is a perspective view showing a ridge-type broad-area semiconductor laser device in 975 nm band having a real refractive index distribution according to embodiment 2.

FIG. 12 is a perspective view showing a ridge-type broad-area semiconductor laser device 530 in 975 nm band having a real refractive index distribution according to embodiment 2. The ridge-type broad-area semiconductor laser device 530 in 975 nm band having a real refractive index distribution according to embodiment 2 is characterized in that the position of the InGaAs quantum well active layer 7 is located at the center of optical guide layers 62, 82, i.e., arrangement is symmetric with respect to the InGaAs quantum well active layer 7.

The ridge-type broad-area semiconductor laser device 530 shown in FIG. 12 has an n-side AlGaAs second optical guide layer 5*a* having an Al composition ratio of 0.16 and a layer thickness of 700 nm, an n-side AlGaAs first optical guide layer 6*a* having an Al composition ratio of 0.14 and a layer thickness of 200 nm, a p-side AlGaAs first optical guide layer 8*a* having an Al composition ratio of 0.14 and a layer thickness of 200 nm, a p-side AlGaAs second optical guide layer 9*a* having an Al composition ratio of 0.16 and a layer thickness of 700 nm, a p-type AlGaAs first cladding layer 11*b* (second-conductivity-type first cladding layer) having an Al composition ratio of 0.20 and a layer thickness of 0.40 μm, and a p-type AlGaAs second cladding layer 13*a* (second-conductivity-type second cladding layer) having an Al composition ratio of 0.20 and a layer thickness of 1.10 μm. The other configurations are the same as those shown in FIG. 3 in embodiment 1.

That is, in the ridge-type broad-area semiconductor laser device 530 according to embodiment 2, as in the ridge-type broad-area semiconductor laser device 500 according to embodiment 1, at least the p-type GaAs contact layer 14 and the p-type AlGaAs second cladding layer 13*a* in the ridge outer regions $I_a^o$ are removed by etching and the exposed surfaces on which removal has been performed by etching are covered with the SiN films 15 which are insulation films, thereby forming current non-injection structures. Thus, current injected in the ridge-type broad-area semiconductor laser device 530 mainly flows in the ridge inner region $I_a^i$.

The n-side AlGaAs second optical guide layer 5*a* and the n-side AlGaAs first optical guide layer 6*a* are collectively referred to as n-side optical guide layer 62 or first-conductivity-type-side optical guide layer 62, and the p-side AlGaAs first optical guide layer 8*a* and the p-side AlGaAs second optical guide layer 9*a* are collectively referred to as p-side optical guide layer 82 or second-conductivity-type-side optical guide layer 82.

A manufacturing method for the ridge-type broad-area semiconductor laser device 530 is also the same as in embodiment 1.

A total optical guide layer thickness which is the sum of the thicknesses of the p-side optical guide layer 82 and the n-side optical guide layer 62 in the ridge-type broad-area semiconductor laser device 530 is as great as 1.8 μm, and a mode of a first order or higher is allowed in the y direction, i.e., the lamination direction. In addition, $u_n$ is 0.292273 and $u_p$ is 0.522208, thus satisfying $u_p>u_n$. Therefore, the optical intensity distribution in the y direction is displaced toward the n-type GaAs substrate 2 side, whereby the number of allowed modes in the x direction can be decreased.

First, in a case where the ridge outer region width $W_o$ is zero, the effective refractive indices in the ridge region $I_a$ (ridge inner region $I_a^i$ and ridge outer regions $I_a^o$) and the cladding regions $II_c$ are 3.41839 and 3.41828, respectively. In a case where the ridge width 2 W is 100 μm, v is 8.83 and thus six modes from a zeroth order (fundamental mode) to a fifth order are allowed.

In the ridge-type broad-area semiconductor laser device 530, the layer thickness of the p-side optical guide layer 82 is the same as the layer thickness of the n-side optical guide layer 62. Therefore, although loss due to carriers staying during operation increases as compared to the configuration in embodiment 1, the refractive index difference between the ridge region $I_a$ (ridge inner region $I_a^i$ and ridge outer regions $I_a^o$) and the cladding regions $II_c$ can be reduced, thus having an advantage that the number of allowed modes can be decreased.

In the case where removal has been performed by etching in each ridge outer region $I_a^o$ until reaching the second ESL layer 12, the effective refractive index at this part is 3.41839, and thus the refractive index in the ridge region $I_a$ (ridge inner region $I_a^i$ and ridge outer regions $I_a^o$) is the same irrespective of removal by etching. Therefore, the number of allowed modes is the same.

Meanwhile, current begins to spread also in the x direction, i.e., the ridge width direction, from the upper end of the second ESL layer 12. That is, current spreads in the x direction through the distance $h_2$ (1.04 μm) from the upper end of the InGaAs quantum well active layer 7 to the upper end of the first ESL layer 10 and the distance $h_1$ (0.44 μm) from the upper end of the second ESL layer 12 to the upper end of the first ESL layer 10, thus reaching the InGaAs quantum well active layer 7.

Figure 13:
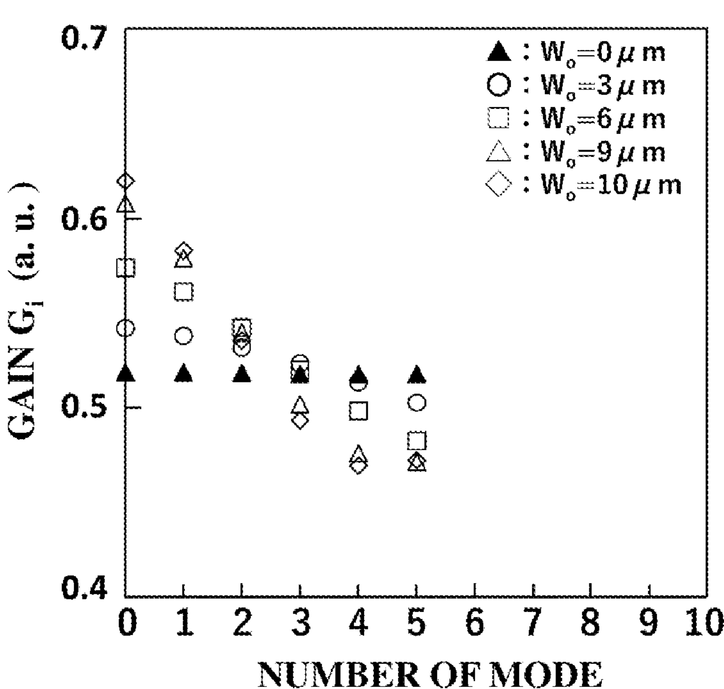
FIG. 13 shows the gain in each mode of the ridge-type broad-area semiconductor laser device according to embodiment 2.
Figure 14:
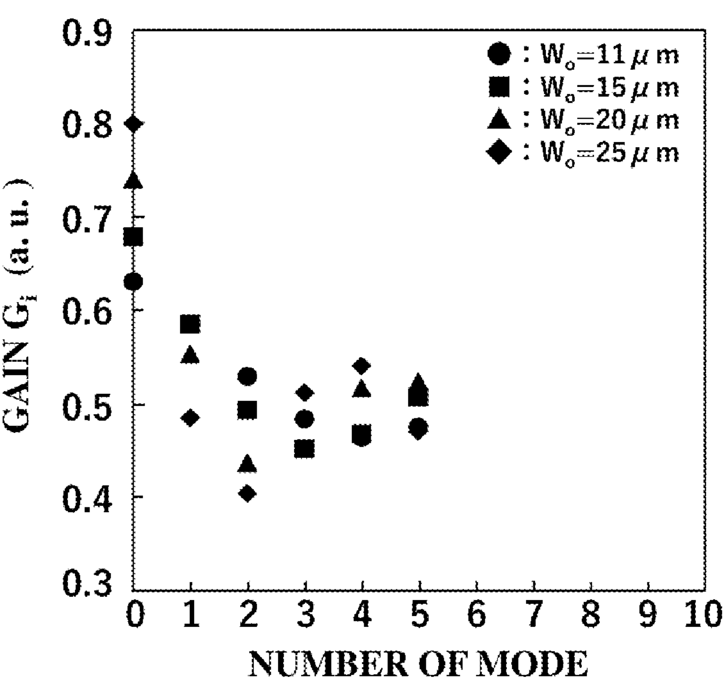
FIG. 14 shows the gain in each mode of the ridge-type broad-area semiconductor laser device according to embodiment 2.

FIG. 13 and FIG. 14 show the gain $G_i$ in each mode in cases where the ridge outer region width $W_o$ is 3, 6, 9, 10, 11, 15, 20, and 25 μm. A case where the ridge outer region width $W_o$ is 0 μm (comparative example) is also shown together. In the case of the comparative example, there are almost no gain differences among the modes, and if any, the gain difference is less than 1%, and therefore laser oscillation can occur in any mode. Thus, the horizontal beam divergence angle varies depending on the mode in which laser oscillation occurs.

On the other hand, the ridge-type broad-area semiconductor laser device 530 is provided with the ridge outer regions $I_a^o$ where current non-injection structures are formed by covering, with the SiN films 15, the exposed surfaces on which the p-type GaAs contact layer 14 and the p-type AlGaAs second cladding layer 13*a* have been removed by etching, so that current mainly flows in the ridge inner region $I_a^i$. Accordingly, gain differences arise among the modes, so that the gain in a low-order mode becomes higher than the gain in a high-order mode. Thus, laser oscillation in a low-order mode can be performed and a narrow horizontal beam divergence angle can be achieved.

The gains in low-order modes in the present disclosure, e.g., modes of zeroth to second orders in a case where the ridge outer region width $W_o$ is not greater than 10 μm, are higher than the gains in low-order modes in the comparative example. Therefore, laser oscillation is reached with a low gain, and a ridge-type broad-area semiconductor laser device in which laser oscillation occurs with lower threshold current than in the comparative example can be obtained.

In the ridge-type broad-area semiconductor laser device 530, even if the ridge outer region width $W_o$ is higher than 10 μm, the gain in a low-order mode is greater than in the comparative example and loss does not increase. In a case where the ridge outer region width $W_o$ is not less than μm, there is a gain difference greater than 13% between the fundamental mode and all the other modes, and thus it becomes possible to substantially perform oscillation in the fundamental mode. In a case where the ridge outer region width $W_o$ is not less than 20 μm, such tendency becomes further outstanding.

Since current isotropically spreads, it suffices that the ridge outer region width $W_o$ is greater than the distance $h_1+h_2$ (1.48 μm) and smaller than W (50 μm).

As described above, the ridge-type broad-area semiconductor laser device 530 according to embodiment 2 is provided with current non-injection structures by covering, with the SiN films 15, the exposed surfaces on which the p-type GaAs contact layer 14 and the p-type AlGaAs second cladding layer 13*a* have been removed by etching in the ridge outer regions $I_a^o$, so that current injected in the ridge-type broad-area semiconductor laser device 530 mainly flows in the ridge inner region $I_a^i$. Accordingly, the gain in a low-order mode becomes higher than the gain in a high-order mode, and laser oscillation in a low-order mode can be performed, thus providing an effect of narrowing the horizontal beam divergence angle. Further, since the layer thickness of the p-side optical guide layer 82 is the same as the layer thickness of the n-side optical guide layer 62, the refractive index difference between the ridge region $I_a$ (ridge inner region $I_a^i$ and ridge outer regions $I_a^o$) and the cladding regions $II_c$ can be reduced, thus providing an effect that the number of allowed modes can be decreased.

Modification 1 of Embodiment 2

Figure 15:
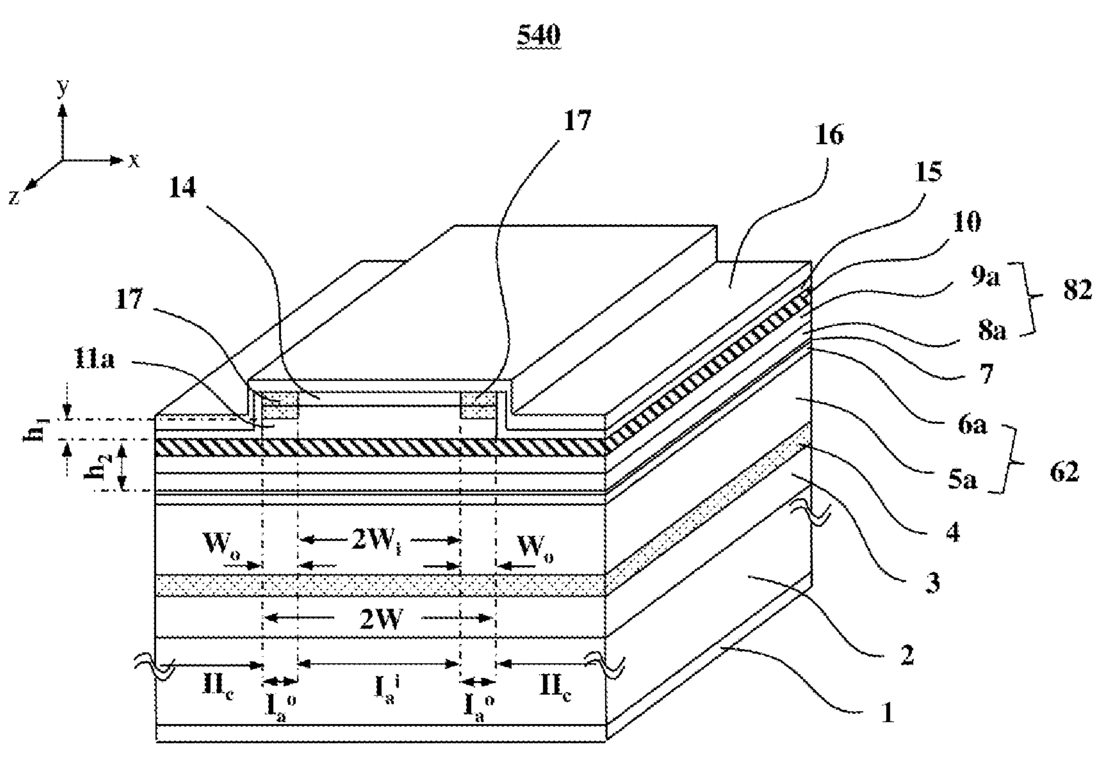
FIG. 15 is a perspective view showing a ridge-type broad-area semiconductor laser device in 975 nm band having a real refractive index distribution according to modification 1 of embodiment 2.

FIG. 15 is a perspective view showing a ridge-type broad-area semiconductor laser device 540 in 975 nm band having a real refractive index distribution according to modification 1 of embodiment 2.

The difference from the ridge-type broad-area semiconductor laser device 530 according to embodiment 2 shown in FIG. 12 is that the second ESL layer 12 is absent and the ridge outer regions $I_a^o$ are formed by imparting the semiconductor layers with insulation property through proton implantation, instead of removal by etching.

A manufacturing method for the ridge-type broad-area semiconductor laser device 540 is the same as in modification 1 of embodiment 1.

In the ridge-type broad-area semiconductor laser device 540, since the second ESL layer 12 is absent, the effective refractive index in the ridge region $I_a$ (ridge inner region $I_a^i$ and ridge outer regions $I_a^o$) becomes 3.41840. The effective refractive index in the cladding regions $II_c$ in the ridge-type broad-area semiconductor laser device 540 is the same 3.41828, and in a case where the ridge width 2 W is 100 μm, v in equation (1) is 9.22 and thus six modes from a zeroth order (fundamental mode) to a fifth order are allowed.

The effective refractive index in the ridge outer regions $I_a^o$ where protons are implanted is 3.41840 which is the same as that in the ridge inner region $I_a^i$. As an example, in a case where protons are implanted to a depth of 0.95 μm from the surface of the p-type GaAs contact layer 14, the distance $h_1$ from the upper end of the first ESL layer 10 to the lower end of the proton implanted region 17 is 0.75 μm.

If the distance $h_1$ from the upper end of the first ESL layer 10 to the current non-injection structure, i.e., the lower end of the proton implanted region 17, is not less than 0.44 μm, the effective refractive index in the ridge outer regions $I_a^o$ is substantially the same as the effective refractive index in the ridge inner region $I_a^i$. That is, since there is almost no light in a region above 0.44 μm of the distance $h_1$, there is no influence from scattering due to crystal breakage caused by proton implantation in the crystal layer and loss due to the scattering, and reduction in reliability due to crystal defect does not occur.

Figure 16:
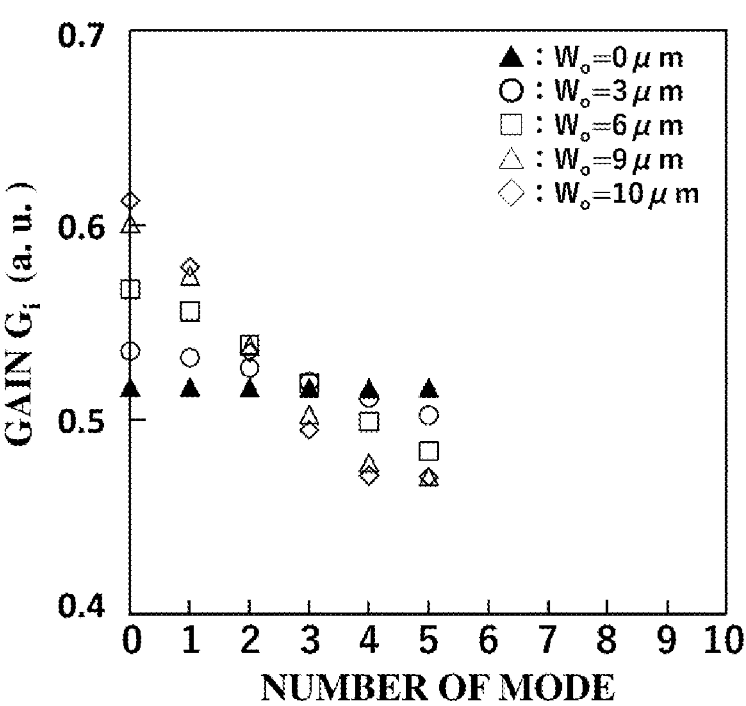
FIG. 16 shows the gain in each mode of the ridge-type broad-area semiconductor laser device according to modification 1 of embodiment 2.
Figure 17:
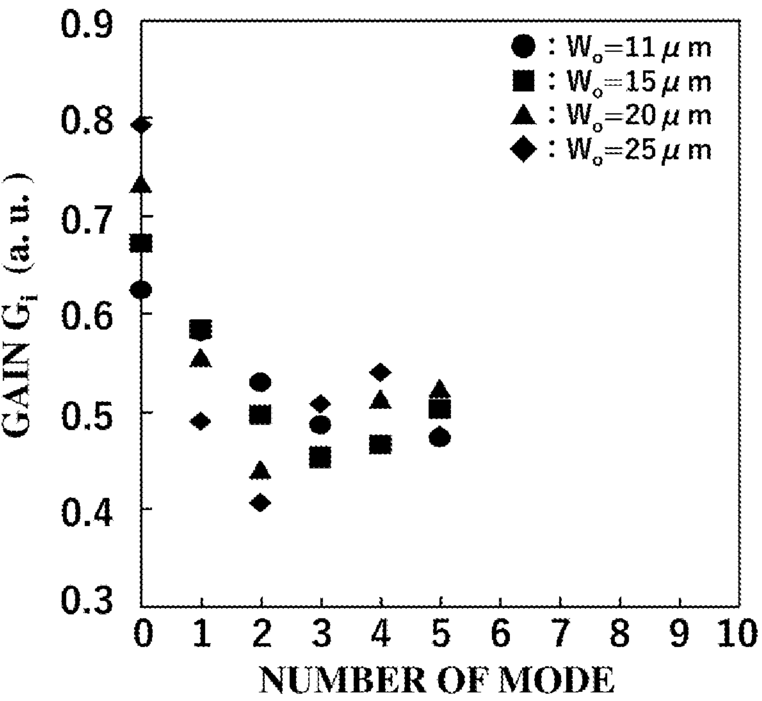
FIG. 17 shows the gain in each mode of the ridge-type broad-area semiconductor laser device according to modification 1 of embodiment 2.

FIG. 16 and FIG. 17 show the gain $G_i$ in each mode in cases where the ridge outer region width $W_o$ is 3, 6, 9, 10, 11, 15, 20, and 25 μm. A case where $W_o$ is 0 μm (comparative example) is also shown together. In the case of the comparative example, there are almost no gain differences among the modes, and if any, the gain difference is less than 1%, and therefore laser oscillation can occur in any mode. Thus, the horizontal beam divergence angle varies depending on the mode in which laser oscillation occurs.

On the other hand, the ridge-type broad-area semiconductor laser device 540 is provided with the ridge outer regions $I_a^o$ where the proton implanted regions 17 serving as current non-injection structures are formed, so that current mainly flows in the ridge inner region $I_a^i$. Accordingly, gain differences arise among the modes, so that the gain in a low-order mode becomes higher than the gain in a high-order mode. Thus, laser oscillation in a low-order mode can be performed and a narrow horizontal beam divergence angle can be achieved.

The gains in low-order modes in the present disclosure, e.g., modes of zeroth to second orders in a case where the ridge outer region width $W_o$ is not greater than 10 μm, are higher than the gains in low-order modes in the comparative example. Therefore, laser oscillation is reached with a low gain, and a ridge-type broad-area semiconductor laser device in which laser oscillation occurs with lower threshold current than in the comparative example can be obtained.

In the ridge-type broad-area semiconductor laser device 540, even if the ridge outer region width $W_o$ is greater than 10 μm, the gain in a low-order mode is higher than in the comparative example and loss does not increase. In a case where the ridge outer region width $W_o$ is not less than 15 μm, there is a gain difference greater than 13% between the fundamental mode and all the other modes, and thus it becomes possible to substantially perform oscillation in the fundamental mode. In a case where the ridge outer region width $W_o$ is not less than 20 μm, such tendency becomes further outstanding.

It suffices that the ridge outer region width $W_o$ is greater than the distance $h_1+h_2$ (1.79 μm) and smaller than W (50 μm). It suffices that the distance $h_1$ from the first ESL layer 10 to the lower end of the proton implanted region 17 is not less than 0.44 μm. However, in the ridge-type broad-area semiconductor laser device 540 according to modification 1 of embodiment 2, the distance $h_1$ is set to 0.75 μm and this setting is made in order that a damaged part of the semiconductor layer due to proton implantation is located farther from the optical intensity distribution, thereby achieving higher reliability.

In the present embodiment, the structure formed through ion implantation with protons has been shown as an example. However, without limitation thereto, any means that can increase the electric resistance of the semiconductor layer is applicable.

In the case of using proton implantation as means for imparting the semiconductor layers with insulation property, an etching process is not needed, thus providing an effect of decreasing the number of manufacturing steps and also facilitating the manufacturing of the ridge-type broad-area semiconductor laser device.

As described above, the ridge-type broad-area semiconductor laser device 540 according to modification 1 of embodiment 2 is provided with the ridge outer regions $I_a^o$ where the proton implanted regions 17 serving as current non-injection structures are formed, so that current injected in the ridge-type broad-area semiconductor laser device 540 mainly flows in the ridge inner region $I_a^i$. Accordingly, the gain in a low-order mode becomes higher than the gain in a high-order mode, and laser oscillation in a low-order mode can be performed, thus providing an effect of narrowing the horizontal beam divergence angle. Further, since the layer thickness of the p-side optical guide layer 82 is the same as the layer thickness of the n-side optical guide layer 62, the refractive index difference between the ridge region $I_a$ (ridge inner region $I_a^i$ and ridge outer regions $I_a^o$) and the cladding regions $II_c$ can be reduced, thus providing an effect that the number of allowed modes can be decreased.

Modification 2 of Embodiment 2

Figure 18:
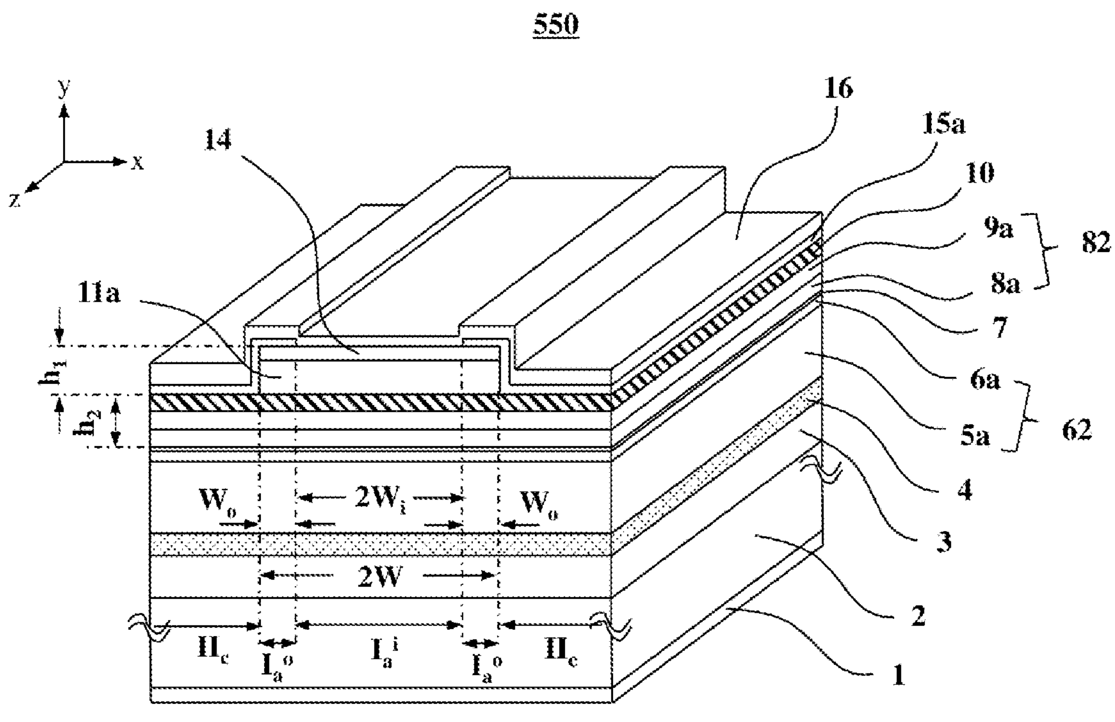
FIG. 18 is a perspective view showing a ridge-type broad-area semiconductor laser device in 975 nm band having a real refractive index distribution according to modification 2 of embodiment 2.

FIG. 18 is a perspective view showing a ridge-type broad-area semiconductor laser device 550 in 975 nm band having a real refractive index distribution according to modification 2 of embodiment 2.

The difference from the ridge-type broad-area semiconductor laser device 530 according to embodiment 2 shown in FIG. 12 is that the second ESL layer 12 is absent and in the ridge outer regions $I_a^o$, the SiN films 15*a* are respectively provided on parts of the surface at both ends in the ridge width direction of the p-type GaAs contact layer 14, instead of removal by etching.

A manufacturing method for the ridge-type broad-area semiconductor laser device 550 is the same as in modification 2 of embodiment 1.

The effective refractive indices in the ridge inner region $I_a^i$, the ridge outer regions $I_a^o$, and the cladding regions $II_c$ in the ridge-type broad-area semiconductor laser device 550 are 3.41840, 3.41840, and 3.41828, respectively, and in a case where the ridge width 2 W is 100 μm, six modes from a zeroth order (fundamental mode) to a fifth order are allowed. Since current spreads from an upper part of the p-type GaAs contact layer 14, the distance $h_1$ is 1.7 μm.

Figure 19:
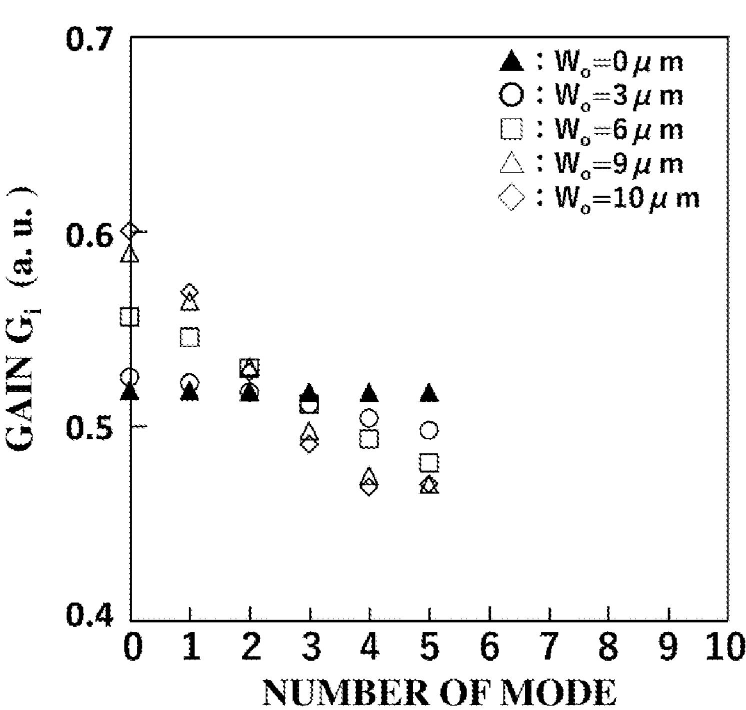
FIG. 19 shows the gain in each mode of the ridge-type broad-area semiconductor laser device according to modification 2 of embodiment 2.
Figure 20:
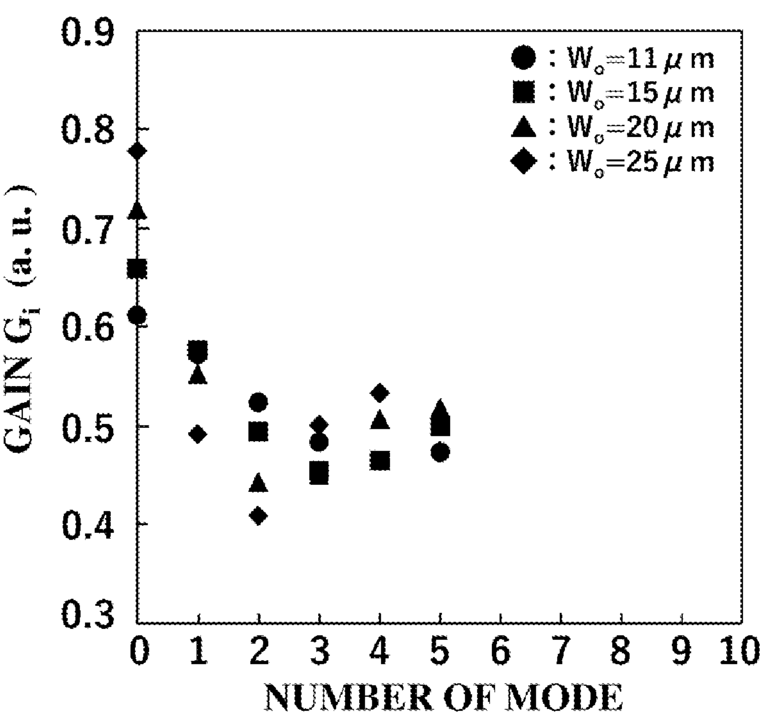
FIG. 20 shows the gain in each mode of the ridge-type broad-area semiconductor laser device according to modification 2 of embodiment 2.

FIG. 19 and FIG. 20 show the gain $G_i$ in each mode in cases where the ridge outer region width $W_o$ is 3, 6, 9, 10, 11, 15, 20, and 25 μm. A case where the ridge outer region width $W_o$ is 0 μm (comparative example) is also shown together. In the case of the comparative example, there are almost no gain differences among the modes, and if any, the gain difference is less than 1%, and therefore laser oscillation can occur in any mode. Thus, the horizontal beam divergence angle varies depending on the mode in which laser oscillation occurs.

On the other hand, the ridge-type broad-area semiconductor laser device 550 is provided with the ridge outer regions $I_a^o$ having current non-injection structures in which parts of the surface at both ends in the ridge width direction of the p-type GaAs contact layer 14 are respectively covered with the SiN films 15*a*, so that current mainly flows in the ridge inner region $I_a^i$. Accordingly, gain differences arise among the modes, so that the gain in a low-order mode becomes higher than the gain in a high-order mode. Thus, laser oscillation in a low-order mode can be performed and a narrow horizontal beam divergence angle can be achieved.

The gains in low-order modes in the present disclosure, e.g., modes of zeroth to second orders in a case where the ridge outer region width $W_o$ is not greater than 10 μm, are higher than the gains in low-order modes in the comparative example. Therefore, laser oscillation is reached with a low gain, and a ridge-type broad-area semiconductor laser device in which laser oscillation occurs with lower threshold current than in the comparative example can be obtained.

In the ridge-type broad-area semiconductor laser device 550, even if the ridge outer region width $W_o$ is greater than 10 μm, the gain in a low-order mode is higher than in the comparative example and loss does not increase. In a case where the ridge outer region width $W_o$ is not less than 15 μm, there is a gain difference greater than 12% between the fundamental mode and all the other modes, and thus it becomes possible to substantially perform oscillation in the fundamental mode. In a case where the ridge outer region width $W_o$ is not less than 20 μm, such tendency becomes further outstanding.

It suffices that the ridge outer region width $W_o$ is greater than the distance $h_1+h_2$ (2.74 μm) and smaller than W (50 μm). In the present embodiment, since the current non-injection structures in the ridge outer regions $I_a^o$ are formed by the SiN films 15*a* which are insulation films, the distance from the p-type GaAs contact layer 14 to the InGaAs quantum well active layer 7 through which current begins to spread in the x direction increases to be 2.74 μm, and therefore gain differences are hardly obtained in a case where the ridge outer region width $W_o$ is small. However, since the effect increases if the ridge outer region width $W_o$ is increased, no particular problems arise. Although SiN is used as the insulation film, another material such as $SiO_2$ may be used.

Since processes such as etching or proton implantation are not performed, manufacturing of the ridge-type broad-area semiconductor laser device is significantly facilitated.

As described above, the ridge-type broad-area semiconductor laser device 550 according to modification 2 of embodiment 2 is provided with the ridge outer regions $I_a^o$ having current non-injection structures in which parts of the surface at both ends in the ridge width direction of the p-type GaAs contact layer 14 are respectively covered with the SiN films 15*a*, so that current injected in the ridge-type broad-area semiconductor laser device 550 mainly flows in the ridge inner region $I_a^i$. Accordingly, the gain in a low-order mode becomes higher than the gain in a high-order mode, and laser oscillation in a low-order mode can be performed, thus providing an effect of narrowing the horizontal beam divergence angle. Further, since the layer thickness of the p-side optical guide layer 82 is the same as the layer thickness of the n-side optical guide layer 62, the refractive index difference between the ridge region $I_a$ (ridge inner region $I_a^i$ and ridge outer regions $I_a^o$) and the cladding regions $II_c$ can be reduced, thus providing an effect that the number of allowed modes can be decreased.

Embodiment 3

Figure 21:
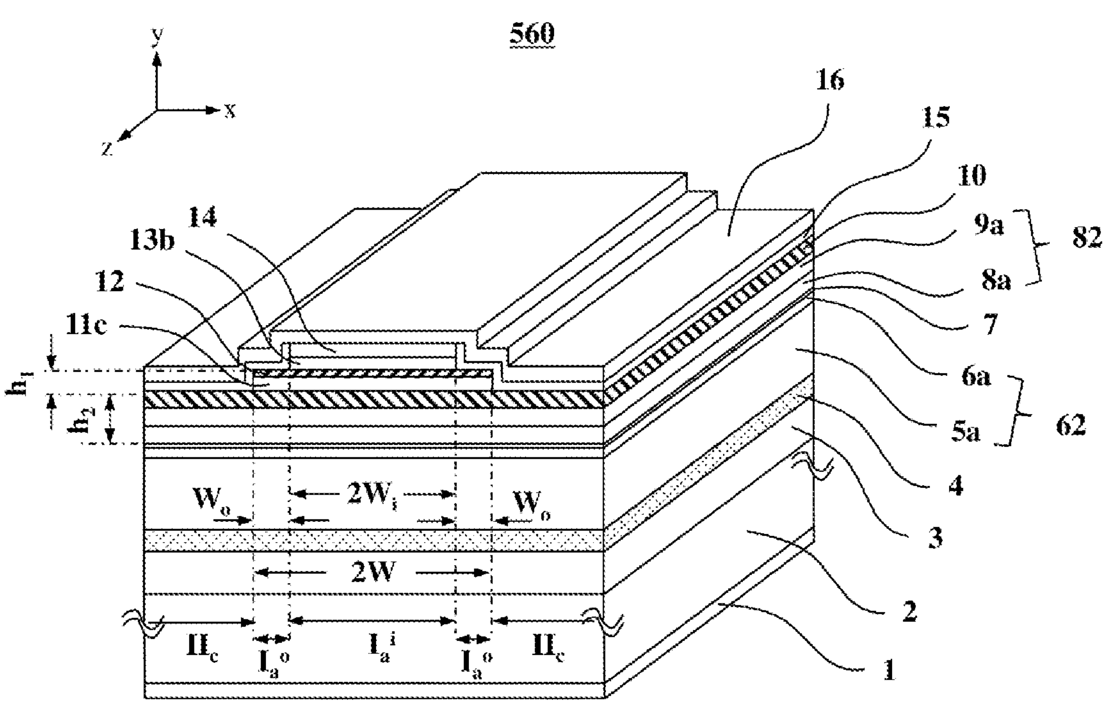
FIG. 21 is a perspective view showing a ridge-type broad-area semiconductor laser device in 975 nm band having a real refractive index distribution according to embodiment 3.

FIG. 21 is a perspective view showing a ridge-type broad-area semiconductor laser device 560 in 975 nm band having a real refractive index distribution according to embodiment 3.

The ridge-type broad-area semiconductor laser device 560 has an asymmetric structure in which the refractive index of the n-type AlGaAs cladding layer 3 is higher than the refractive indices of a p-type AlGaAs first cladding layer 11*c* and a p-type AlGaAs second cladding layer 13*b*, whereby optical absorption by carriers on the side of the p-type AlGaAs first cladding layer 11*c* and the p-type AlGaAs second cladding layer 13*b* is reduced, so as to enhance slope efficiency.

The ridge-type broad-area semiconductor laser device 560 shown in FIG. 21 has the p-type AlGaAs first cladding layer 11*c* (second-conductivity-type first cladding layer) having an Al composition ratio of 0.25 and a layer thickness of 0.3 μm, and the p-type AlGaAs second cladding layer 13*b* (second-conductivity-type second cladding layer) having an Al composition ratio of 0.25 and a layer thickness of 1.2 μm. The other layer configurations are the same as those of the ridge-type broad-area semiconductor laser device 530 according to embodiment 2 shown in FIG. 12.

A manufacturing method for the ridge-type broad-area semiconductor laser device 560 is the same as in embodiment 1.

In the ridge-type broad-area semiconductor laser device 560, since the refractive index of the n-type AlGaAs cladding layer 3 is higher than the refractive indices of the p-type AlGaAs first cladding layer 11*c* and the p-type AlGaAs second cladding layer 13*b*, the optical intensity distribution is greatly displaced toward the n-type GaAs substrate 2 side, whereby absorption by carriers in the p-type AlGaAs first cladding layer 11*c* and the p-type AlGaAs second cladding layer 13*b* can be reduced and thus slope efficiency can be improved.

In addition, since the optical intensity distribution is greatly displaced toward the n-type GaAs substrate 2 side, the refractive index difference between the ridge region $I_a$ (ridge inner region $I_a^i$ and ridge outer regions $I_a^o$) and the cladding regions $II_c$ is reduced, whereby the number of allowed modes can be easily decreased.

A total optical guide layer thickness which is the sum of the thicknesses of the p-side optical guide layer 82 and the n-side optical guide layer 62 in the ridge-type broad-area semiconductor laser device 560 is as great as 1.8 μm, and a mode of a first order or higher is allowed in the lamination direction. In addition, $u_n$ is 0.292273 and $u_p$ is 0.480463, thus satisfying $u_p>u_n$. Therefore, the optical intensity distribution in the y direction is displaced toward the n-type GaAs substrate 2 side, whereby the number of allowed modes in the x direction can be decreased.

In the case where the ridge outer region width $W_o$ is zero in the ridge-type broad-area semiconductor laser device 560, the effective refractive indices in the ridge region $I_a$ (ridge inner region $I_a^i$ and ridge outer regions $I_a^o$) and the cladding regions $II_c$ are 3.41837 and 3.41828, respectively. In a case where the ridge width 2 W is 100 μm, v is 7.99 and thus six modes from a zeroth order (fundamental mode) to a fifth order are allowed.

In the ridge-type broad-area semiconductor laser device 560, the layer thickness of the p-side optical guide layer 82 is the same as the layer thickness of the n-side optical guide layer 62. Therefore, while loss due to carriers staying during operation increases as compared to embodiment 1, since the refractive index of the n-type AlGaAs cladding layer 3 is higher than the refractive indices of the p-type AlGaAs first cladding layer 11*c* and the p-type AlGaAs second cladding layer 13*b*, spread of the optical distribution into the p-type AlGaAs first cladding layer 11*c* and the p-type AlGaAs second cladding layer 13*b* is reduced, so that loss due to absorption by carriers in the p-type AlGaAs first cladding layer 11*c* and the p-type AlGaAs second cladding layer 13*b* is reduced.

Since the layer thickness of the p-side optical guide layer 82 and the layer thickness of the n-side optical guide layer 62 are the same and the refractive index of the n-type AlGaAs cladding layer 3 is higher than the refractive indices of the p-type AlGaAs first cladding layer 11*c* and the p-type AlGaAs second cladding layer 13*b*, the refractive index difference between the ridge region $I_a$ (ridge inner region $I_a^i$ and ridge outer regions $I_a^o$) and the cladding regions $II_c$ can be reduced, whereby the number of allowed modes can be decreased.

In the case where removal has been performed by etching in each ridge outer region $I_a^o$ until reaching the second ESL layer 12, the effective refractive index at this part is 3.41837, and thus the refractive index in the ridge region $I_a$ (ridge inner region $I_a^i$ and ridge outer regions $I_a^o$) is the same irrespective of removal by etching. Therefore, the number of allowed modes is the same.

Meanwhile, current begins to spread also in the x direction, i.e., the ridge width direction, from the upper end of the second ESL layer 12. That is, current spreads in the x direction through the distance $h_2$ (1.04 μm) from the upper end of the InGaAs quantum well active layer 7 to the upper end of the first ESL layer 10 and the distance $h_1$ (0.34 μm) from the upper end of the second ESL layer 12 to the upper end of the first ESL layer 10, thus reaching the InGaAs quantum well active layer 7.

Figure 22:
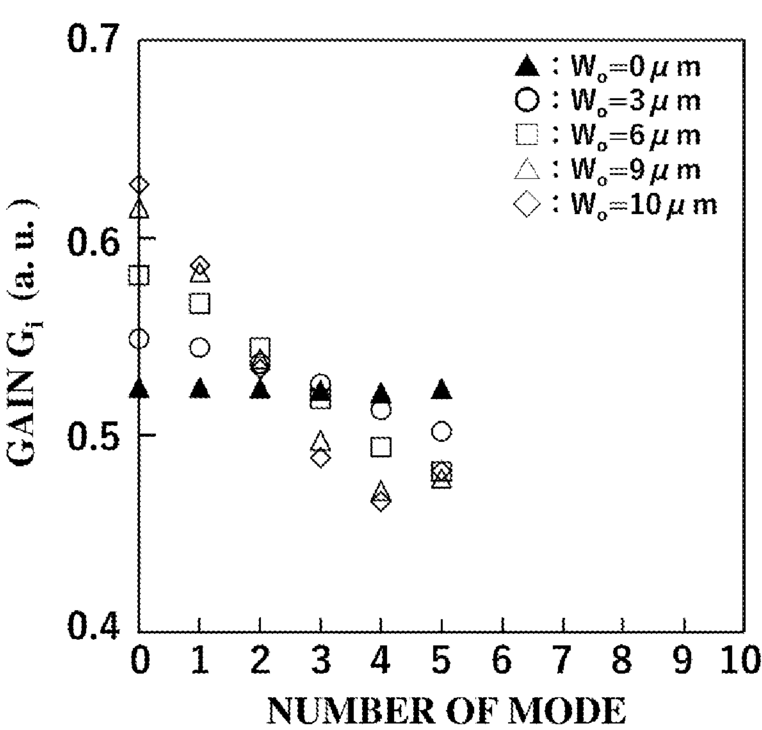
FIG. 22 shows the gain in each mode of the ridge-type broad-area semiconductor laser device according to embodiment 3.
Figure 23:
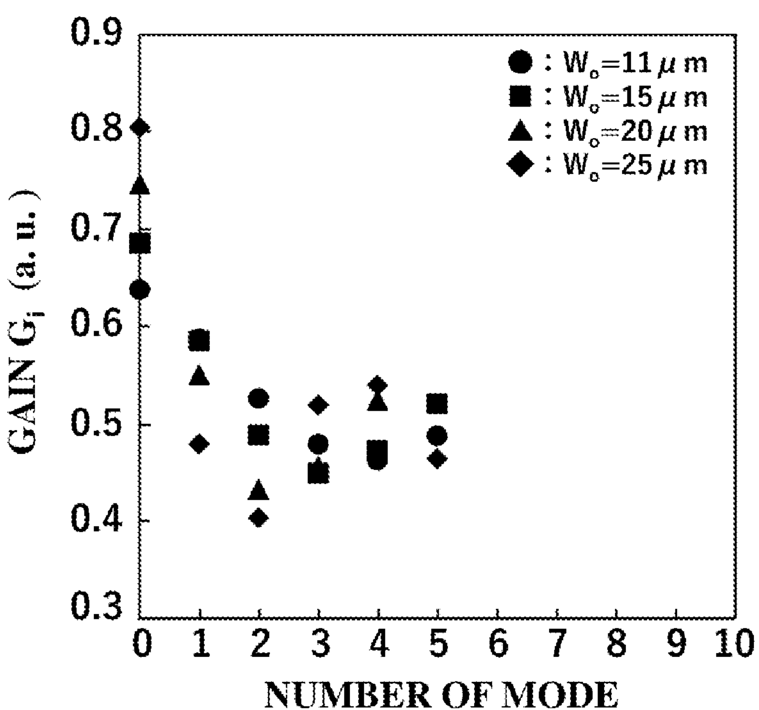
FIG. 23 shows the gain in each mode of the ridge-type broad-area semiconductor laser device according to embodiment 3.

FIG. 22 and FIG. 23 show the gain $G_i$ in each mode in cases where the ridge outer region width $W_o$ is 3, 6, 9, 10, 11, 15, 20, and 25 μm in the ridge-type broad-area semiconductor laser device 560. A case where the ridge outer region width $W_o$ is 0 μm (comparative example) is also shown together. In the case of the comparative example, there are almost no gain differences among the modes, and if any, the gain difference is less than 1%, and therefore laser oscillation can occur in any mode. Thus, the horizontal beam divergence angle varies depending on the mode in which laser oscillation occurs.

On the other hand, the ridge-type broad-area semiconductor laser device 560 is provided with the ridge outer regions $I_a^o$ where current non-injection structures are formed by covering, with the SiN films 15, the exposed surfaces on which the p-type GaAs contact layer 14 and the p-type AlGaAs second cladding layer 13*b* have been removed by etching, so that current mainly flows in the ridge inner region $I_a^i$. Accordingly, gain differences arise among the modes, so that the gain in a low-order mode becomes higher than the gain in a high-order mode. Thus, laser oscillation in a low-order mode can be performed and a narrow horizontal beam divergence angle can be achieved.

The gains in low-order modes in the present disclosure, e.g., modes of zeroth to second orders in a case where the ridge outer region width $W_o$ is not greater than 10 μm, are higher than the gains in low-order modes in the comparative example. Therefore, laser oscillation is reached with a low gain, and a ridge-type broad-area semiconductor laser device in which laser oscillation occurs with lower threshold current than in the comparative example can be obtained.

In the ridge-type broad-area semiconductor laser device 560, even if the ridge outer region width $W_o$ is greater than 10 μm, the gain in a low-order mode is higher than in the comparative example and loss does not increase. In a case where the ridge outer region width $W_o$ is not less than 15 μm, there is a gain difference greater than 14% between the fundamental mode and all the other modes, and thus it becomes possible to substantially perform oscillation in the fundamental mode. In a case where the ridge outer region width $W_o$ is not less than 20 μm, such tendency becomes further outstanding.

Since current isotropically spreads, it suffices that the ridge outer region width $W_o$ is greater than the distance $h_1+h_2$ (1.38 μm) and smaller than W (50 μm).

As described above, the ridge-type broad-area semiconductor laser device 560 according to embodiment 3 is provided with the ridge outer regions $I_a^o$ where current non-injection structures are formed by covering, with the SiN films 15, the exposed surfaces on which the p-type GaAs contact layer 14 and the p-type AlGaAs second cladding layer 13*b* have been removed by etching, so that current injected in the ridge-type broad-area semiconductor laser device 560 mainly flows in the ridge inner region $I_a^i$. Accordingly, gain differences arise among the modes, so that the gain in a low-order mode becomes higher than the gain in a high-order mode, and laser oscillation in a low-order mode can be performed, thus providing an effect of achieving a narrow horizontal beam divergence angle. Further, the ridge-type broad-area semiconductor laser device 560 has an asymmetric structure in which the refractive index of the n-type AlGaAs cladding layer 3 is higher than the refractive indices of the p-type AlGaAs first cladding layer 11*c* and the p-type AlGaAs second cladding layer 13*b*, thus also providing an effect that optical absorption by carriers on the side of the p-type AlGaAs first cladding layer 11*c* and the p-type AlGaAs second cladding layer 13*b* is reduced, so as to enhance slope efficiency.

Modification 1 of Embodiment 3

Figure 24:
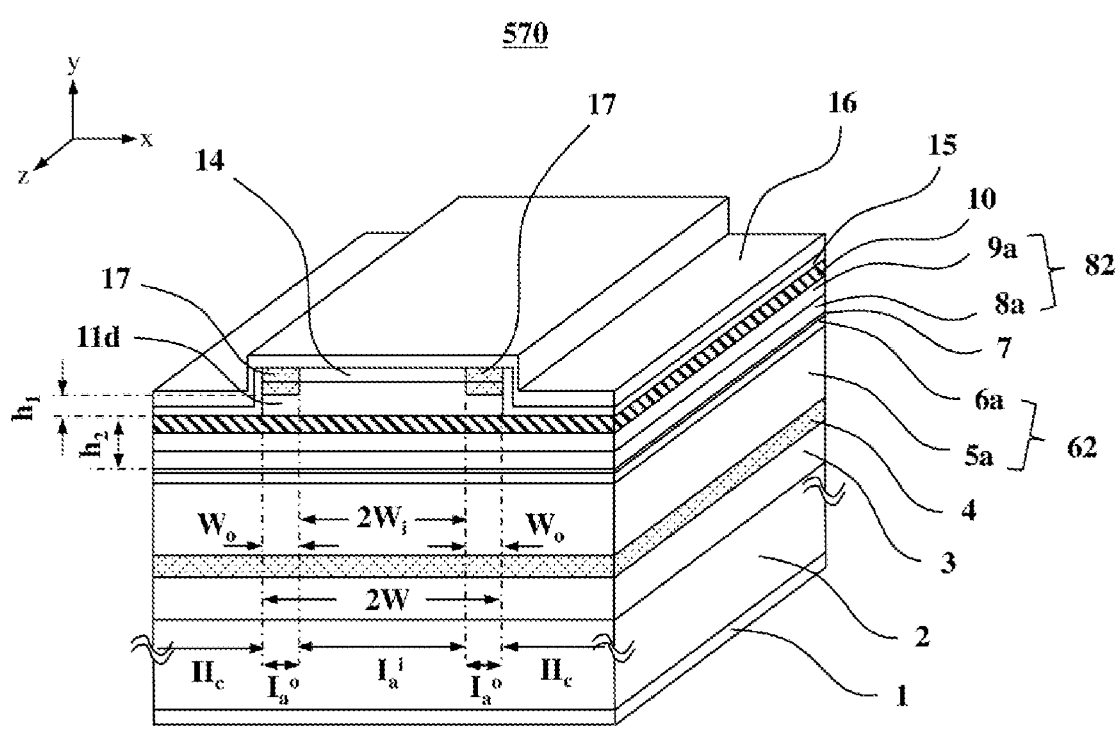
FIG. 24 is a perspective view showing a ridge-type broad-area semiconductor laser device in 975 nm modification 1 of embodiment 3.

FIG. 24 is a perspective view showing a ridge-type broad-area semiconductor laser device 570 in 975 nm band having a real refractive index distribution according to modification 1 of embodiment 3.

The ridge-type broad-area semiconductor laser device 570 shown in FIG. 24 has a p-type AlGaAs first cladding layer 11*d* (second-conductivity-type cladding layer) having an Al composition ratio of 0.25 and a layer thickness of 1.5 μm.

The difference from the ridge-type broad-area semiconductor laser device 560 shown in FIG. 21 is that the second ESL layer 12 is absent and the ridge outer regions $I_a^o$ are formed by imparting the semiconductor layers with insulation property through proton implantation, instead of removal by etching.

A manufacturing method for the ridge-type broad-area semiconductor laser device 570 is the same as in modification 1 of embodiment 1.

In the ridge-type broad-area semiconductor laser device 570, since the second ESL layer 12 is absent, the effective refractive index in the ridge region $I_a$ (ridge inner region $I_a^i$ and ridge outer regions $I_a^o$) becomes 3.41837. The effective refractive index in the cladding regions $II_c$ is the same 3.41827, and in a case where the ridge width 2 W is 100 μm, v in equation (1) is 8.42 and thus six modes from a zeroth order (fundamental mode) to a fifth order are allowed.

The effective refractive index in the ridge outer regions $I_a^o$ where protons are implanted is 3.41837 which is the same as that in the ridge inner region $I_a^i$. As an example, in a case where protons are implanted to a depth of 1.35 μm from the surface of the p-type GaAs contact layer 14, the distance $h_1$ from the upper end of the first ESL layer 10 to the lower end of the proton implanted region 17 is 0.35 μm.

If the distance $h_1$ from the upper end of the first ESL layer 10 to the current non-injection structure, i.e., the lower end of the proton implanted region 17, is not less than 0.34 μm, the effective refractive index in the ridge outer regions $I_a^o$ is substantially the same as the effective refractive index in the ridge inner region $I_a^i$. That is, since there is almost no light in a region above 0.34 μm of the distance $h_1$, there is no influence from scattering due to crystal breakage caused by proton implantation in the crystal layer and loss due to the scattering, and reduction in reliability due to crystal defect does not occur.

Figure 25:
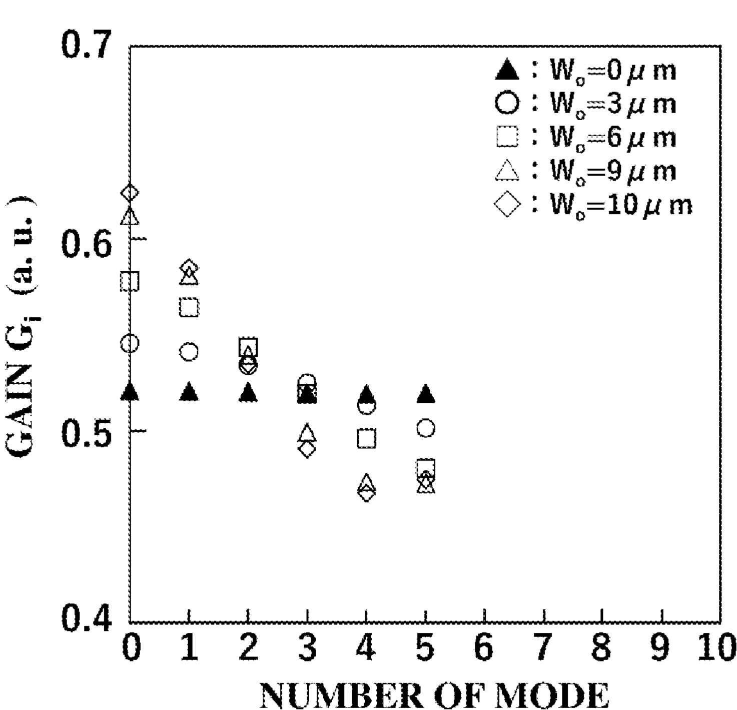
FIG. 25 shows the gain in each mode of the ridge-type broad-area semiconductor laser device according to modification 1 of embodiment 3.
Figure 26:
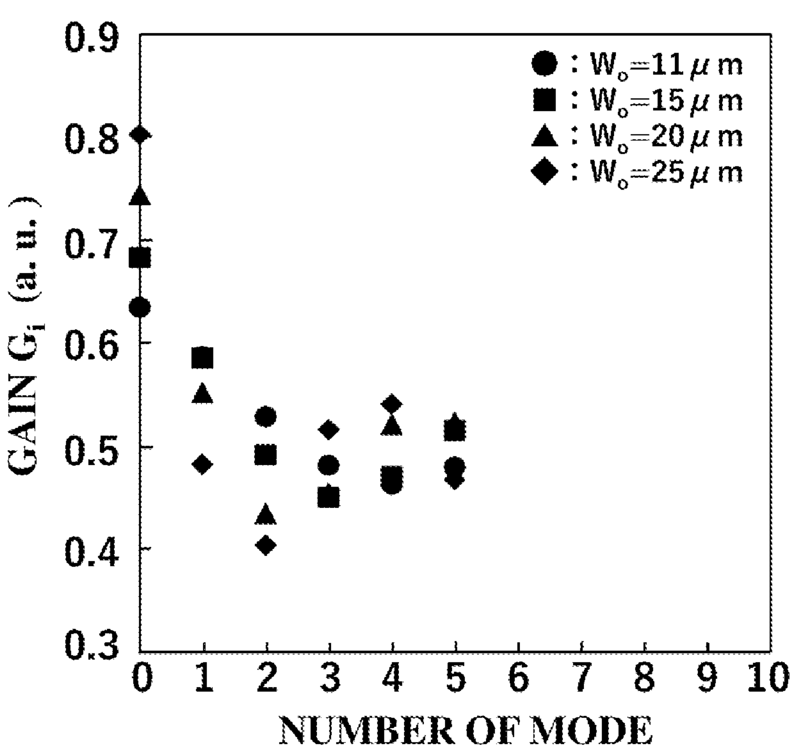
FIG. 26 shows the gain in each mode of the ridge-type broad-area semiconductor laser device according to modification 1 of embodiment 3.

FIG. 25 and FIG. 26 show the gain $G_i$ in each mode in cases where the ridge outer region width $W_o$ is 3, 6, 9, 10, 11, 15, 20, and 25 μm in the ridge-type broad-area semiconductor laser device 570. A case where the ridge outer region width $W_o$ is 0 μm (comparative example) is also shown together. In the case of the comparative example, there are almost no gain differences among the modes, and if any, the gain difference is less than 1%, and therefore laser oscillation can occur in any mode. Thus, the horizontal beam divergence angle varies depending on the mode in which laser oscillation occurs.

On the other hand, the ridge-type broad-area semiconductor laser device 570 is provided with the ridge outer regions $I_a^o$ where the proton implanted regions 17 serving as current non-injection structures are formed, so that current mainly flows in the ridge inner region $I_a^i$. Accordingly, gain differences arise among the modes, so that the gain in a low-order mode becomes higher than the gain in a high-order mode. Thus, laser oscillation in a low-order mode can be performed and a narrow horizontal beam divergence angle can be achieved.

The gains in low-order modes in the present disclosure, e.g., modes of zeroth to second orders in a case where the ridge outer region width $W_o$ is not greater than 10 μm, are higher than the gains in low-order modes in the comparative example. Therefore, laser oscillation is reached with a low gain, and a ridge-type broad-area semiconductor laser device in which laser oscillation occurs with lower threshold current than in the comparative example can be obtained.

In the ridge-type broad-area semiconductor laser device 570, even if the ridge outer region width $W_o$ is greater than 10 μm, the gain in a low-order mode is higher than in the comparative example and loss does not increase. In a case where the ridge outer region width $W_o$ is not less than 15 μm, there is a gain difference greater than 14% between the fundamental mode and all the other modes, and thus it becomes possible to substantially perform oscillation in the fundamental mode. In a case where the ridge outer region width $W_o$ is not less than 20 μm, such tendency becomes further outstanding.

It suffices that the ridge outer region width $W_o$ is greater than the distance $h_1+h_2$ (1.39 μm) and smaller than W (50 μm). It suffices that the distance $h_1$ from the upper end of the first ESL layer 10 to the lower end of the proton implanted region 17 is not less than 0.34 μm. However, in the ridge-type broad-area semiconductor laser device 570 according to modification 1 of embodiment 3, the distance $h_1$ is set to 0.35 μm and this setting is made in order that a damaged part of the semiconductor layer due to proton implantation is located farther from the optical intensity distribution, thereby achieving higher reliability.

In the present embodiment, the structure formed through ion implantation with protons has been shown as an example. However, without limitation thereto, any means that can increase the electric resistance of the semiconductor layer is applicable.

In the case of using proton implantation as means for imparting the semiconductor layers with insulation property, an etching process is not needed, thus providing an effect of decreasing the number of manufacturing steps and also facilitating the manufacturing of the ridge-type broad-area semiconductor laser device.

As described above, the ridge-type broad-area semiconductor laser device 570 according to modification 1 of embodiment 3 is provided with the ridge outer regions $I_a^o$ where the proton implanted regions 17 serving as current non-injection structures are formed, so that current injected in the ridge-type broad-area semiconductor laser device 570 mainly flows in the ridge inner region $I_a^i$. Accordingly, gain differences arise among the modes, so that the gain in a low-order mode becomes higher than the gain in a high-order mode, and laser oscillation in a low-order mode can be performed, thus providing an effect of achieving a narrow horizontal beam divergence angle. Further, the ridge-type broad-area semiconductor laser device 570 has an asymmetric structure in which the refractive index of the n-type AlGaAs cladding layer 3 is higher than the refractive index of the p-type AlGaAs first cladding layer 11*d*, thus also providing an effect that optical absorption by carriers on the side of the p-type AlGaAs first cladding layer 11*d* is reduced, so as to enhance slope efficiency.

Modification 2 of Embodiment 3

Figure 27:
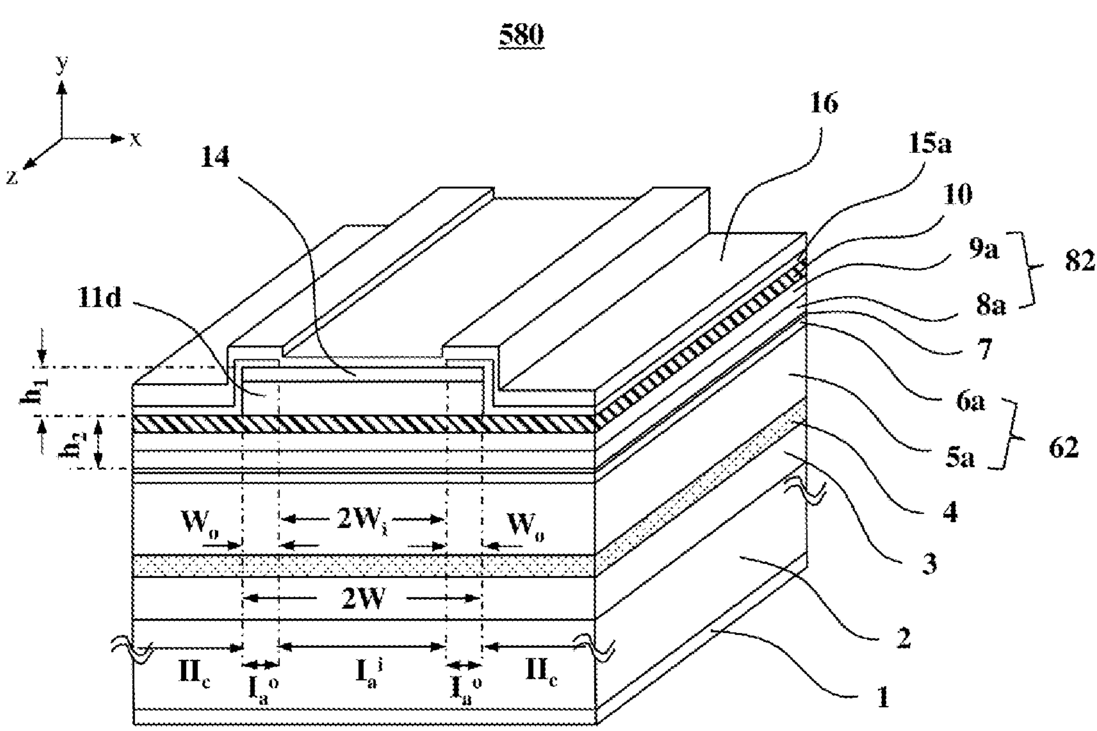
FIG. 27 is a perspective view showing a ridge-type broad-area semiconductor laser device in 975 nm band having a real refractive index distribution according to modification 2 of embodiment 3.

FIG. 27 is a perspective view showing a ridge-type broad-area semiconductor laser device 580 in 975 nm band having a real refractive index distribution according to modification 2 of embodiment 3.

The difference from the ridge-type broad-area semiconductor laser device 560 shown in FIG. 21 is that the second ESL layer 12 is absent and in the ridge outer regions $I_a^o$, the SiN films 15*a* are respectively provided on parts of the surface at both ends in the ridge width direction of the p-type GaAs contact layer 14, instead of removal by etching. The other layer configurations are the same as those in modification 1 of embodiment 3.

A manufacturing method for the ridge-type broad-area semiconductor laser device 580 is the same as in modification 2 of embodiment 1.

The effective refractive indices in the ridge inner region $I_a^i$, the ridge outer regions $I_a^o$, and the cladding regions $II_c$ in the ridge-type broad-area semiconductor laser device 580 are 3.41837, 3.41837, and 3.41827, respectively, and in a case where the ridge width 2 W is 100 μm, six modes from a zeroth order (fundamental mode) to a fifth order are allowed. Since current spreads from an upper part of the p-type GaAs contact layer 14, the distance $h_1$ is 1.7 μm.

Figure 28:
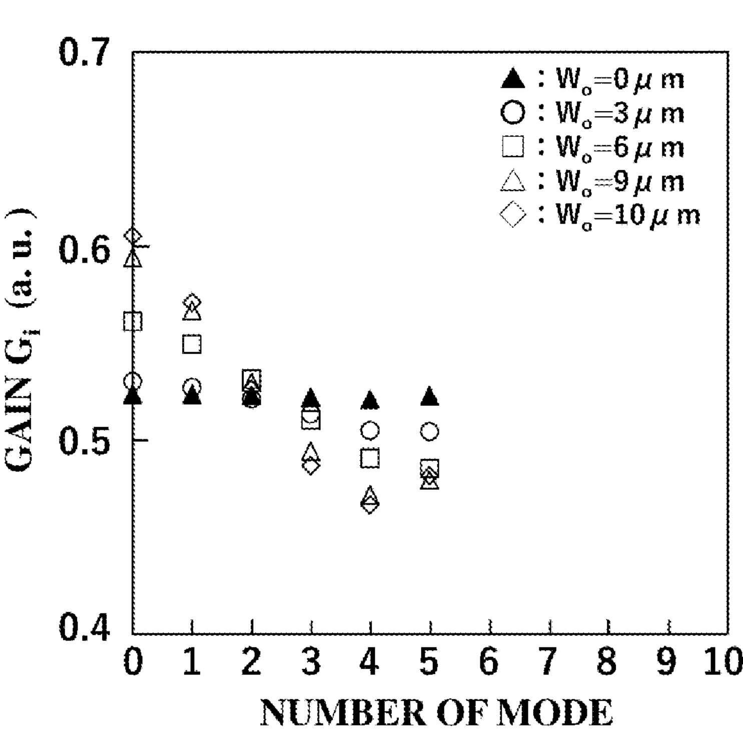
FIG. 28 shows the gain in each mode of the ridge-type broad-area semiconductor laser device according to modification 2 of embodiment 3.
Figure 29:
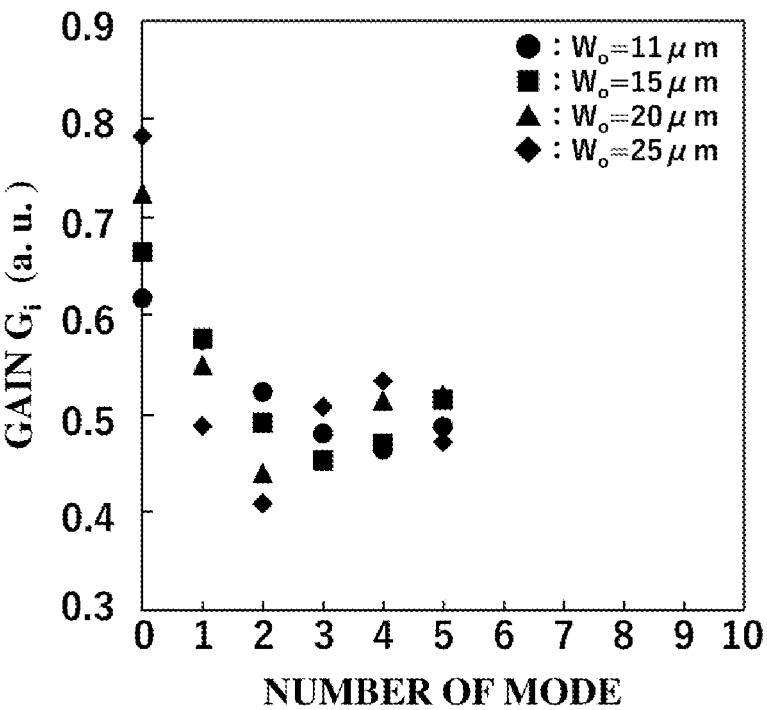
FIG. 29 shows the gain in each mode of the ridge-type broad-area semiconductor laser device according to modification 2 of embodiment 3.

FIG. 28 and FIG. 29 show the gain $G_i$ in each mode in cases where the ridge outer region width $W_o$ is 3, 6, 9, 10, 11, 15, 20, and 25 μm in the ridge-type broad-area semiconductor laser device 580. A case where the ridge outer region width $W_o$ is 0 μm (comparative example) is also shown together. In the case of the comparative example, there are almost no gain differences among the modes, and if any, the gain difference is less than 1%, and therefore laser oscillation can occur in any mode. Thus, the horizontal beam divergence angle varies depending on the mode in which laser oscillation occurs.

On the other hand, the ridge-type broad-area semiconductor laser device 580 is provided with the ridge outer regions $I_a^o$ having current non-injection structures in which parts of the surface at both ends in the ridge width direction of the p-type GaAs contact layer 14 are respectively covered with the SiN films 15*a*. Accordingly, gain differences arise among the modes, so that the gain in a low-order mode becomes higher than the gain in a high-order mode. Thus, laser oscillation in a low-order mode can be performed and a narrow horizontal beam divergence angle can be achieved.

The gains in low-order modes in the present disclosure, e.g., modes of zeroth to second orders in a case where the ridge outer region width $W_o$ is not greater than 10 μm, are higher than the gains in low-order modes in the comparative example. Therefore, laser oscillation is reached with a low gain, and a ridge-type broad-area semiconductor laser device in which laser oscillation occurs with lower threshold current than in the comparative example can be obtained.

In the ridge-type broad-area semiconductor laser device 580, even if the ridge outer region width $W_o$ is greater than 10 μm, the gain in a low-order mode is higher than in the comparative example and loss does not increase. In a case where the ridge outer region width $W_o$ is not less than 15 μm, there is a gain difference greater than 13% between the fundamental mode and all the other modes, and thus it becomes possible to substantially perform oscillation in the fundamental mode. In a case where the ridge outer region width $W_o$ is not less than 20 μm, such tendency becomes further outstanding.

It suffices that the ridge outer region width $W_o$ is greater than the distance $h_1+h_2$ (2.74 μm) and smaller than W (50 μm). In the present embodiment, since the current non-injection structures in the ridge outer regions $I_a^o$ are formed by the SiN films 15*a* which are insulation films, the distance from the p-type GaAs contact layer 14 to the InGaAs quantum well active layer 7 through which current begins to spread in the x direction, i.e., the ridge width direction, increases to be 2.74 μm, and therefore gain differences are hardly obtained in a case where the ridge outer region width $W_o$ is small. However, since the effect increases if the ridge outer region width $W_o$ is increased, no particular problems arise. Although SiN is used as the insulation film, another material such as $SiO_2$ may be used.

In addition, since processes such as etching or proton implantation are not performed, manufacturing of the ridge-type broad-area semiconductor laser device is significantly facilitated.

As described above, the ridge-type broad-area semiconductor laser device 580 according to modification 2 of embodiment 3 is provided with the ridge outer regions $I_a^o$ having current non-injection structures in which parts of the surface at both ends in the ridge width direction of the p-type GaAs contact layer 14 are respectively covered with the SiN films 15*a*, so that current injected in the ridge-type broad-area semiconductor laser device 580 mainly flows in the ridge inner region $I_a^i$. Accordingly, the gain in a low-order mode becomes higher than the gain in a high-order mode, and laser oscillation in a low-order mode can be performed, thus providing an effect of narrowing the horizontal beam divergence angle. Further, the ridge-type broad-area semiconductor laser device 580 has an asymmetric structure in which the refractive index of the n-type AlGaAs cladding layer 3 is higher than the refractive index of the p-type AlGaAs first cladding layer 11*d*, thus also providing an effect that optical absorption by carriers on the side of the p-type AlGaAs first cladding layer 11*d* is reduced, so as to enhance slope efficiency.

Embodiment 4

Figure 30:
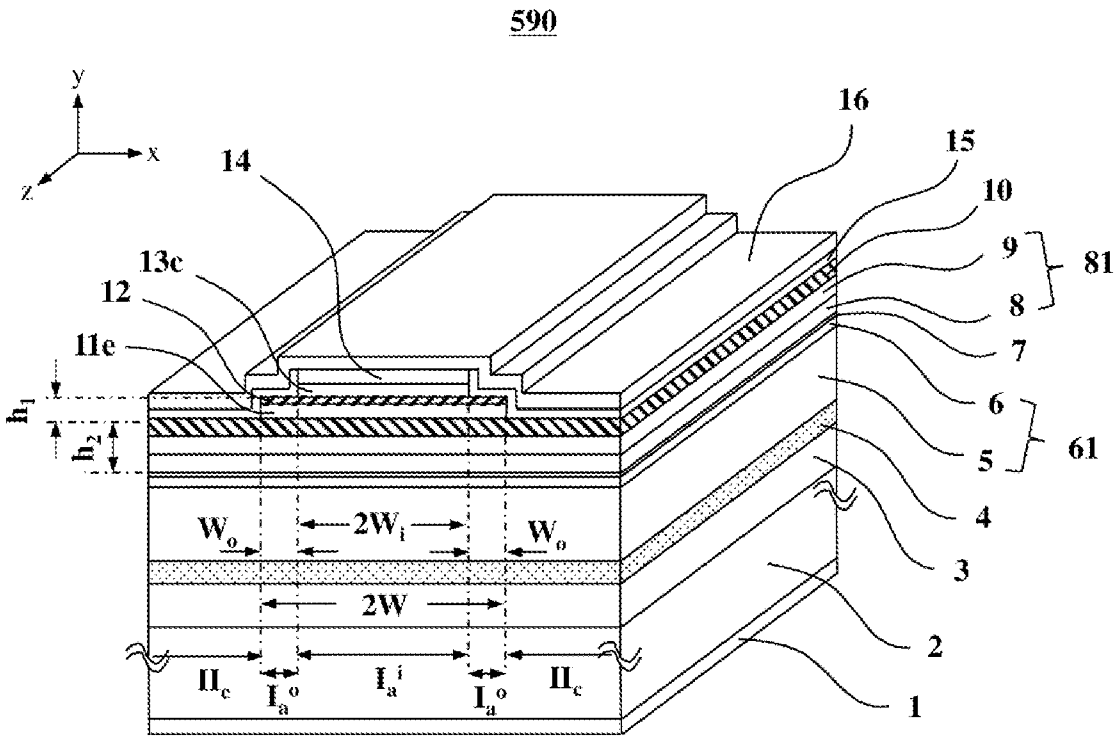
FIG. 30 is a perspective view showing a ridge-type broad-area semiconductor laser device in 975 nm band having a real refractive index distribution according to embodiment 4.

FIG. 30 is a perspective view showing a ridge-type broad-area semiconductor laser device 590 in 975 nm band having a real refractive index distribution according to embodiment 4.

The ridge-type broad-area semiconductor laser device 590 according to embodiment 4 has an asymmetric structure in which the refractive index of the n-type AlGaAs cladding layer 3 is higher than the refractive indices of a p-type AlGaAs first cladding layer 11*e* (second-conductivity-type first cladding layer) and a p-type AlGaAs second cladding layer 13*c* (second-conductivity-type second cladding layer), whereby optical absorption by carriers in the p-type AlGaAs first cladding layer 11*e* and the p-type AlGaAs second cladding layer 13*c* is reduced, and in addition, the position of the InGaAs quantum well active layer 7 is displaced from the center of the optical guide layers 61, 81 toward the side of the p-type AlGaAs first cladding layer 11*e* and the p-type AlGaAs second cladding layer 13*c*, whereby optical absorption by carriers staying in the optical guide layers during operation is also reduced, so as to enhance slope efficiency.

The ridge-type broad-area semiconductor laser device 590 shown in FIG. 30 has the p-type AlGaAs first cladding layer 11*e* having an Al composition ratio of 0.25 and a layer thickness of 0.35 μm, and the p-type AlGaAs second cladding layer 13*c* having an Al composition ratio of 0.25 and a layer thickness of 1.15 μm. The other layer configurations are the same as those of the ridge-type broad-area semiconductor laser device 500 shown in FIG. 3 in embodiment 1.

A manufacturing method for the ridge-type broad-area semiconductor laser device 590 is the same as in embodiment 1.

A total optical guide layer thickness which is the sum of the thicknesses of the p-side optical guide layer 81 and the n-side optical guide layer 61 in the ridge-type broad-area semiconductor laser device 590 is as great as 1.8 μm, and a mode of a first order or higher is allowed in the lamination direction. In addition, $u_n$ is 0.292273 and $u_p$ is 0.480463, thus satisfying $u_p > u_n$. Therefore, the optical intensity distribution in the y direction is displaced toward the n-type GaAs substrate 2 side, whereby the number of allowed modes in the x direction can be decreased.

In the case where the ridge outer region width $W_o$ is zero, the effective refractive indices in the ridge region $I_a$ (ridge inner region $I_a^i$ and ridge outer regions $I_a^o$) and the cladding regions $II_c$ are 3.41692 and 3.41672, respectively. In a case where the ridge width 2 W is 100 μm, v is 11.91 and thus eight modes from a zeroth order (fundamental mode) to a seventh order are allowed.

In the case where removal has been performed by etching in each ridge outer region $I_a^o$ until reaching the second ESL layer 12, the effective refractive index at this part is 3.41692, and thus the refractive index in the ridge region $I_a$ (ridge inner region $I_a^i$ and ridge outer regions $I_a^o$) is the same irrespective of removal by etching. Therefore, the number of allowed modes is the same.

Meanwhile, current begins to spread also in the x direction, i.e., the ridge width direction, from the upper end of the second ESL layer 12. That is, current spreads in the x direction through the distance $h_2$ (0.74 μm) from the upper end of the InGaAs quantum well active layer 7 to the upper end of the first ESL layer 10 and the distance $h_1$ (0.39 μm) from the upper end of the second ESL layer 12 to the upper end of the first ESL layer 10, thus reaching the InGaAs quantum well active layer 7.

Figure 31:
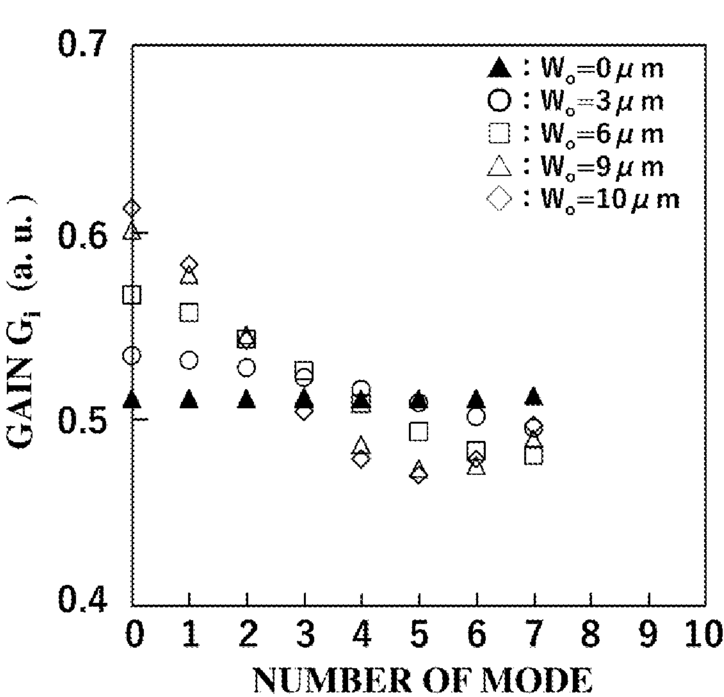
FIG. 31 shows the gain in each mode of the ridge-type broad-area semiconductor laser device according to embodiment 4.
Figure 32:
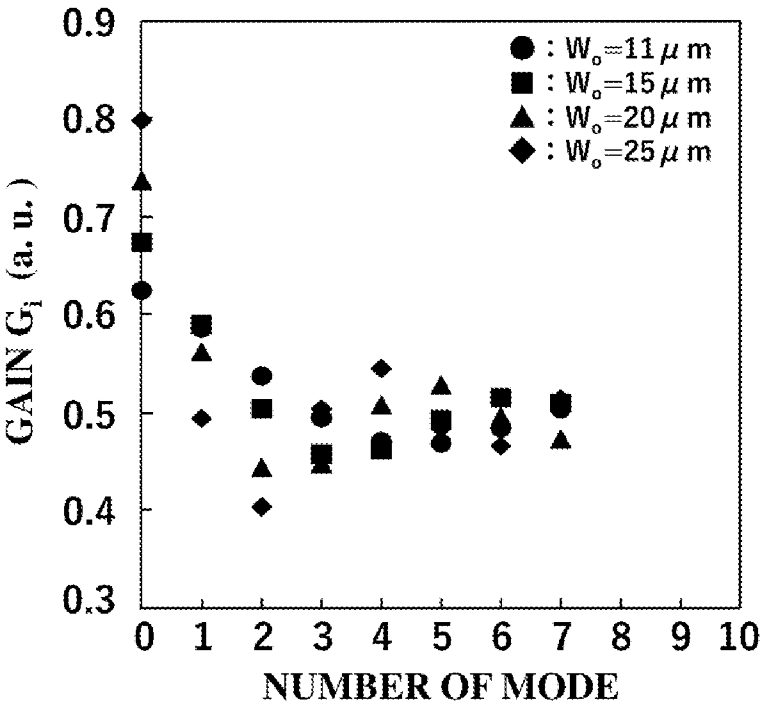
FIG. 32 shows the gain in each mode of the ridge-type broad-area semiconductor laser device according to embodiment 4.

FIG. 31 and FIG. 32 show the gain $G_i$ in each mode in cases where the ridge outer region width $W_o$ is 3, 6, 9, 10, 11, 15, 20, and 25 μm in the ridge-type broad-area semiconductor laser device 590. A case where the ridge outer region width $W_o$ is 0 μm (comparative example) is also shown together. In the case of the comparative example, there are almost no gain differences among the modes, and if any, the gain difference is less than 1%, and therefore laser oscillation can occur in any mode. Thus, the horizontal beam divergence angle varies depending on the mode in which laser oscillation occurs.

On the other hand, the ridge-type broad-area semiconductor laser device 590 is provided with the ridge outer regions $I_a^o$ where current non-injection structures are formed by covering, with the SiN films 15 which are insulation films, the exposed surfaces on which the p-type GaAs contact layer 14 and the p-type AlGaAs second cladding layer 13*c* have been removed by etching. Accordingly, gain differences arise among the modes, so that the gain in a low-order mode becomes higher than the gain in a high-order mode. Thus, laser oscillation in a low-order mode can be performed and a narrow horizontal beam divergence angle can be achieved.

The gains in low-order modes in the present disclosure, e.g., modes of zeroth to third orders in a case where the ridge outer region width $W_o$ is not greater than 10 μm, are higher than the gains in low-order modes in the comparative example. Therefore, laser oscillation is reached with a low gain, and a ridge-type broad-area semiconductor laser device in which laser oscillation occurs with lower threshold current than in the comparative example can be obtained.

In the ridge-type broad-area semiconductor laser device 590, even if the ridge outer region width $W_o$ is greater than 10 μm, the gain in a low-order mode is higher than in the comparative example and loss does not increase. In a case where the ridge outer region width $W_o$ is not less than 15 μm, there is a gain difference greater than 12% between the fundamental mode and all the other modes, and thus it becomes possible to substantially perform oscillation in the fundamental mode. In a case where the ridge outer region width $W_o$ is not less than 20 μm, such tendency becomes further outstanding.

Since current isotropically spreads, it suffices that the ridge outer region width $W_o$ is greater than the distance $h_1+h_2$ (1.13 μm) and smaller than W (50 μm).

As described above, the ridge-type broad-area semiconductor laser device 590 according to embodiment 4 is provided with current non-injection structures by covering, with the SiN films 15, the exposed surfaces on which the p-type GaAs contact layer 14 and the p-type AlGaAs second cladding layer 13*c* have been removed by etching in the ridge outer regions $I_a^o$, so that current injected in the ridge-type broad-area semiconductor laser device 590 mainly flows in the ridge inner region $I_a^i$. Accordingly, the gain in a low-order mode becomes higher than the gain in a high-order mode, and laser oscillation in a low-order mode can be performed, thus providing an effect of narrowing the horizontal beam divergence angle. Further, the ridge-type broad-area semiconductor laser device 590 has an asymmetric structure in which the refractive index of the n-type AlGaAs cladding layer 3 is higher than the refractive indices of the p-type AlGaAs first cladding layer 11*e* and the p-type AlGaAs second cladding layer 13*c*, thus also providing an effect that optical absorption by carriers on the side of the p-type AlGaAs first cladding layer 11*e* and the p-type AlGaAs second cladding layer 13*c* is reduced, so as to enhance slope efficiency.

Modification 1 of Embodiment 4

Figure 33:
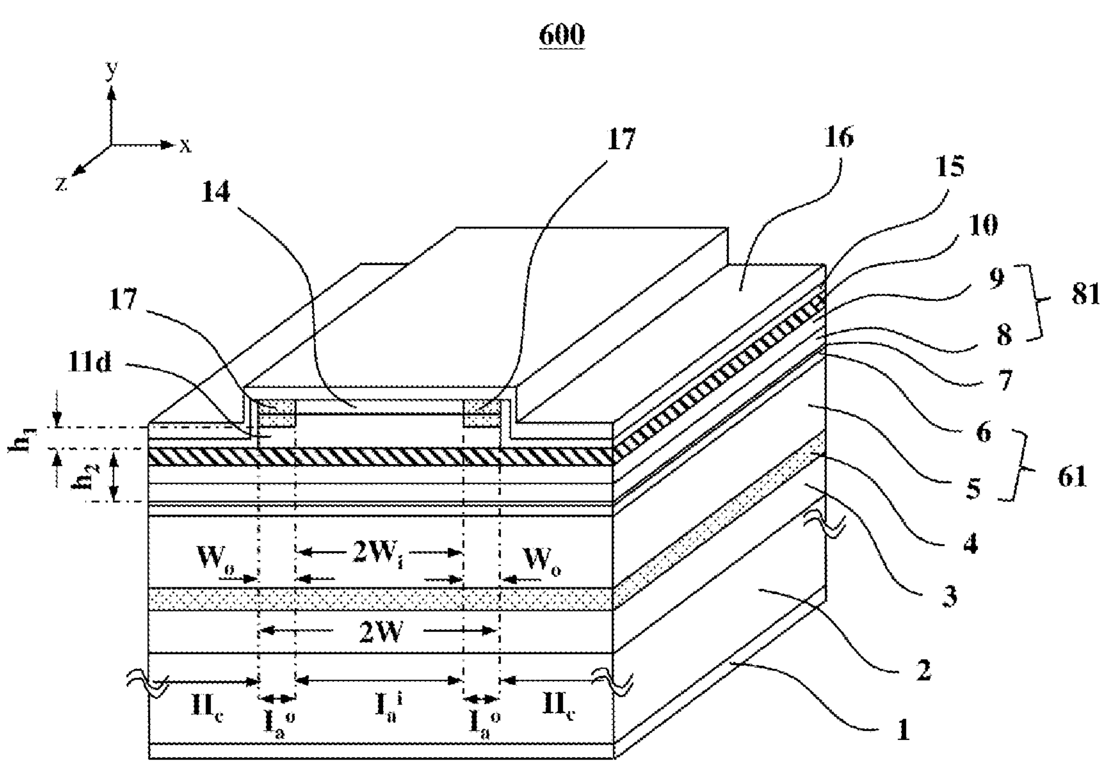
FIG. 33 is a perspective view showing a ridge-type broad-area semiconductor laser device in 975 nm band having a real refractive index distribution according to modification 1 of embodiment 4.

FIG. 33 is a perspective view showing a ridge-type broad-area semiconductor laser device 600 in 975 nm band having a real refractive index distribution according to modification 1 of embodiment 4.

The difference from the ridge-type broad-area semiconductor laser device 590 according to embodiment 4 shown in FIG. 30 is that the second ESL layer 12 is absent and the ridge outer regions $I_a^o$ are formed by imparting the semiconductor layers with insulation property through proton implantation, instead of removal by etching.

A manufacturing method for the ridge-type broad-area semiconductor laser device 600 is the same as in modification 1 of embodiment 1.

In the ridge-type broad-area semiconductor laser device 600, since the second ESL layer 12 is absent, the effective refractive index in the ridge region $I_a$ (ridge inner region $I_a^i$ and ridge outer regions $I_a^o$) becomes 3.41693. The effective refractive index in the cladding regions $II_c$ is the same 3.41672, and in a case where the ridge width 2 W is 100 μm, v in equation (1) is 12.20 and thus eight modes from a zeroth order (fundamental mode) to a seventh order are allowed.

The effective refractive index in the ridge outer regions $I_a^o$ where protons are implanted is 3.41693 which is the same as that in the ridge inner region $I_a^i$. As an example, in a case where protons are implanted to a depth of 0.25 μm from the surface of the p-type GaAs contact layer 14, the distance $h_1$ from the upper end of the first ESL layer 10 to the lower end of the proton implanted region 17 is 1.45 μm.

If the distance $h_1$ from the upper end of the first ESL layer 10 to the current non-injection structure, i.e., the lower end of the proton implanted region 17, is not less than 0.39 μm, the effective refractive index in the ridge outer regions $I_a^o$ is substantially the same as the effective refractive index in the ridge inner region $I_a^i$. That is, since there is almost no light in a region above 0.39 μm of the distance $h_1$, there is no influence from scattering due to crystal breakage caused by proton implantation in the crystal layer and loss due to the scattering, and reduction in reliability due to crystal defect does not occur.

Figure 34:
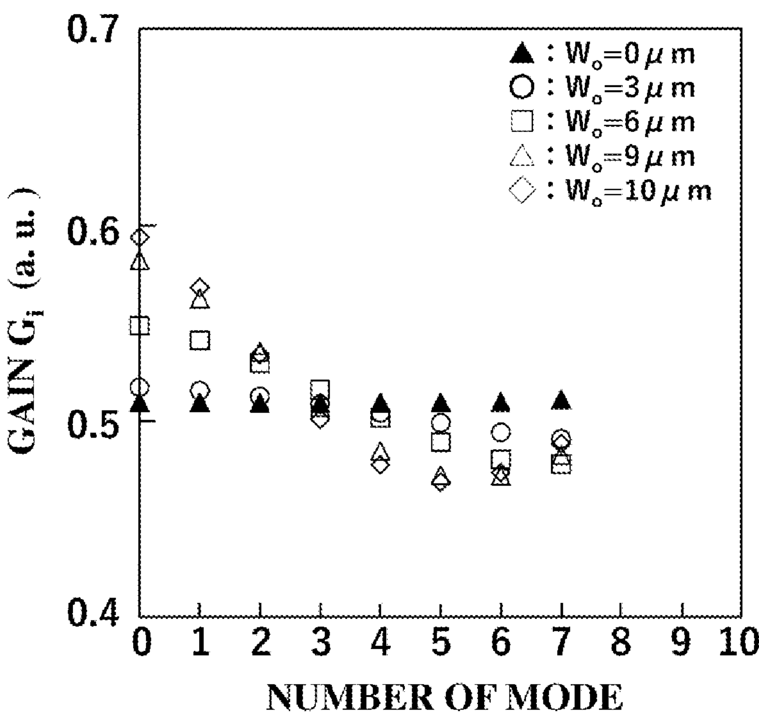
FIG. 34 shows the gain in each mode of the ridge-type broad-area semiconductor laser device according to modification 1 of embodiment 4.
Figure 35:
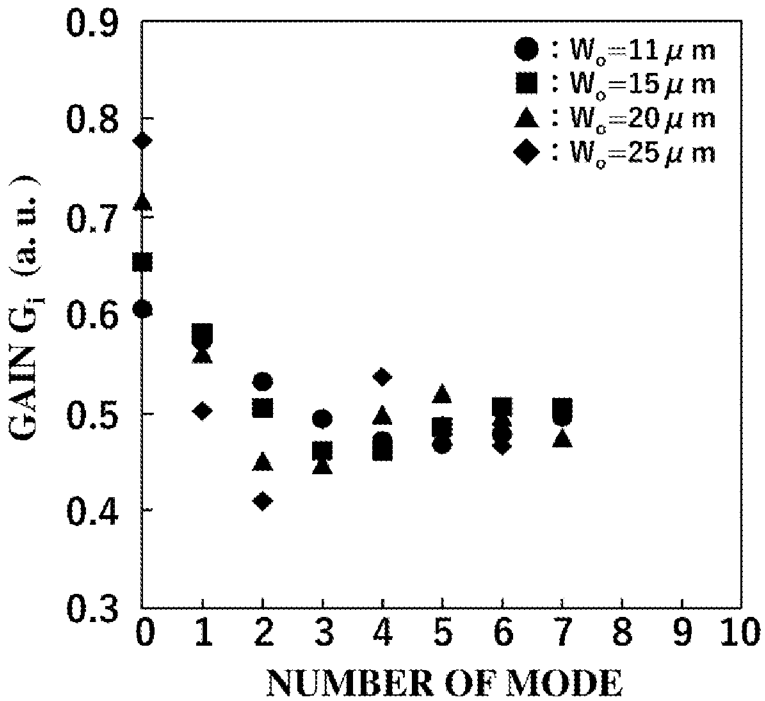
FIG. 35 shows the gain in each mode of the ridge-type broad-area semiconductor laser device according to modification 1 of embodiment 4.

FIG. 34 and FIG. 35 show the gain $G_i$ in each mode in cases where the ridge outer region width $W_o$ is 3, 6, 9, 10, 11, 15, 20, and 25 μm in the ridge-type broad-area semiconductor laser device 600. A case where the ridge outer region width $W_o$ is 0 μm (comparative example) is also shown together. In the case of the comparative example, there are almost no gain differences among the modes, and if any, the gain difference is less than 1%, and therefore laser oscillation can occur in any mode. Thus, the horizontal beam divergence angle varies depending on the mode in which laser oscillation occurs.

On the other hand, the ridge-type broad-area semiconductor laser device 600 is provided with the ridge outer regions $I_a^o$ where the proton implanted regions 17 serving as current non-injection structures are formed, so that current mainly flows in the ridge inner region $I_a^i$. Accordingly, gain differences arise among the modes, so that the gain in a low-order mode becomes higher than the gain in a high-order mode. Thus, laser oscillation in a low-order mode can be performed and a narrow horizontal beam divergence angle can be achieved.

The gains in low-order modes in the present disclosure, e.g., modes of zeroth to second orders in a case where the ridge outer region width $W_o$ is not greater than 10 μm, are higher than the gains in low-order modes in the comparative example. Therefore, laser oscillation is reached with a low gain, and a ridge-type broad-area semiconductor laser device in which laser oscillation occurs with lower threshold current than in the comparative example can be obtained.

In the ridge-type broad-area semiconductor laser device 600, even if the ridge outer region width $W_o$ is greater than 10 μm, the gain in a low-order mode is higher than in the comparative example and loss does not increase. In a case where the ridge outer region width $W_o$ is not less than 15 μm, there is a gain difference greater than 11% between the fundamental mode and all the other modes, and thus it becomes possible to substantially perform oscillation in the fundamental mode. In a case where the ridge outer region width $W_o$ is not less than 20 μm, such tendency becomes further outstanding.

It suffices that the ridge outer region width $W_o$ is greater than the distance $h_1+h_2$ (2.19 μm) and smaller than W (50 μm). It suffices that the distance $h_1$ from the upper end of the first ESL layer 10 to the lower end of the proton implanted region 17 is not less than 0.39 μm. However, in the ridge-type broad-area semiconductor laser device 600 according to modification 1 of embodiment 4, the distance $h_1$ is set to 1.45 μm and this setting is made in order that a damaged part of the semiconductor layer due to proton implantation is located farther from the optical intensity distribution, thereby achieving higher reliability.

In the present embodiment, the structure formed through ion implantation with protons has been shown as an example. However, without limitation thereto, any means that can increase the electric resistance of the semiconductor layer is applicable.

In the case of using proton implantation as means for imparting the semiconductor layers with insulation property, an etching process is not needed, thus providing an effect of decreasing the number of manufacturing steps and also facilitating the manufacturing of the ridge-type broad-area semiconductor laser device.

As described above, the ridge-type broad-area semiconductor laser device 600 according to modification 1 of embodiment 4 is provided with the ridge outer regions $I_a^o$ where the proton implanted regions 17 serving as current non-injection structures are formed, so that current injected in the ridge-type broad-area semiconductor laser device 600 mainly flows in the ridge inner region $I_a^i$. Accordingly, the gain in a low-order mode becomes higher than the gain in a high-order mode, and laser oscillation in a low-order mode can be performed, thus providing an effect of narrowing the horizontal beam divergence angle. Further, the ridge-type broad-area semiconductor laser device 600 has an asymmetric structure in which the refractive index of the n-type AlGaAs cladding layer 3 is higher than the refractive index of the p-type AlGaAs first cladding layer 11*d*, thus also providing an effect that optical absorption by carriers on the side of the p-type AlGaAs first cladding layer 11*d* is reduced, so as to enhance slope efficiency.

Modification 2 of Embodiment 4

Figure 36:
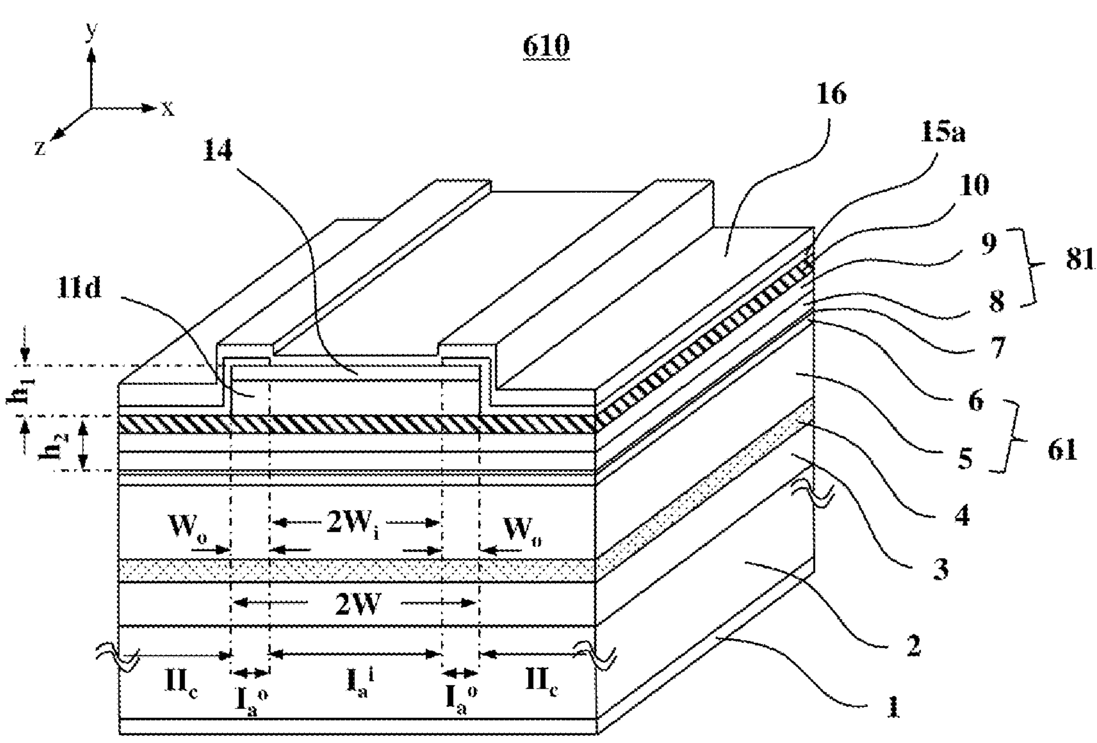
FIG. 36 is a perspective view showing a ridge-type broad-area semiconductor laser device in 975 nm band having a real refractive index distribution according to modification 2 of embodiment 4.

FIG. 36 is a perspective view showing a ridge-type broad-area semiconductor laser device 610 in 975 nm band having a real refractive index distribution according to modification 2 of embodiment 4.

The difference from the ridge-type broad-area semiconductor laser device 590 according to embodiment 4 shown in FIG. 30 is that the second ESL layer 12 is absent and in the ridge outer regions $I_a^o$, the SiN films 15*a* are respectively provided on parts of the surface at both ends in the ridge width direction of the p-type GaAs contact layer 14, instead of removal by etching.

A manufacturing method for the ridge-type broad-area semiconductor laser device 610 is the same as in modification 2 of embodiment 1.

The effective refractive indices in the ridge inner region $I_a^i$, the ridge outer regions $I_a^o$, and the cladding regions $II_c$ in the ridge-type broad-area semiconductor laser device 610 are 3.41693, 3.41693, and 3.41672, respectively, and in a case where the ridge width 2 W is 100 μm, eight modes from a zeroth order (fundamental mode) to a seventh order are allowed. Since current spreads from an upper part of the p-type GaAs contact layer 14, the distance $h_1$ is 1.7 μm.

Figure 37:
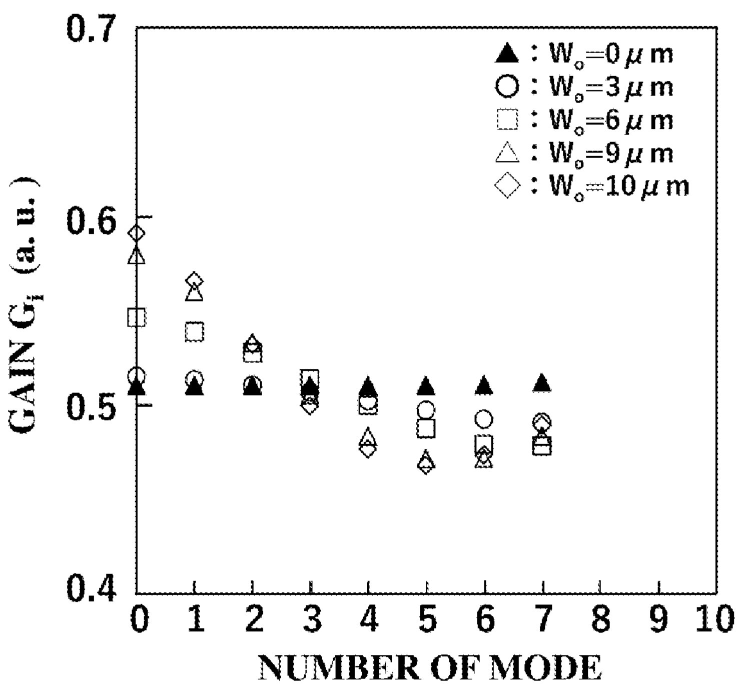
FIG. 37 shows the gain in each mode of the ridge-type broad-area semiconductor laser device according to modification 2 of embodiment 4.
Figure 38:
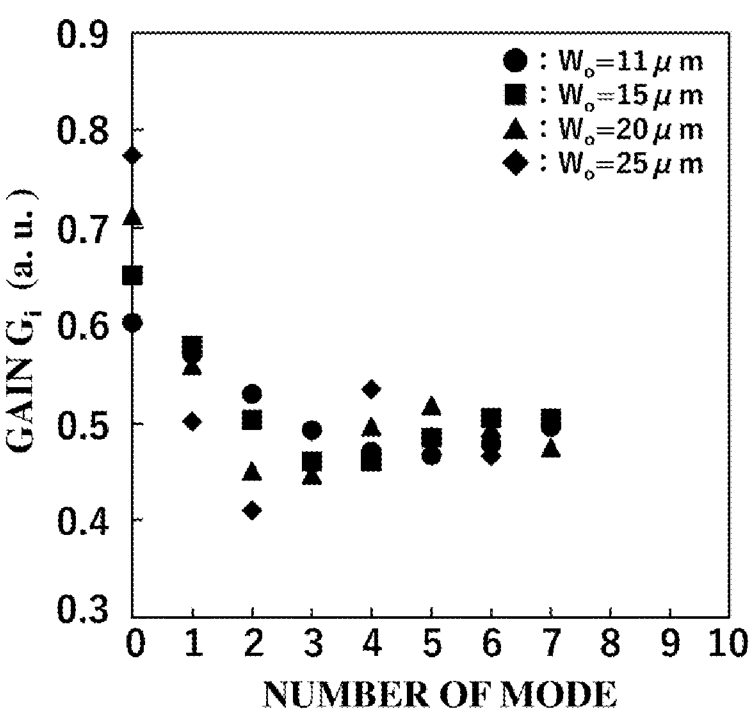
FIG. 38 shows the gain in each mode of the ridge-type broad-area semiconductor laser device according to modification 2 of embodiment 4.

FIG. 37 and FIG. 38 show the gain $G_i$ in each mode in cases where the ridge outer region width $W_o$ is 3, 6, 9, 10, 11, 15, 20, and 25 μm in the ridge-type broad-area semiconductor laser device 610. A case where the ridge outer region width $W_o$ is 0 μm (comparative example) is also shown together. In the case of the comparative example, there are almost no gain differences among the modes, and if any, the gain difference is less than 1%, and therefore laser oscillation can occur in any mode. Thus, the horizontal beam divergence angle varies depending on the mode in which laser oscillation occurs.

With the ridge outer regions $I_a^o$ provided, gain differences arise among the modes, so that the gain in a low-order mode becomes higher than the gain in a high-order mode. Thus, laser oscillation in a low-order mode can be performed and a narrow horizontal beam divergence angle can be achieved.

The gains in low-order modes in the present disclosure, e.g., modes of zeroth to second orders in a case where the ridge outer region width $W_o$ is not greater than 10 μm, are higher than the gains in low-order modes in the comparative example. Therefore, laser oscillation is reached with a low gain, and a ridge-type broad-area semiconductor laser device in which laser oscillation occurs with lower threshold current than in the comparative example can be obtained.

In the ridge-type broad-area semiconductor laser device 610, even if the ridge outer region width $W_o$ is greater than 10 μm, the gain in a low-order mode is higher than in the comparative example and loss does not increase. In a case where the ridge outer region width $W_o$ is not less than 15 μm, there is a gain difference greater than 11% between the fundamental mode and all the other modes, and thus it becomes possible to substantially perform oscillation in the fundamental mode. In a case where the ridge outer region width $W_o$ is not less than 20 μm, such tendency becomes further outstanding.

It suffices that the ridge outer region width $W_o$ is greater than the distance $h_1+h_2$ (2.44 μm) and smaller than W (50 μm). In the present embodiment, since the current non-injection structures in the ridge outer regions $I_a^o$ are formed by the SiN films 15*a* which are insulation films, the distance from the p-type GaAs contact layer 14 to the InGaAs quantum well active layer 7 through which current begins to spread in the x direction, i.e., the ridge width direction, increases to be 2.44 μm, and therefore gain differences are hardly obtained in a case where the ridge outer region width $W_o$ is small. However, since the effect increases if the ridge outer region width $W_o$ is increased, no particular problems arise. Although SiN is used as the insulation film, another material such as $SiO_2$ may be used.

Since processes such as etching or proton implantation are not performed, manufacturing of the ridge-type broad-area semiconductor laser device is significantly facilitated.

As described above, the ridge-type broad-area semiconductor laser device 610 according to modification 2 of embodiment 4 is provided with the ridge outer regions $I_a^o$ having current non-injection structures in which parts of the surface at both ends in the ridge width direction of the p-type GaAs contact layer 14 are respectively covered with the SiN films 15*a*, so that current injected in the ridge-type broad-area semiconductor laser device 610 mainly flows in the ridge inner region $I_a^i$. Accordingly, the gain in a low-order mode becomes higher than the gain in a high-order mode, and laser oscillation in a low-order mode can be performed, thus providing an effect of narrowing the horizontal beam divergence angle. Further, the ridge-type broad-area semiconductor laser device 610 has an asymmetric structure in which the refractive index of the n-type AlGaAs cladding layer 3 is higher than the refractive index of the p-type AlGaAs first cladding layer 11*d*, thus also providing an effect that optical absorption by carriers on the side of the p-type AlGaAs first cladding layer 11*d* is reduced, so as to enhance slope efficiency.

Embodiment 5

Figure 39:
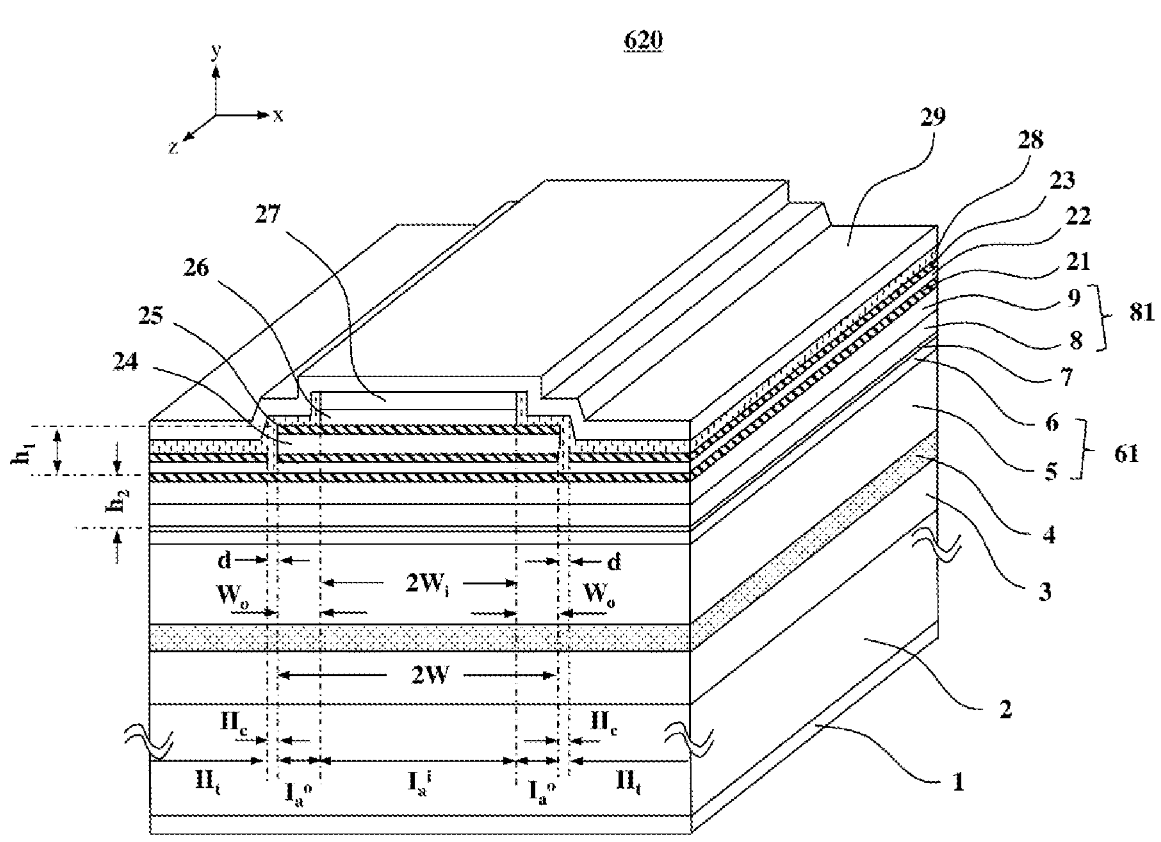
FIG. 39 is a perspective view showing a ridge-type broad-area semiconductor laser device in 975 nm embodiment 5.

FIG. 39 is a perspective view showing a ridge-type broad-area semiconductor laser device 620 in 975 nm band having a real refractive index distribution according to embodiment 5.

The ridge-type broad-area semiconductor laser device 620 shown in FIG. 39 has a p-type AlGaAs first ESL layer 21 (may be referred to as p-type AlGaAs low-refractive-index layer or second-conductivity-type low-refractive-index layer) having an Al composition ratio of 0.55 and a layer thickness of 40 nm, a p-type AlGaAs first cladding layer 22 having an Al composition ratio of 0.20 and a layer thickness of 0.10 μm, a p-type AlGaAs second ESL layer 23 having an Al composition ratio of 0.55 and a layer thickness of 40 nm, a p-type AlGaAs second cladding layer 24 having an Al composition ratio of 0.20 and a layer thickness of 0.75 μm, a p-type AlGaAs third ESL layer 25 having an Al composition ratio of 0.55 and a layer thickness of 40 nm, a p-type AlGaAs third cladding layer 26 (second-conductivity-type second cladding layer) having an Al composition ratio of 0.20 and a layer thickness of 0.65 μm, a p-type GaAs contact layer 27 having a layer thickness of 0.2 μm, SiN films 28 having a film thickness of 0.4 μm, and a p-type electrode 29.

The other layer configurations are the same as those of the ridge-type broad-area semiconductor laser device 500 shown in FIG. 3 in embodiment 1.

The p-type AlGaAs first cladding layer 22 and the p-type AlGaAs second cladding layer 24 are collectively referred to as second-conductivity-type first cladding layer.

A manufacturing method for the ridge-type broad-area semiconductor laser device 620 will be described below.

Above the n-type GaAs substrate 2, the semiconductor layers from the n-type AlGaAs cladding layer 3 to the p-type GaAs contact layer 27 are sequentially crystal-grown by a crystal growth method such as metal organic chemical vapor deposition (MOCVD).

Next, with the ridge inner region $I_a^i$ coated with a resist, dry etching is performed until reaching the third ESL layer 25, and the resist is removed.

Subsequently, with the ridge inner region $I_a^i$ and the ridge outer regions $I_a^o$ coated with a resist, dry etching is performed until reaching the second ESL layer 23, and the resist is removed.

Further, with the ridge inner region $I_a^i$, the ridge outer regions $I_a^o$, and terrace regions $II_t$ coated with resists, dry etching is performed until reaching the first ESL layer 21, and the resists are removed.

Subsequently, with the ridge inner region $I_a^i$ coated with a resist, the SiN films 28 are formed, lift-off is performed, and the resist is removed.

Finally, the p-type electrode 16 and the n-type electrode 1 are formed on the upper surface side and the lower surface side, respectively.

In the ridge-type broad-area semiconductor laser device 620, the terrace regions $II_t$ are provided on both sides of the ridge outer regions $I_a^o$ while the cladding regions $II_c$ having the width d (e.g., 2 μm) are interposed therebetween. The effective refractive index in the terrace regions $II_t$ is smaller than the effective refractive index in the ridge region $I_a$ (ridge inner region $I_a^i$ and ridge outer regions $I_a^o$) and greater than the effective refractive index in the cladding regions $II_c$. In a case where the terrace regions $II_t$ are absent and these parts have the same structure as in the cladding regions $II_c$, many high-order modes are present. Meanwhile, if the terrace regions $II_t$ are provided, a value obtained by dividing a propagation constant in a high-order mode by a wavenumber in a free space becomes smaller than the effective refractive index in the terrace regions $II_t$, so that such high-order modes cannot be present. Thus, the number of modes allowed in the horizontal direction can be decreased.

The ridge-type broad-area semiconductor laser device 620 is characterized in that the following equations (9) and (10) are satisfied, where the terrace regions $II_t$ having an effective refractive index nt are provided on the outer sides of the cladding regions $II_c$ and m is a positive integer.

[Mathematical 11]

$$m \cdot \frac{\pi}{2} \leq \left[\frac{2\pi}{\lambda}\right]\sqrt{n_a^{e2} - n_c^2}\, W < (m+1) \cdot \frac{\pi}{2} \tag{9}$$

$$\sqrt{n_c^2 + \left[\frac{\lambda}{4W}\right]^2} \leq \text{nt} \leq \sqrt{n_c^2 + m^2\left[\frac{\lambda}{4W}\right]^2} \tag{10}$$

In the ridge-type broad-area semiconductor laser device 620, in a case where the ridge outer region width $W_o$ is 0 μm, the effective refractive index in the ridge region $I_a$ (ridge inner region $I_a^i$ and ridge outer regions $I_a^o$) is 3.41741, and the effective refractive index in the cladding regions $II_c$ is 3.41637. Therefore, in a case where the ridge width 2 W is 100 μm and the terrace regions $II_t$ are absent, v is 27.16 and thus eighteen modes from a zeroth order to a seventeenth order are allowed.

On the other hand, if the terrace regions $II_t$ are provided, the effective refractive index in the terrace regions $II_t$ is 3.41704, and therefore, in modes from an eleventh order to a seventeenth order, a value obtained by dividing a propagation constant by a wavenumber in a free space becomes smaller than the effective refractive index in the terrace regions $II_t$. As a result, eleven modes from a zeroth order to a tenth order are allowed.

In a case where the ridge-type broad-area semiconductor laser device 620 has a finite ridge outer region width $W_o$ and removal has been performed by etching in each ridge outer region $I_a^o$ until reaching the third ESL layer 25, the effective refractive index at this part is 3.41741, and thus the refractive index in the ridge region $I_a$ (ridge inner region $I_a^i$ and ridge outer regions $I_a^o$) is the same irrespective of removal by etching. Therefore, the number of allowed modes is the same.

Meanwhile, in the ridge-type broad-area semiconductor laser device 620, current begins to spread also in the x direction, i.e., the ridge width direction, from the upper end of the third ESL layer 25. That is, current spreads in the x direction through the distance $h_2$ (0.64 μm) from the upper end of the InGaAs quantum well active layer 7 to the upper end of the first ESL layer 21 (p-type AlGaAs low-refractive-index layer 21) and the distance $h_1$ (0.93 μm) from the upper end of the first ESL layer 21 to the upper end of the third ESL layer 25, thus reaching the InGaAs quantum well active layer 7.

Figure 40:
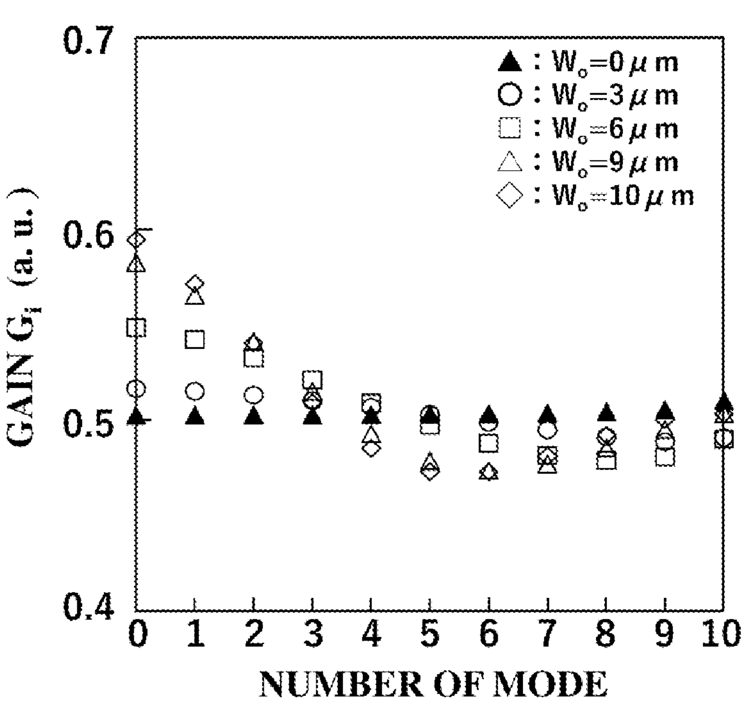
FIG. 40 shows the gain in each mode of the ridge-type broad-area semiconductor laser device according to embodiment 5.
Figure 41:
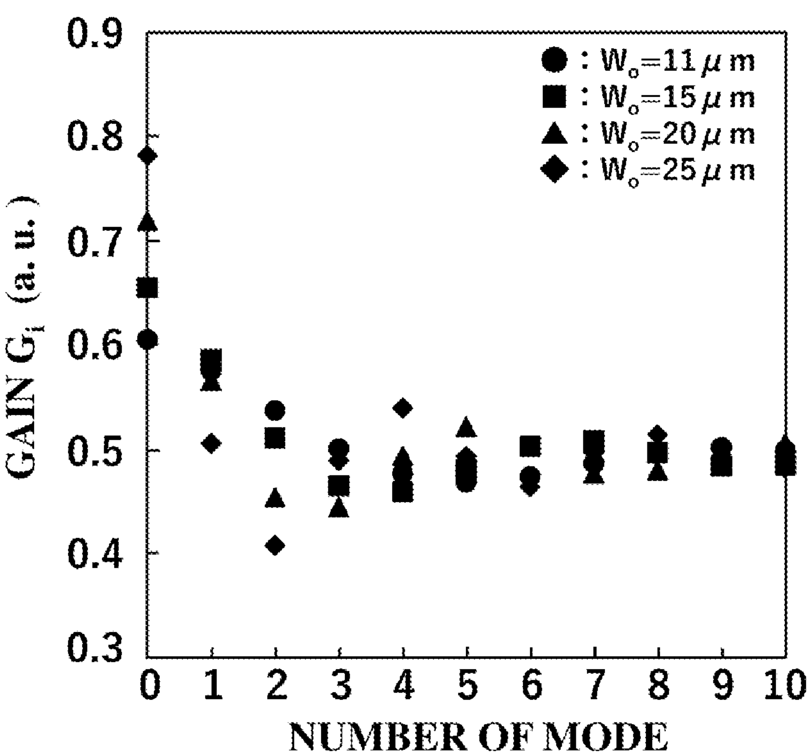
FIG. 41 shows the gain in each mode of the ridge-type broad-area semiconductor laser device according to embodiment 5.

FIG. 40 and FIG. 41 show the gain $G_i$ in each mode in cases where the ridge outer region width $W_o$ is 3, 6, 9, 10, 11, 15, 20, and 25 μm in the ridge-type broad-area semiconductor laser device 620. A case where the ridge outer region width $W_o$ is 0 μm (comparative example) is also shown together. In the case of the comparative example, there are almost no gain differences among the modes, and if any, the gain difference is less than 2%, and therefore laser oscillation can occur in any mode. Thus, the horizontal beam divergence angle varies depending on the mode in which oscillation occurs.

On the other hand, the ridge-type broad-area semiconductor laser device 620 is provided with the ridge outer regions $I_a^o$ where current non-injection structures are formed by covering, with the SiN films 28, the exposed surfaces on which the p-type GaAs contact layer 27 and the p-type AlGaAs third cladding layer 26 have been removed by etching. Accordingly, gain differences arise among the modes, so that the gain in a low-order mode becomes higher than the gain in a high-order mode. Thus, laser oscillation in a low-order mode can be performed and a narrow horizontal beam divergence angle can be achieved.

The gains in low-order modes in the present disclosure, e.g., modes of zeroth to third orders in a case where the ridge outer region width $W_o$ is not greater than 10 μm, are higher than the gains in low-order modes in the comparative example. Therefore, laser oscillation is reached with a low gain, and a ridge-type broad-area semiconductor laser device in which laser oscillation occurs with lower threshold current than in the comparative example can be obtained.

In the ridge-type broad-area semiconductor laser device 620, even if the ridge outer region width $W_o$ is greater than 10 μm, the gain in a low-order mode is higher than in the comparative example and loss does not increase. In a case where the ridge outer region width $W_o$ is not less than 15 μm, there is a gain difference greater than 10% between the fundamental mode and all the other modes, and thus it becomes possible to substantially perform oscillation in the fundamental mode. In a case where the ridge outer region width $W_o$ is not less than 20 μm, such tendency becomes further outstanding.

Since current isotropically spreads, it suffices that the ridge outer region width $W_o$ is greater than the distance $h_1+h_2$ (1.57 μm) and smaller than W (50 μm).

As described above, the ridge-type broad-area semiconductor laser device 620 according to embodiment 5 is provided with the ridge outer regions $I_a^o$ where current non-injection structures are formed by covering, with the SiN films 28, the exposed surfaces on which the p-type GaAs contact layer 27 and the p-type AlGaAs third cladding layer 26 have been removed by etching, so that current injected in the ridge-type broad-area semiconductor laser device 620 mainly flows in the ridge inner region $I_a^i$. Accordingly, the gain in a low-order mode becomes higher than the gain in a high-order mode, and oscillation in a low-order mode can be performed, thus providing an effect of narrowing the horizontal beam divergence angle. Further, since the terrace regions $II_t$ are provided, a value obtained by dividing a propagation constant in a high-order mode by a wavenumber in a free space becomes smaller than the effective refractive index in the terrace regions $II_t$, so that such high-order modes cannot be present, thus also providing an effect that the number of modes allowed in the horizontal direction can be decreased.

Modification 1 of Embodiment 5

Figure 42:
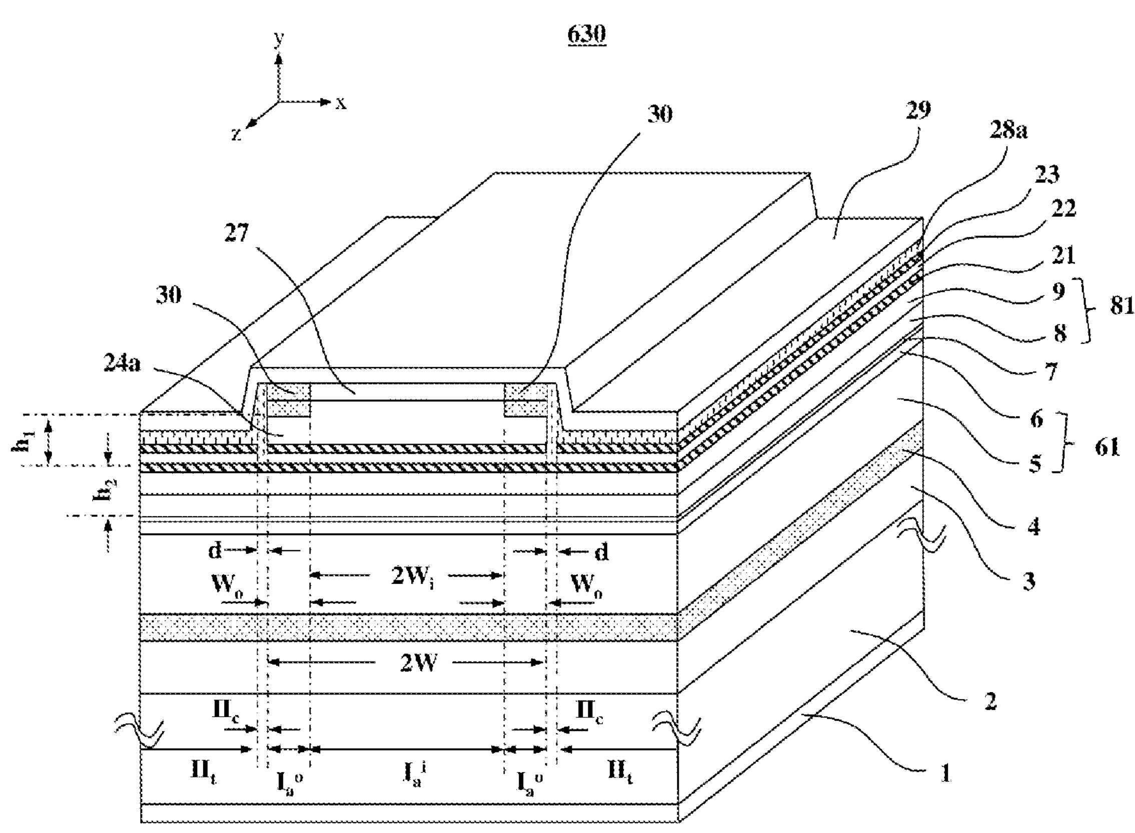
FIG. 42 is a perspective view showing a ridge-type broad-area semiconductor laser device in 975 nm band having a real refractive index distribution according to modification 1 of embodiment 5.

FIG. 42 is a perspective view showing a ridge-type broad-area semiconductor laser device 630 in 975 nm band having a real refractive index distribution according to modification 1 of embodiment 5.

The ridge-type broad-area semiconductor laser device 630 shown in FIG. 42 has a p-type AlGaAs second cladding layer **24*a* (second-conductivity-type cladding layer) having an Al composition ratio of 0.20 and a layer thickness of 1.40 μm, SiN films 28*a* having a film thickness of 0.4 μm, and proton implanted regions 30**.

The difference from the ridge-type broad-area semiconductor laser device 620 shown in FIG. 39 is that the third ESL layer 25 is absent and the ridge outer regions $I_a^o$ are formed by imparting the semiconductor layers with insulation property through proton implantation, instead of removal by etching.

A manufacturing method for the ridge-type broad-area semiconductor laser device 630 will be described below.

Above the n-type GaAs substrate 2, the semiconductor layers from the n-type AlGaAs cladding layer 3 to the p-type GaAs contact layer 27 are sequentially crystal-grown by a crystal growth method such as metal organic chemical vapor deposition (MOCVD).

Next, with the ridge inner region $I_a^i$ coated with a resist, ion implantation with protons is performed to form the proton implanted regions 30, and the resist is removed.

Subsequently, with the ridge inner region $I_a^i$ and the ridge outer regions $I_a^o$ coated with a resist, dry etching is performed until reaching the second ESL layer 23, and the resist is removed. At this time, the proton implanted regions 30 in the cladding regions $II_c$ and the terrace regions $II_t$ are also etched and removed.

Then, with the ridge inner region $I_a^i$, the ridge outer regions $I_a^o$, and the terrace regions $II_t$ coated with resists, dry etching is performed until reaching the first ESL layer 21, and the resists are removed.

Further, with the ridge inner region $I_a^i$ and the ridge outer regions $I_a^o$ coated with a resist, the SiN films **28*a*** are formed, lift-off is performed, and the resist is removed.

Finally, the p-type electrode 16 and the n-type electrode 1 are formed on the upper surface side and the lower surface side, respectively.

In the ridge-type broad-area semiconductor laser device 630, in a case where the ridge outer region width $W_o$ is 0 μm, the effective refractive index in the ridge region $I_a$ (ridge inner region $I_a^i$ and ridge outer regions $I_a^o$) is 3.41741, and the effective refractive index in the cladding regions $II_c$ is 3.41637. Therefore, in a case where the ridge width 2 W is 100 μm and the terrace regions $II_t$ are absent, v is 27.16 and thus eighteen modes from a zeroth order to a seventeenth order are allowed.

On the other hand, if the terrace regions $II_t$ are provided, the effective refractive index in the terrace regions $II_t$ is 3.41704, and therefore, in modes from an eleventh order to a seventeenth order, a value obtained by dividing a propagation constant by a wavenumber in a free space becomes smaller than the effective refractive index in the terrace regions $II_t$. As a result, eleven modes from a zeroth order to a tenth order are allowed.

As an example, in a case where protons are implanted to a depth of 0.74 μm from the p-type GaAs contact layer 27, the distance $h_1$ from the upper end of the first ESL layer 21 to the lower end of the proton implanted region 30 is 1.00 μm.

Since the effective refractive index in the ridge outer regions $I_a^o$ having the ridge outer region width $W_o$ is 3.41741, the number of allowed modes is the same as in embodiment 5.

If the distance $h_1$ from the upper end of the first ESL layer 21 to the current non-injection structure, i.e., the lower end of the proton implanted region 30, is not less than 0.93 μm, the effective refractive index in the ridge outer regions $I_a^o$ is substantially the same as the effective refractive index in the ridge inner region $I_a^i$. That is, since there is almost no light in a region above 0.93 μm of the distance $h_1$, there is no influence from scattering due to crystal breakage caused by proton implantation in the crystal layer and loss due to the scattering, and reduction in reliability due to crystal defect does not occur.

Meanwhile, current begins to spread also in the x direction, i.e., the ridge width direction, from the lower end of the proton implanted region 30, so that the current spreads in the x direction through the distance $h_2$ (0.64 μm) from the upper end of the InGaAs quantum well active layer 7 to the upper end of the first ESL layer 21 and the distance $h_1$ (1.00 μm) from the upper end of the first ESL layer 21 to the lower end of the proton implanted region 30, thus reaching the InGaAs quantum well active layer 7.

Figure 43:
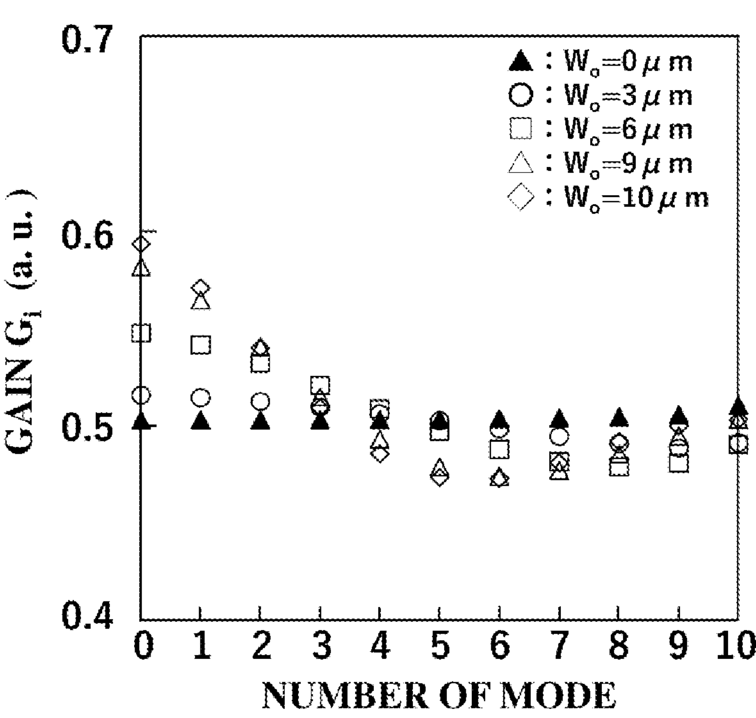
FIG. 43 shows the gain in each mode of the ridge-type broad-area semiconductor laser device according to modification 1 of embodiment 5.
Figure 44:
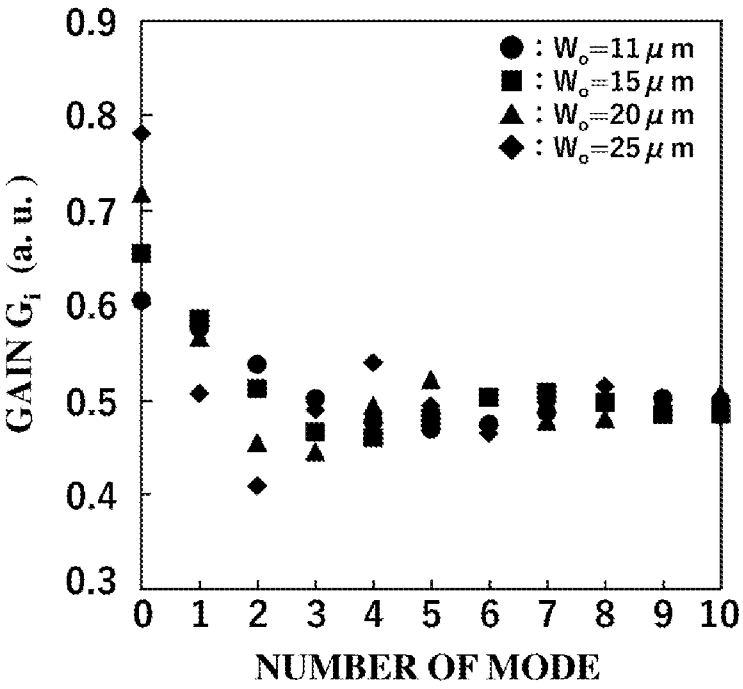
FIG. 44 shows the gain in each mode of the ridge-type broad-area semiconductor laser device according to modification 1 of embodiment 5.

FIG. 43 and FIG. 44 show the gain $G_i$ in each mode in cases where the ridge outer region width $W_o$ is 3, 6, 9, 10, 11, 15, 20, and 25 μm in the ridge-type broad-area semiconductor laser device 630. A case where the ridge outer region width $W_o$ is 0 μm (comparative example) is also shown together. In the case of the comparative example, there are almost no gain differences among the modes, and if any, the gain difference is less than 2%, and therefore laser oscillation can occur in any mode. Thus, the horizontal beam divergence angle varies depending on the mode in which laser oscillation occurs.

On the other hand, the ridge-type broad-area semiconductor laser device 630 is provided with the ridge outer regions $I_a^o$ where the proton implanted regions 30 serving as current non-injection structures are formed. Accordingly, gain differences arise among the modes, so that the gain in a low-order mode becomes higher than the gain in a high-order mode. Thus, laser oscillation in a low-order mode can be performed and a narrow horizontal beam divergence angle can be achieved.

The gains in low-order modes in the present disclosure, e.g., modes of zeroth to third orders in a case where the ridge outer region width $W_o$ is not greater than 10 μm, are higher than the gains in low-order modes in the comparative example. Therefore, laser oscillation is reached with a low gain, and a ridge-type broad-area semiconductor laser device in which laser oscillation occurs with lower threshold current than in the comparative example can be obtained.

In the ridge-type broad-area semiconductor laser device 630, even if the ridge outer region width $W_o$ is greater than 10 μm, the gain in a low-order mode is higher than in the comparative example and loss does not increase. In a case where the ridge outer region width $W_o$ is not less than 15 μm, there is a gain difference greater than 10% between the fundamental mode and all the other modes, and thus it becomes possible to substantially perform oscillation in the fundamental mode. In a case where the ridge outer region width $W_o$ is not less than 20 μm, such tendency becomes further outstanding.

It suffices that the ridge outer region width $W_o$ is greater than the distance $h_1+h_2$ (1.64 μm) and smaller than W (50 μm). It suffices that the distance $h_1$ from the upper end of the first ESL layer 21 to the lower end of the proton implanted region 30 is not less than 0.93 μm. However, in the ridge-type broad-area semiconductor laser device 630 according to modification 1 of embodiment 5, the distance $h_1$ is set to 1.00 μm and this setting is made in order that a damaged part of the semiconductor layer due to proton implantation is located farther from the optical intensity distribution, thereby achieving higher reliability.

In the present embodiment, the structure formed through ion implantation with protons has been shown as an example. However, without limitation thereto, any means that can increase the electric resistance of the semiconductor layer is applicable.

In the case of using proton implantation as means for imparting the semiconductor layers with insulation property, an etching process is not needed, thus providing an effect of decreasing the number of manufacturing steps and also facilitating the manufacturing of the ridge-type broad-area semiconductor laser device.

As described above, the ridge-type broad-area semiconductor laser device 630 according to modification 1 of embodiment 5 is provided with the ridge outer regions $I_a^o$ where the proton implanted regions 30 serving as current non-injection structures are formed, so that current injected in the ridge-type broad-area semiconductor laser device 630 mainly flows in the ridge inner region $I_a^i$. Accordingly, the gain in a low-order mode becomes higher than the gain in a high-order mode, and laser oscillation in a low-order mode can be performed, thus providing an effect of narrowing the horizontal beam divergence angle. Further, since the terrace regions $II_t$ are provided, a value obtained by dividing a propagation constant in a high-order mode by a wavenumber in a free space becomes smaller than the effective refractive index in the terrace regions $II_t$, so that such high-order modes cannot be present, thus also providing an effect that the number of modes allowed in the horizontal direction can be decreased.

Modification 2 of Embodiment 5

Figure 45:
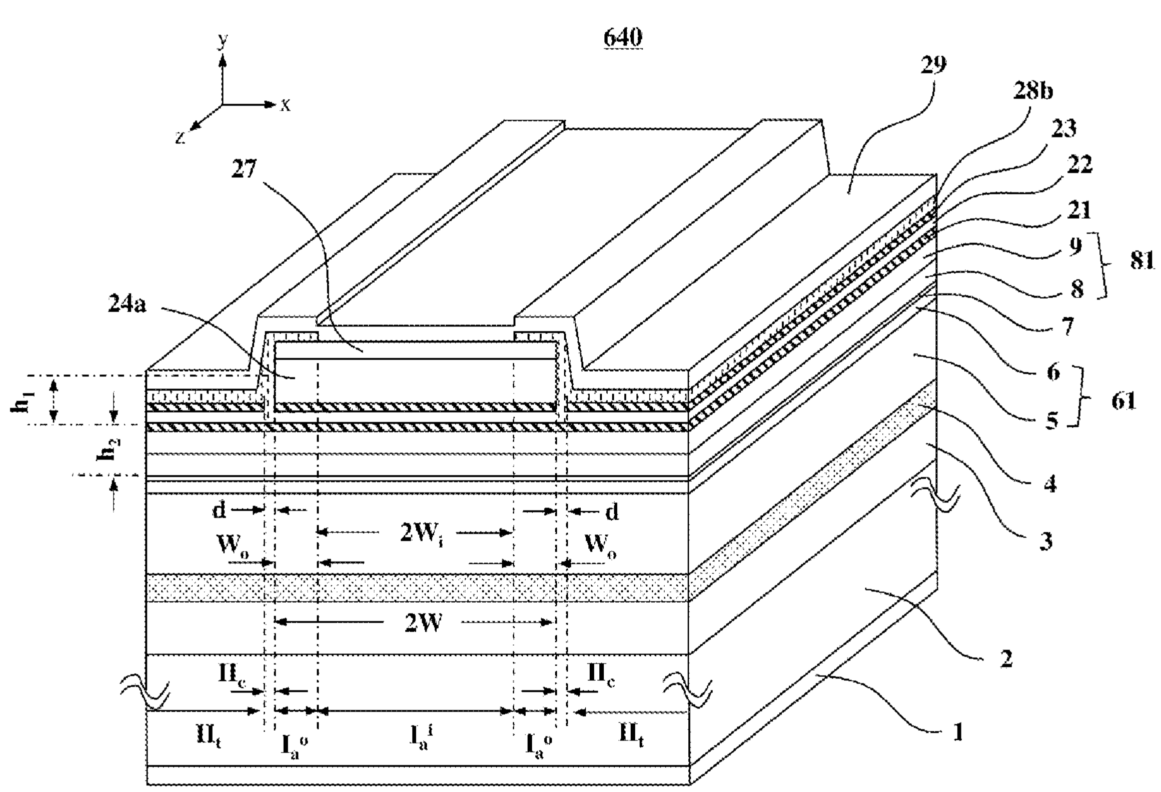
FIG. 45 is a perspective view showing a ridge-type broad-area semiconductor laser device in 975 nm band having a real refractive index distribution according to modification 2 of embodiment 5.

FIG. 45 is a perspective view showing a ridge-type broad-area semiconductor laser device 640 in 975 nm band having a real refractive index distribution according to modification 2 of embodiment 5.

The ridge-type broad-area semiconductor laser device 640 shown in FIG. 45 has SiN films 28*b* having a film thickness of 0.4 μm.

The difference from the ridge-type broad-area semiconductor laser device 620 shown in FIG. 39 is that the third ESL layer 25 is absent and in order to form the ridge outer regions $I_a^o$, the SiN films 28*b* are respectively provided on parts of the surface at both ends in the ridge width direction of the p-type GaAs contact layer 27, instead of removal by etching.

A manufacturing method for the ridge-type broad-area semiconductor laser device 640 will be described below.

Above the n-type GaAs substrate 2, the semiconductor layers from the n-type AlGaAs cladding layer 3 to the p-type GaAs contact layer 27 are sequentially crystal-grown by a crystal growth method such as metal organic chemical vapor deposition (MOCVD).

Next, with the ridge inner region $I_a^i$ and the ridge outer regions $I_a^o$ coated with a resist, dry etching is performed until reaching the second ESL layer 23, and the resist is removed.

Then, with the ridge inner region $I_a^i$, the ridge outer regions $I_a^o$, and the terrace regions $II_t$ coated with resists, dry etching is performed until reaching the first ESL layer 21, and the resists are removed.

Subsequently, with the ridge inner region $I_a^i$ coated with a resist, the SiN films 28*b* are formed, lift-off is performed, and the resist is removed.

Finally, the p-type electrode 16 and the n-type electrode 1 are formed on the upper surface side and the lower surface side, respectively.

The effective refractive indices in the ridge inner region $I_a^i$, the ridge outer regions $I_a^o$, the cladding regions $II_c$, and the terrace regions $II_t$ in the ridge-type broad-area semiconductor laser device 640 are 3.41741, 3.41741, 3.41637, and 3.41704, respectively, and in a case where the ridge width 2 W is 100 μm, eleven modes from a zeroth order (fundamental mode) to a tenth order are allowed. Since current spreads from an upper part of the p-type GaAs contact layer 27, the distance $h_1$ is 1.64 μm.

Figure 46:
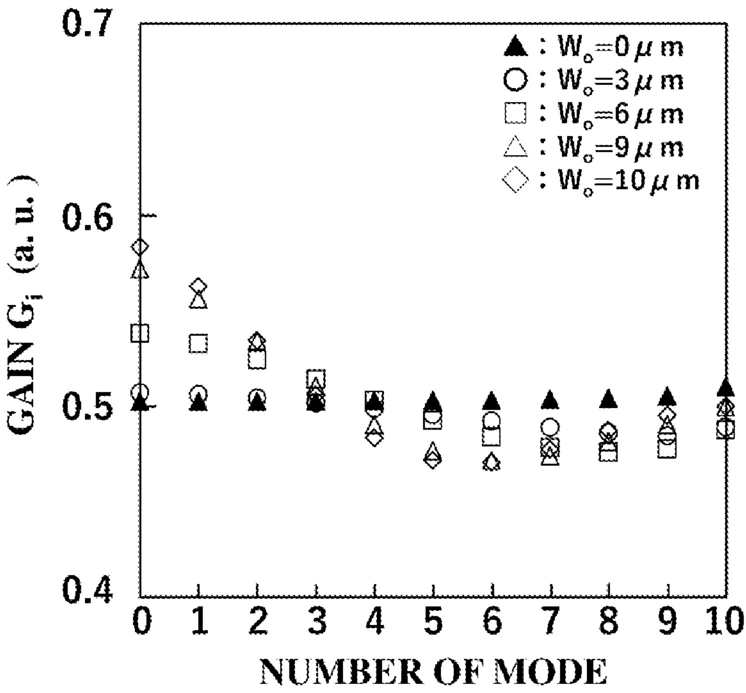
FIG. 46 shows the gain in each mode of the ridge-type broad-area semiconductor laser device according to modification 2 of embodiment 5.
Figure 47:
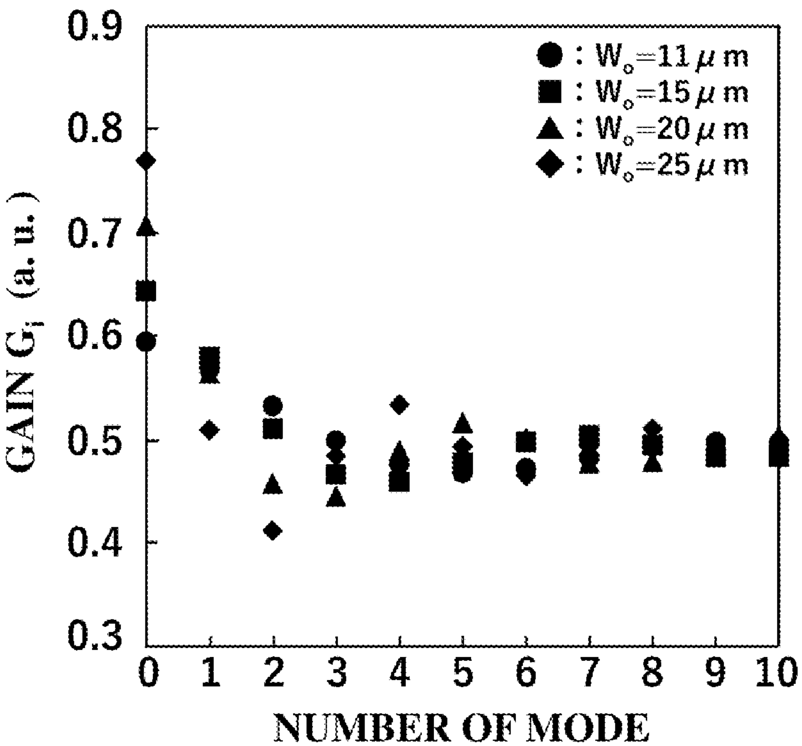
FIG. 47 shows the gain in each mode of the ridge-type broad-area semiconductor laser device according to modification 2 of embodiment 5.

FIG. 46 and FIG. 47 show the gain $G_i$ in each mode in cases where the ridge outer region width $W_o$ is 3, 6, 9, 10, 11, 15, 20, and 25 μm in the ridge-type broad-area semiconductor laser device 640. A case where the ridge outer region width $W_o$ is 0 μm (comparative example) is also shown together. In the case of the comparative example, there are almost no gain differences among the modes, and if any, the gain difference is less than 2%, and therefore laser oscillation can occur in any mode. Thus, the horizontal beam divergence angle varies depending on the mode in which laser oscillation occurs.

On the other hand, the ridge-type broad-area semiconductor laser device 640 is provided with the ridge outer regions $I_a^o$ having current non-injection structures in which parts of the surface at both ends in the ridge width direction of the p-type GaAs contact layer 27 are respectively covered with the SiN films 28*b*, so that current mainly flows in the ridge inner region $I_a^i$. Accordingly, gain differences arise among the modes, so that the gain in a low-order mode becomes higher than the gain in a high-order mode. Thus, laser oscillation in a low-order mode can be performed and a narrow horizontal beam divergence angle can be achieved.

The gains in low-order modes in the present disclosure, e.g., modes of zeroth to third orders in a case where the ridge outer region width $W_o$ is not greater than 10 μm, are higher than the gains in low-order modes in the comparative example. Therefore, laser oscillation is reached with a low gain, and a ridge-type broad-area semiconductor laser device in which laser oscillation occurs with lower threshold current than in the comparative example can be obtained.

In the ridge-type broad-area semiconductor laser device 640, even if the ridge outer region width $W_o$ is greater than 10 μm, the gain in a low-order mode is higher than in the comparative example and loss does not increase. In a case where the ridge outer region width $W_o$ is not less than 15 μm, there is a gain difference greater than 10% between the fundamental mode and all the other modes, and thus it becomes possible to substantially perform oscillation in the fundamental mode. In a case where the ridge outer region width $W_o$ is not less than 20 μm, such tendency becomes further outstanding.

It suffices that the ridge outer region width $W_o$ in the ridge-type broad-area semiconductor laser device 640 is greater than the distance $h_1+h_2$ (2.28 μm) and smaller than W (50 μm). In the present embodiment, since the current non-injection structures in the ridge outer regions $I_a^o$ are formed by the SiN films 28*b* which are insulation films, the distance from the p-type GaAs contact layer 27 to the InGaAs quantum well active layer 7 through which current begins to spread in the x direction increases to be 2.38 μm, and therefore gain differences are hardly obtained in a case where the ridge outer region width $W_o$ is small. However, since the effect increases if the ridge outer region width $W_o$ is increased, no particular problems arise. Although SiN is used as the insulation film, another material such as $SiO_2$ may be used.

In addition, since processes such as etching or proton implantation are not performed, manufacturing of the ridge-type broad-area semiconductor laser device is significantly facilitated.

The present embodiment has shown, as an example, the ridge-type broad-area semiconductor laser device 640 in which, using such a structure that decreases the number of allowed horizontal transverse modes, gain differences are provided among the allowed horizontal transverse modes and laser oscillation is performed in a low-order mode, whereby the horizontal beam divergence angle is narrowed. However, without limitation thereto, the same effects are provided also in a normal ridge-type broad-area semiconductor laser device in which the number of horizontal transverse modes is not decreased.

In the present embodiment, the effective refractive index in the ridge outer regions $I_a^o$ and the effective refractive index in the ridge inner region $I_a^i$ are equal to each other. However, they may be substantially the same, as described in embodiment 1.

As described above, the ridge-type broad-area semiconductor laser device 640 according to modification 2 of embodiment 5 is provided with the ridge outer regions $I_a^o$ having current non-injection structures in which parts of the surface at both ends in the ridge width direction of the p-type GaAs contact layer 27 are respectively covered with the SiN films 28*b*, so that current injected in the ridge-type broad-area semiconductor laser device 640 mainly flows in the ridge inner region $I_a^i$. Accordingly, the gain in a low-order mode becomes higher than the gain in a high-order mode, and oscillation in a low-order mode can be performed, thus providing an effect of narrowing the horizontal beam divergence angle. Further, since the terrace regions $II_t$ are provided, a value obtained by dividing a propagation constant in a high-order mode by a wavenumber in a free space becomes smaller than the effective refractive index in the terrace regions $II_t$, so that such high-order modes cannot be present, thus also providing an effect that the number of modes allowed in the horizontal direction can be decreased.

Embodiment 6

Figure 48:
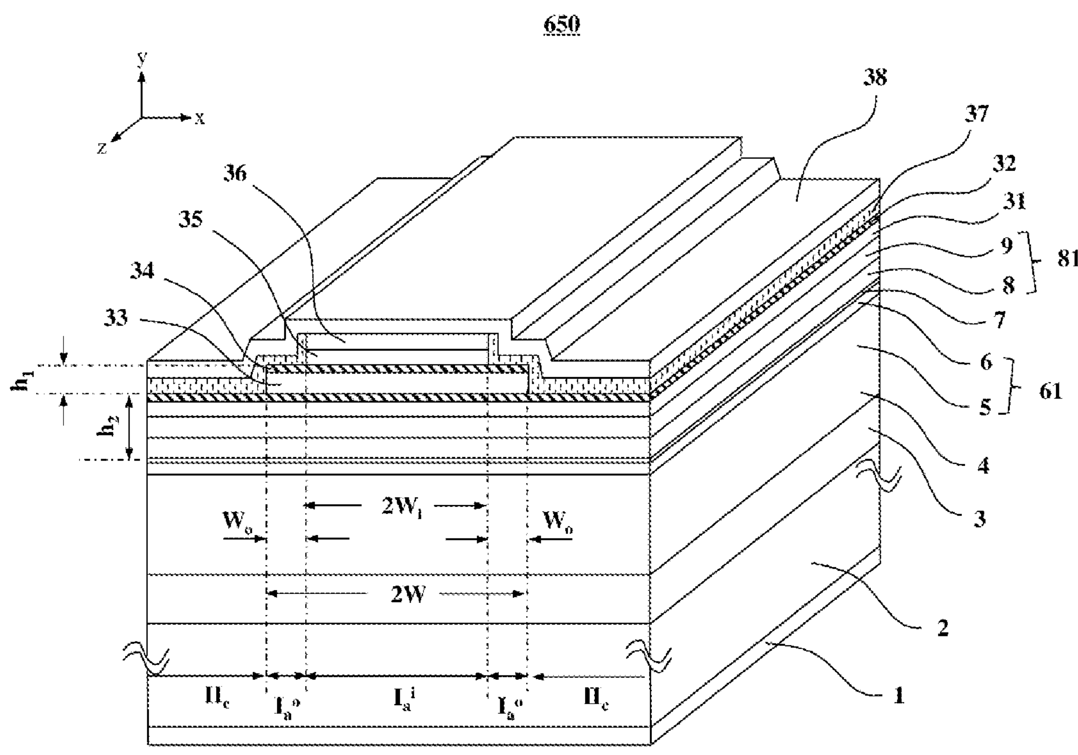
FIG. 48 is a perspective view showing a ridge-type broad-area semiconductor laser device in 975 nm band having a real refractive index distribution according to embodiment 6.

FIG. 48 is a perspective view showing a ridge-type broad-area semiconductor laser device 650 in 975 nm band having a real refractive index distribution according to embodiment 6.

The ridge-type broad-area semiconductor laser device 650 shown in FIG. 48 has a p-type AlGaAs first cladding layer 31 having an Al composition ratio of 0.20 and a layer thickness of 0.10 μm, a p-type AlGaAs first ESL layer 32 (may be referred to as p-type AlGaAs low-refractive-index layer or second-conductivity-type low-refractive-index layer) having an Al composition ratio of 0.55 and a layer thickness of 40 nm, a p-type AlGaAs second cladding layer 33 having an Al composition ratio of 0.20 and a layer thickness of 0.75 μm, a p-type AlGaAs second ESL layer 34 having an Al composition ratio of 0.55 and a layer thickness of 40 nm, a p-type AlGaAs third cladding layer 35 (second-conductivity-type second cladding layer) having an Al composition ratio of 0.20 and a layer thickness of 0.65 μm, a p-type GaAs contact layer 36 having a layer thickness of 0.2 μm, SiN films 37 having a film thickness of 0.2 μm, and a p-type electrode 38.

The p-type AlGaAs first cladding layer 31 and the p-type AlGaAs second cladding layer 33 are collectively referred to as second-conductivity-type first cladding layer.

The other layer configurations are the same as those of the ridge-type broad-area semiconductor laser device 500 shown in FIG. 3 in embodiment 1, except that the n-type low-refractive-index layer is absent.

A manufacturing method for the ridge-type broad-area semiconductor laser device 650 is also the same as in embodiment 1. The distance $h_2$ from the upper end of the InGaAs quantum well active layer 7 to the upper end of the first ESL layer 32 is 0.74 μm, and the distance $h_1$ from the upper end of the second ESL layer 34 to the upper end of the first ESL layer 32 is 0.79 μm.

The ridge-type broad-area semiconductor laser device 650 is a ridge-type broad-area semiconductor laser device in 975 nm band having a normal real refractive index distribution with no n-type low-refractive-index layer, and the first ESL layer 32 (p-type AlGaAs low-refractive-index layer 32) is provided between the p-type AlGaAs first cladding layer 31 and the p-type AlGaAs second cladding layer 33. The gain differences among the allowed modes have a tendency similar to that in embodiment 1.

In the ridge-type broad-area semiconductor laser device 650, the layer thickness of the p-type AlGaAs first cladding layer 31 is 0.1 μm. However, this layer thickness is not limited to 0.1 μm, and it is possible to easily decrease the number of modes allowed in the x direction by increasing this layer thickness.

As described above, the ridge-type broad-area semiconductor laser device 650 according to embodiment 6 is provided with the ridge outer regions $I_a^o$ where current non-injection structures are formed by covering, with the SiN films 37, the exposed surfaces on which the p-type GaAs contact layer 36 and the p-type AlGaAs third cladding layer have been removed by etching, so that current injected in the ridge-type broad-area semiconductor laser device 650 mainly flows in the ridge inner region $I_a^i$. Accordingly, the gain in a low-order mode becomes higher than the gain in a high-order mode, and oscillation in a low-order mode can be performed, thus providing an effect of narrowing the horizontal beam divergence angle.

Modification 1 of Embodiment 6

Figure 49:
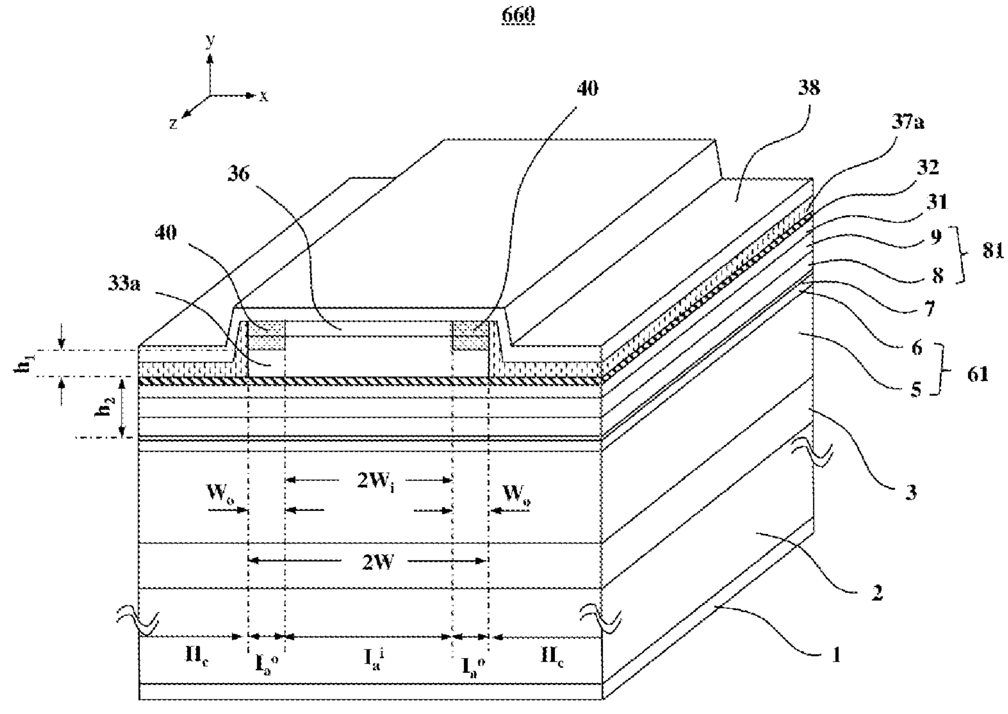
FIG. 49 is a perspective view showing a ridge-type broad-area semiconductor laser device in 975 nm band having a real refractive index distribution according to modification 1 of embodiment 6.

FIG. 49 is a perspective view showing a ridge-type broad-area semiconductor laser device 660 in 975 nm band having a real refractive index distribution according to modification 1 of embodiment 6.

The ridge-type broad-area semiconductor laser device 660 shown in FIG. 49 has a p-type AlGaAs second cladding layer 33*a* having an Al composition ratio of 0.20 and a layer thickness of 1.40 μm, SiN films 37*a* having a film thickness of 0.2 μm, and proton implanted regions 40.

In a case where protons are implanted to a depth of 0.6 μm from the surface of the p-type GaAs contact layer 36, the distance $h_1$ from the upper end of the first ESL layer 32 to the lower end of the proton implanted region 40 is 1.0 μm.

The ridge-type broad-area semiconductor laser device 660 is different from the ridge-type broad-area semiconductor laser device 650 shown in FIG. 48 in that the second ESL layer 34 is absent and the ridge outer regions $I_a^o$ are formed by imparting the semiconductor layers with insulation property through proton implantation, instead of removal by etching.

A manufacturing method for the ridge-type broad-area semiconductor laser device 660 is the same as in modification 1 of embodiment 1.

If the distance $h_1$ from the upper end of the first ESL layer 32 to the current non-injection structure, i.e., the lower end of the proton implanted region 40, is not less than 0.79 μm, the effective refractive index in the ridge outer regions $I_a^o$ is substantially the same as the effective refractive index in the ridge inner region $I_a^i$. That is, since there is almost no light in a region above 0.79 μm of the distance $h_1$, there is no influence from scattering due to crystal breakage caused by proton implantation in the crystal layer and loss due to the scattering, and reduction in reliability due to crystal defect does not occur.

The ridge-type broad-area semiconductor laser device 660 is a ridge-type broad-area semiconductor laser device having a normal real refractive index distribution with no n-type low-refractive-index layer, and the first ESL layer 32 is provided between the p-type AlGaAs first cladding layer 31 and the p-type AlGaAs second cladding layer 33*a*. The gain differences among the allowed modes have a tendency similar to that in modification 1 of embodiment 1.

In the ridge-type broad-area semiconductor laser device 660, the layer thickness of the p-type AlGaAs first cladding layer 31 is 0.1 μm. However, this layer thickness is not limited to 0.1 μm, and it is possible to easily decrease the number of modes allowed in the x direction, i.e., the ridge width direction, by increasing this layer thickness.

In the present embodiment, the structure formed through ion implantation with protons has been shown as an example. However, without limitation thereto, any means that can increase the electric resistance of the semiconductor layer is applicable.

In the case of using proton implantation as means for imparting the semiconductor layers with insulation property, an etching process is not needed, thus providing an effect of decreasing the number of manufacturing steps and also facilitating the manufacturing of the ridge-type broad-area semiconductor laser device.

As described above, the ridge-type broad-area semiconductor laser device 660 according to modification 1 of embodiment 6 is provided with the ridge outer regions $I_a^o$ where the proton implanted regions 40 serving as current non-injection structures are formed, so that current injected in the ridge-type broad-area semiconductor laser device 660 mainly flows in the ridge inner region $I_a^i$. Accordingly, the gain in a low-order mode becomes higher than the gain in a high-order mode, and laser oscillation in a low-order mode can be performed, thus providing an effect of narrowing the horizontal beam divergence angle.

Modification 2 of Embodiment 6

Figure 50:
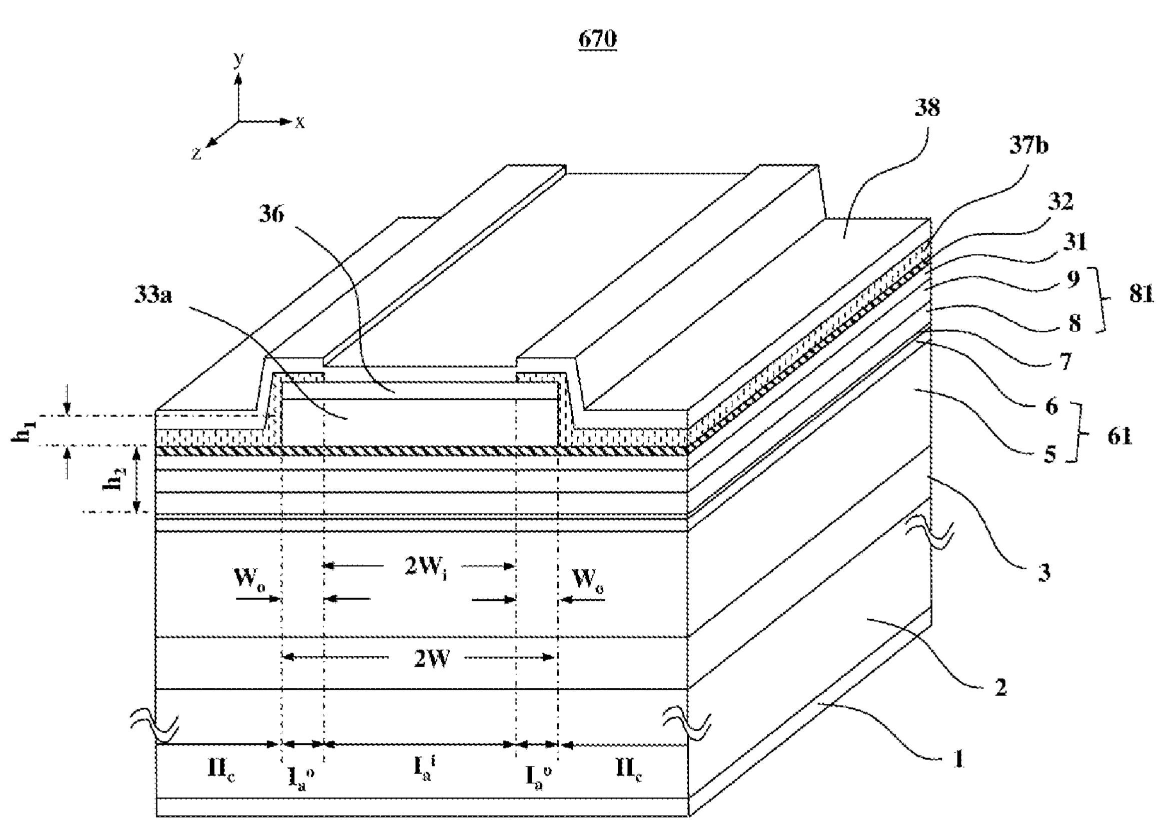
FIG. 50 is a perspective view showing a ridge-type broad-area semiconductor laser device in 975 nm band having a real refractive index distribution according to modification 2 of embodiment 6.

FIG. 50 is a perspective view showing a ridge-type broad-area semiconductor laser device 670 in 975 nm band having a real refractive index distribution according to modification 2 of embodiment 6.

The ridge-type broad-area semiconductor laser device 670 shown in FIG. 50 has SiN films 37*b* having a film thickness of 0.2 μm.

The difference from the ridge-type broad-area semiconductor laser device 650 shown in FIG. 48 is that the second ESL layer 34 is absent and in the ridge outer regions $I_a^o$, the SiN films 37*b* are respectively provided on parts of the surface at both ends in the ridge width direction of the p-type GaAs contact layer 36, instead of removal by etching.

A manufacturing method for the ridge-type broad-area semiconductor laser device 670 is the same as in modification 2 of embodiment 1.

The ridge-type broad-area semiconductor laser device 670 is a ridge-type broad-area semiconductor laser device having a normal real refractive index distribution with no n-type low-refractive-index layer, and the first ESL layer 32 is provided between the p-type AlGaAs first cladding layer 31 and the p-type AlGaAs second cladding layer 33*a*. The gain differences among the allowed modes have a tendency similar to that in modification 2 of embodiment 1.

In the ridge-type broad-area semiconductor laser device 670, the layer thickness of the p-type AlGaAs first cladding layer 31 is 0.1 μm. However, this layer thickness is not limited to 0.1 μm, and it is possible to easily decrease the number of modes allowed in the x direction by increasing this layer thickness.

In the present embodiment, since processes such as etching or proton implantation are not performed, manufacturing of the ridge-type broad-area semiconductor laser device is significantly facilitated.

The present embodiment has shown, as an example, the ridge-type broad-area semiconductor laser device in which, using such a structure that decreases the number of allowed horizontal transverse modes, gain differences are provided among the allowed horizontal transverse modes and oscillation is performed in a low-order mode, whereby the horizontal beam divergence angle is narrowed. However, without limitation thereto, the same effects are provided also in a ridge-type broad-area semiconductor laser device having a normal ridge structure in which the number of horizontal transverse modes is not decreased.

In the present embodiment, the effective refractive index in the ridge outer regions $I_a^o$ and the effective refractive index in the ridge inner region $I_a^i$ are equal to each other. However, they may be substantially the same, as described in embodiment 1.

As described above, the ridge-type broad-area semiconductor laser device 670 according to modification 2 of embodiment 6 is provided with current non-injection structures in which parts of the surface at both ends in the ridge width direction of the p-type GaAs contact layer 36 in the ridge outer regions $I_a^o$ are respectively covered with the SiN films 37*b*, so that current injected in the ridge-type broad-area semiconductor laser device 670 mainly flows in the ridge inner region $I_a^i$. Accordingly, the gain in a low-order mode becomes higher than the gain in a high-order mode, and laser oscillation in a low-order mode can be performed, thus providing an effect of narrowing the horizontal beam divergence angle.

In the present disclosure, the ridge-type broad-area semiconductor laser device having an oscillation wavelength of 975 nm has been described as an example. However, as a matter of course, the wavelength is not limited thereto. The same effects can be provided also in a case of using a ridge-type broad-area semiconductor laser device of a GaN-based type in 400 nm band, a GaInP-based type in 600 nm band, or an InGaAsP-based type in 1550 nm band, for example.

In the present disclosure, the n-type GaAs substrate is used and the ridge structure is formed on the p-type GaAs contact layer side. Conversely, a p-type GaAs substrate may be used and the ridge structure may be formed on the n-type GaAs contact layer side, whereby the same effects are obtained.

In the present disclosure, the ridge-type broad-area semiconductor laser device in which the ridge width 2 W is 100 μm has been shown as an example. However, the ridge width 2 W is not limited to 100 μm. The ridge width 2 W may be any value as long as a high-order mode of a first order or higher is allowed in the horizontal direction, i.e., the ridge width direction.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS

1 n-type electrode
2 n-type GaAs substrate
3 n-type AlGaAs cladding layer
4 n-type AlGaAs low-refractive-index layer
5, 5*a* n-side AlGaAs second optical guide layer
6, 6*a* n-side AlGaAs first optical guide layer
7 InGaAs quantum well active layer
8, 8*a* p-side AlGaAs first optical guide layer
9, 9*a* p-side AlGaAs second optical guide layer
10, 21, 32 p-type AlGaAs low-refractive-index layer (first ESL layer)
11, 11*a*, 11*b*, 11*c*, 11*d*, 11*e*, 22, 31 p-type AlGaAs first cladding layer
12, 23, 34 second ESL layer
13, 13*a*, 13*b*, 13*c*, 24, 24*a*, 33, 33*a* p-type AlGaAs second cladding layer
14, 27, 36 p-type GaAs contact layer
15, 15*a*, 28, 28*a*, 28*b*, 37, 37*a*, 37*b* SiN film
16, 29, 38 p-type electrode
17, 30, 40 proton implanted region
third ESL layer
26, 35 p-type AlGaAs third cladding layer
61, 62 n-side optical guide layer
81, 82 p-side optical guide layer
101 active layer
102 optical guide layer
103 first etching stop layer
104 p-type first cladding layer
105 second etching stop layer
106 p-type second cladding layer

The invention claimed is:

1. A semiconductor laser device comprising:

a first-conductivity-type semiconductor substrate;

a first-conductivity-type cladding layer, a first-conductivity-type-side optical guide layer, an active layer, a second-conductivity-type-side optical guide layer, a second-conductivity-type cladding layer, and a second-conductivity-type contact layer, which are laminated above the first-conductivity-type semiconductor substrate;

a resonator formed of a front end surface and a rear end surface and allowing a round trip of a laser beam therebetween; and a ridge region in which the laser beam is guided between the front end surface and the rear end surface, the ridge region having a width of 2 W, wherein an oscillation wavelength is 2 and a high-order mode of a first order or higher is allowed in a lamination direction of the layers, the ridge region is composed of a ridge inner region of which a width is 2 $W_i$ and an effective refractive index is $n_a^i$, and ridge outer regions which are provided on both sides of the ridge inner region and of which a width is $W_o$ and an effective refractive index is $n_a^o$, the ridge outer regions having current non-injection structures, cladding regions in which at least the second-conductivity-type contact layer and the second-conductivity-type cladding layer are removed and an effective refractive index is $n_c$, are provided on both sides of the ridge outer regions, an average refractive index $n_a^e$ in the ridge inner region and the ridge outer regions is represented by the following expression:

[Mathematical 1]

$$(n_a^i \cdot W_i + n_a^o \cdot W_o)/(W_i + W_o),$$

the following relationship is satisfied:

[Mathematical 2]

$$\frac{2\pi}{\lambda}\sqrt{n_a^{e2}-n_c^2}\,(W_i+W_o)>\frac{\pi}{2},$$

and the width $W_o$ of each ridge outer region is greater than a distance from a lower end of each current non-injection structure to the active layer and is smaller than W which is ½ of the width of the ridge region.

2. The semiconductor laser device according to claim 1, wherein a distance from an upper end of each cladding region to the lower end of each current non-injection structure is set to such a length that a number of modes allowed by the distance and a number of modes allowed by a structure having the ridge region and the cladding regions are the same.

3. The semiconductor laser device according to claim 1, wherein a number of modes allowed in a ridge width direction of the ridge region is the same as a number of modes allowed by a structure having the ridge region and the cladding regions.

4. The semiconductor laser device according to claim 1, wherein the second-conductivity-type cladding layer is composed of a second-conductivity-type first cladding layer and a second-conductivity-type second cladding layer, and the current non-injection structures have insulation films coating exposed surfaces on which at least the second-conductivity-type contact layer and the second-conductivity-type second cladding layer have been removed in the ridge outer regions.

5. The semiconductor laser device according to claim 1, wherein the current non-injection structures are formed of proton implanted regions.

6. The semiconductor laser device according to claim 1, wherein the current non-injection structures are formed of insulation films respectively coating parts of a surface at both ends in a ridge width direction of the second-conductivity-type contact layer in the ridge outer regions.

7. The semiconductor laser device according to claim 1, wherein a layer thickness of the first-conductivity-type-side optical guide layer is greater than a layer thickness of the second-conductivity-type-side optical guide layer.

8. The semiconductor laser device according to claim 1, wherein a layer thickness of the first-conductivity-type-side optical guide layer is the same as a layer thickness of the second-conductivity-type-side optical guide layer.

9. The semiconductor laser device according to claim 1, wherein a refractive index $n_{cn}$ of the first-conductivity-type cladding layer is higher than a refractive index $n_{cp}$ of the second-conductivity-type cladding layer.

10. The semiconductor laser device according to claim 1, wherein a refractive index $n_{cn}$ of the first-conductivity-type cladding layer is higher than a refractive index $n_{cp}$ of the second-conductivity-type cladding layer, and a layer thickness of the first-conductivity-type-side optical guide layer is greater than a layer thickness of the second-conductivity-type-side optical guide layer.

11. The semiconductor laser device according to claim 1, wherein a second-conductivity-type low-refractive-index layer of which a refractive index is lower than that of the second-conductivity-type cladding layer is provided in the second-conductivity-type cladding layer or between the second-conductivity-type-side optical guide layer and the second-conductivity-type cladding layer.

12. The semiconductor laser device according to claim 1, wherein a refractive index of the first-conductivity-type cladding layer is $n_{cn}$ and a refractive index of the second-conductivity-type cladding layer is $n_{cp}$, a first-conductivity-type low-refractive-index layer of which a layer thickness is $d_n$ and which has a refractive index $n_n$ lower than the refractive index $n_{cn}$ of the first-conductivity-type cladding layer, is provided in the first-conductivity-type cladding layer or between the first-conductivity-type-side optical guide layer and the first-conductivity-type cladding layer, a second-conductivity-type low-refractive-index layer of which a layer thickness is $d_p$ and which has a refractive index $n_p$ lower than the refractive index $n_{cp}$ of the second-conductivity-type cladding layer is provided in the second-conductivity-type cladding layer or between the second-conductivity-type-side optical guide layer and the second-conductivity-type cladding layer, and the following relationship is satisfied:

[Mathematical 3]

$$\frac{2\pi}{\lambda}\sqrt{n_{cp}^2-n_p^2}\,\frac{d_p}{2}>\frac{2\pi}{\lambda}\sqrt{n_{cn}^2-n_n^2}\,\frac{d_n}{2}.$$

13. The semiconductor laser device according to claim 1, wherein terrace regions in which an effective refractive index is nt are provided on both sides of the cladding regions, and where m is a positive integer, the following relationship is satisfied:

[Mathematical 4]

$$m\cdot\frac{\pi}{2}\leqq\left[\frac{2\pi}{\lambda}\right]\sqrt{n_a^{e2}-n_c^2}\,W<(m+1)\cdot\frac{\pi}{2},$$

and the following relationship is satisfied:

[Mathematical 5]

$$\sqrt{n_c^2+\left[\frac{\lambda}{4W}\right]^2}\leqq \mathrm{nt}\leqq\sqrt{n_c^2+m^2\left[\frac{\lambda}{4W}\right]^2}.$$

* * * * *